(12) United States Patent
Kato et al.

(10) Patent No.: US 8,465,592 B2
(45) Date of Patent: Jun. 18, 2013

(54) FILM DEPOSITION APPARATUS

(75) Inventors: Hitoshi Kato, Oshu (JP); Manabu Honma, Oshu (JP); Anthony Dip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 226 days.

(21) Appl. No.: 13/035,049

(22) Filed: Feb. 25, 2011

(65) Prior Publication Data

US 2011/0151122 A1 Jun. 23, 2011

Related U.S. Application Data

(62) Division of application No. 12/491,313, filed on Jun. 25, 2009.

(30) Foreign Application Priority Data

Aug. 25, 2008 (JP) ................. 2008-215984
Mar. 10, 2009 (JP) ................. 2009-056685
Jun. 10, 2009 (JP) ................. 2009-139575

(51) Int. Cl.
*C23C 16/00* (2006.01)

(52) U.S. Cl.
USPC .......................... 118/719; 118/730

(58) Field of Classification Search
USPC ................................. 118/719, 730
See application file for complete search history.

(56) References Cited

U.S. PATENT DOCUMENTS

| | | | | |
|---|---|---|---|---|
| 3,636,916 A | * | 1/1972 | Thelen et al. | 118/690 |
| 5,338,362 A | * | 8/1994 | Imahashi | 118/719 |
| 6,634,314 B2 | | 10/2003 | Hwang et al. | |
| 6,869,641 B2 | * | 3/2005 | Schmitt | 427/248.1 |
| 6,972,055 B2 | * | 12/2005 | Sferlazzo | 118/719 |
| 7,153,542 B2 | | 12/2006 | Nguyen et al. | |
| 7,485,583 B2 | * | 2/2009 | Kim et al. | 438/761 |
| 2003/0194493 A1 | | 10/2003 | Chang et al. | |
| 2004/0026374 A1 | | 2/2004 | Nguyen et al. | |
| 2007/0215036 A1 | | 9/2007 | Park et al. | |
| 2007/0218701 A1 | | 9/2007 | Shimizu et al. | |
| 2007/0218702 A1 | | 9/2007 | Shimizu et al. | |

FOREIGN PATENT DOCUMENTS

| | | |
|---|---|---|
| CN | 1650416 A | 8/2005 |
| JP | 04-287912 | 10/1992 |
| JP | 06-204147 | 7/1994 |
| JP | 3144664 | 1/2001 |

(Continued)

OTHER PUBLICATIONS

Extended European Search Report dated Dec. 7, 2009.

(Continued)

*Primary Examiner* — Joseph S Del Sole
*Assistant Examiner* — Erin Snelting
(74) *Attorney, Agent, or Firm* — IPUSA, PLLC

(57) ABSTRACT

A disclosed film deposition apparatus includes a turntable having in one surface a substrate receiving portion along a turntable rotation direction; a first reaction gas supplying portion for supplying a first reaction gas; a second reaction gas supplying portion for supplying a second reaction gas; a separation area between a first process area where the first reaction gas is supplied and a second process area where the second reaction gas is supplied, the separation area including a separation gas supplying portion for supplying a first separation gas in the separation area, and a ceiling surface opposing the one surface to produce a thin space; a center area having an ejection hole for ejecting a second separation gas along the one surface; and an evacuation opening for evacuating the chamber.

14 Claims, 37 Drawing Sheets

FOREIGN PATENT DOCUMENTS

| | | |
|---|---|---|
| JP | 2001-254181 | 9/2001 |
| JP | 2007-247066 | 9/2007 |
| JP | 2008-516428 | 5/2008 |
| JP | 2008-524842 | 7/2008 |
| WO | WO 2006/065014 | 8/2006 |

OTHER PUBLICATIONS

Japanese Office Action mailed Sep. 14, 2010.

\* cited by examiner

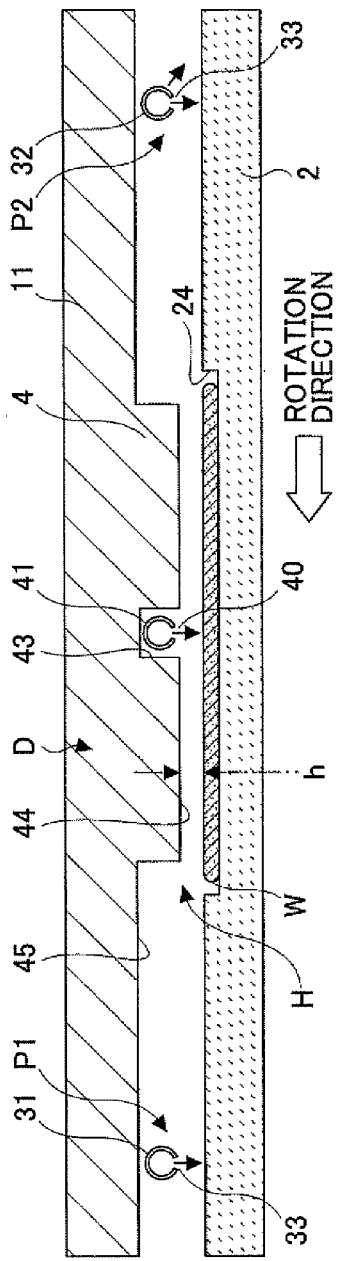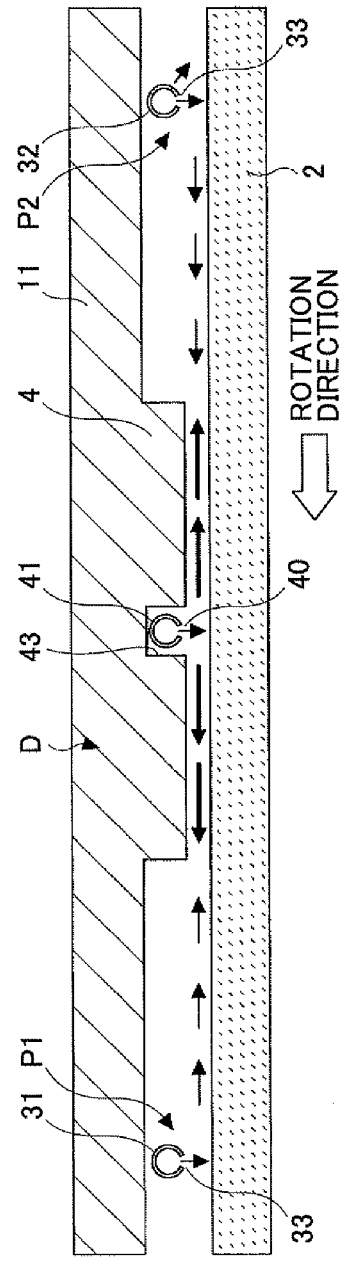

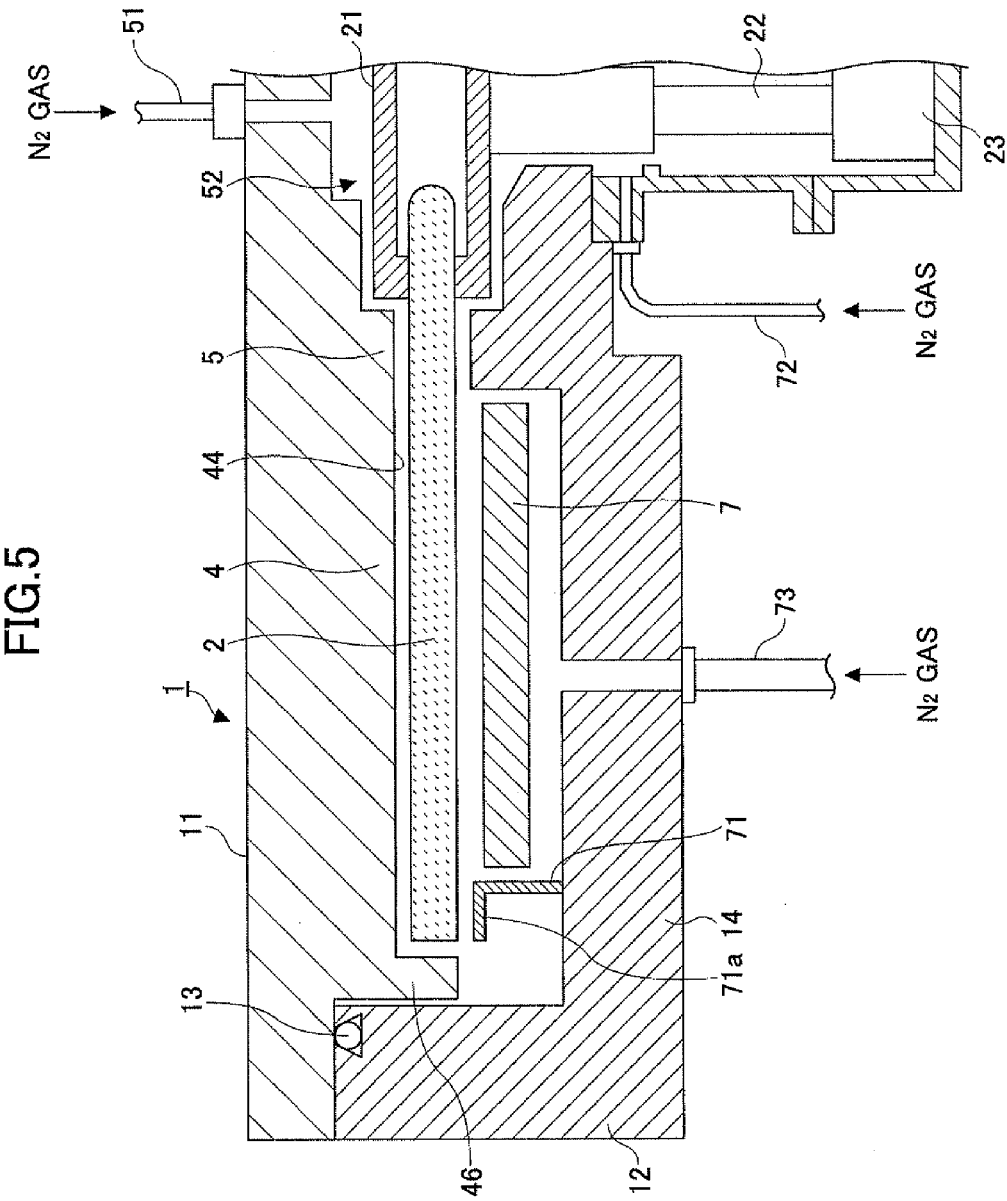

BTBAS

DI—ISOPROPYLAMINOSILANE

FILM DEPOSITION APPARATUS

CROSS-REFERENCE TO RELATED APPLICATION

This application is a divisional patent application of, and claims the benefit of and priority to U.S. patent application Ser. No. 12/491,313 filed on Jun. 25, 2009, which is based on and claims the benefit of priority of Japanese Patent Applications No. 2008-215984, No. 2009-056685, and No. 2009-139575, filed on Aug. 25, 2008, Mar. 10, 2009, and Jun. 10, 2009, respectively, with the Japanese Patent Office, all of which are hereby incorporated by reference.

BACKGROUND OF THE INVENTION

1. Field of the Invention

The present invention relates to a film deposition apparatus and a film deposition method for depositing a film on a substrate by carrying out plural cycles of supplying in turn at least two source gases to the substrate in order to form a layer of a reaction product, and a computer readable storage medium storing a computer program for causing the film deposition apparatus to carry out the film deposition method.

2. Description of the Related Art

As a film deposition technique in a semiconductor fabrication process, there has been known a so-called Atomic Layer Deposition (ALD) or Molecular Layer Deposition (MLD). In such a film deposition technique, a first reaction gas is adsorbed on a surface of a semiconductor wafer (referred to as a wafer hereinafter) under vacuum and then a second reaction gas is adsorbed on the surface of the wafer in order to foam one or more atomic or molecular layers through reaction of the first and the second reaction gases on the surface of the wafer; and such an alternating adsorption of the gases is repeated plural times, thereby depositing a film on the wafer. This technique is advantageous in that the film thickness can be controlled at higher accuracy by the number of times alternately supplying the gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis (tertiary-butylamino) silane (BTBAS) gas or the like is used as a first reaction gas (source gas) and ozone gas or the like is used as a second gas (oxidation gas).

In order to carry out such a deposition method, use of a single-wafer deposition apparatus having a vacuum chamber and a shower head at a top center portion of the vacuum chamber has been under consideration. In such a deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long process time because the number of cycles may reach several hundred. Therefore, a deposition method and apparatus that enable high throughput is desired.

Under these circumstances, film deposition apparatuses having a vacuum chamber and a rotation table that holds plural wafers along a rotation direction have been proposed. Patent Document 1 listed below discloses a deposition apparatus whose process chamber is shaped into a flattened cylinder. The process chamber is divided into two half circle areas. Each area has an evacuation port provided to surround the area at the top portion of the corresponding area. In addition, the process chamber has a gas inlet port that introduces separation gas between the two areas along a diameter of the process chamber. With these configurations, while different reaction gases are supplied into the corresponding areas and evacuated from above by the corresponding evacuation ports, a rotation table is rotated so that the wafers placed on the rotation table can alternately pass through the two areas. A separation area to which the separation gas is supplied has a lower ceiling than the areas to which the reaction gases are supplied.

However, because the reaction gases and the separation gas are supplied downward and then evacuated upward from the evacuation ports provided at the upper portion of the chamber, particles in the chamber may be blown up by the upward flow of the gases and fall on the wafers, leading to contamination of the wafers.

Patent Document 2 discloses a process chamber having a wafer support member (rotation table) that holds plural wafers and that is horizontally rotatable, first and second gas ejection nozzles that are located at equal angular intervals along the rotation direction of the wafer support member and oppose the wafer support member, and purge nozzles that are located between the first and the second gas ejection nozzles. The gas ejection nozzles extend in a radial direction of the wafer support member. A top surface of the wafers is higher than a top surface of the wafer supporting member, and the distance between the ejection nozzles and the wafers on the wafer support member is about 0.1 mm or more. A vacuum evacuation apparatus is connected to a portion between the outer edge of the wafer support member and the inner wall of the process chamber. According to a process chamber so configured, the purge gas nozzles discharge purge gases to create a gas curtain, thereby preventing the first reaction gas and the second reaction gas from being mixed.

However, the gas curtain cannot completely prevent mixture of the reaction gases but may allow one of the reaction gases to flow through the gas curtain to be mixed with the other reaction gas partly because the gases flow along the rotation direction due to the rotation of the wafer support member. In addition, the first (second) reaction gas discharged from the first (second) gas outlet nozzle may flow through the center portion of the wafer support member to meet the second (first) gas, because centrifugal force is not strongly applied to the gases in a vicinity of the center of the rotating wafer support member. Once the reaction gases are mixed in the chamber, an MLD (or ALD) mode film deposition cannot be carried out as expected.

Patent Document 3 discloses a process chamber that is divided into plural process areas along the circumferential direction by plural partitions. Below the partitions, a circular rotatable susceptor on which plural wafers are placed is provided leaving a slight gap in relation to the partitions. In addition, at least one of the process areas serves as an evacuation chamber. In such a process chamber, process gas introduced into one of the process areas may diffuse into the adjacent process area through the gap below the partition, and be mixed with another process gas introduced into the adjacent process area. Moreover, the process gases may be mixed in the evacuation chamber, so that the wafer is exposed to the two process gases at the same time. Therefore, ALD (or MLD) mode deposition cannot be carried out in a proper manner by this process chamber.

Patent Document 4 discloses a process chamber having four sector-shaped gas supplying plates each of which has a vortex angle of 45 degrees, the four gas supplying plates being located at angular intervals of 90 degrees, evacuation ports that evacuate the process chamber and are located between the adjacent two gas supplying plates, and a susceptor that holds plural wafers and is provided in order to oppose the gas supplying plate. The four gas supplying plates can discharge $AsH_3$ gas, $H_2$ gas, trimethyl gallium (TMG) gas, and $H_2$ gas, respectively. However, Patent Document 4 does not provide any realistic measures to prevent two source gases ($AsH_3$, TMG) from being mixed. Because of the lack of such measures, the two source gases may be mixed around the center of the susceptor and through the $H_2$ gas supplying plates. Moreover, because the evacuation ports are located between the adjacent two gas supplying plates to evacuate the gases upward, particles are blown up from the susceptor surface, which leads to wafer contamination.

Patent Document 5 discloses a process chamber having a circular plate that is divided into four quarters by partition walls and has four susceptors respectively provided in the four quarters, four injector pipes connected into a cross shape, and two evacuation ports located near the corresponding susceptors. In this process chamber, four wafers are mounted in the corresponding four susceptors, and the four injector pipes rotate around the center of the cross shape above the circular plate while ejecting a source gas, a purge gas, a reaction gas, and another purge gas, respectively. In such a process chamber, after one of the injector pipes passes over one of the quarters, this quarter cannot be purged by the purge gas in a short period of time. In addition, the reaction gas in one of the quarters can easily flow into an adjacent quarter. Therefore, it is difficult to perform an MLD (or ALD) mode film deposition.

Furthermore, Patent Document 6 (Patent Documents 7, 8) discloses a film deposition apparatus preferably used for an Atomic Layer CVD method that causes plural gases to be alternately adsorbed on a target (a wafer). In the apparatus, a susceptor that holds the wafer is rotated, while source gases and purge gases are supplied to the susceptor from above. Paragraphs 0023, 0024, and 0025 of the document describe partition walls that extend in a radial direction from a center of a chamber, and gas ejection holes that are formed in a bottom of the partition walls in order to supply the source gases or the purge gas to the susceptor, so that an inert gas as the purge gas ejected from the gas ejection holes produces a gas curtain. Regarding evacuation of the gases, a paragraph 0058 of the document describes that the source gases are evacuated through an evacuation channel 30a, and the purge gases are evacuated through an evacuation channel 30b. With such a configuration, the source gases can flow into a purge gas compartment from source gas compartments located in both sides of the purge gas compartment and be mixed with each other in the purge gas compartment. As a result, a reaction product is generated in the purge gas compartment, which may cause particles to fall onto the wafer.

Patent Document 1: U.S. Pat. No. 7,153,542 (FIGS. 6A, 6B)
Patent Document 2: Japanese Patent Application Laid-Open Publication No. 2001-254181 (FIGS. 1, 2)
Patent Document 3: Japanese Patent Publication No. 3,144,664 (FIGS. 1, 2, claim 1)
Patent Document 4: Japanese Patent Application Laid-Open Publication No. H4-287912
Patent Document 5: U.S. Pat. No. 6,634,314
Patent Document 6: Japanese Patent Application Laid-Open Publication No. 2007-247066 (paragraphs 0023 through 0025, 0058, FIGS. 12 and 13)
Patent Document 7: United States Patent Publication No. 2007-218701
Patent Document 8: United States Patent Publication No. 2007-218702

SUMMARY OF THE INVENTION

The present invention has been made in view of the above circumstances, and is directed to a film deposition apparatus, a film deposition method, and a computer readable storage medium storing a computer program that causes the film deposition apparatus to carry out the film deposition method, which enable film deposition by carrying out plural cycles of alternately supplying plural reaction gases to a substrate to produce plural layers of the reaction products of the reaction gases on the substrate without allowing the plural gases to be mixed on the wafer, thereby performing a proper ALD (or MLD) mode film deposition without jeopardizing high production throughput.

In order to achieve the above objective, a first aspect of the present invention provides a film deposition apparatus for depositing a film on a substrate by carrying out a cycle of alternately supplying at least two kinds of reaction gases that react with each other to the substrate to produce a layer of a reaction product in a chamber. The film deposition apparatus includes a turntable rotatably provided in the chamber; a substrate receiving portion that is provided in one surface of the turntable and the substrate is placed in; a first reaction gas supplying portion configured to supply a first reaction gas to the one surface; a second reaction gas supplying portion configured to supply a second reaction gas to the one surface, the second reaction gas supplying portion being separated from the first reaction gas supplying portion along a rotation direction of the turntable; a separation area located along the rotation direction between a first process area in which the first reaction gas is supplied and a second process area in which the second reaction gas is supplied; a center area that is located substantially in a center portion of the chamber in order to separate the first process area and the second process area, and has an ejection hole that ejects a first separation gas along the one surface; and an evacuation opening provided in the chamber in order to evacuate the chamber. In this film deposition, the separation area includes a separation gas supplying portion that supplies a second separation gas, and a ceiling surface that creates in relation to the one surface of the turntable a thin space where the second separation gas may flow from the separation area to the process area side in relation to the rotation direction.

A second aspect of the present invention provides a film deposition apparatus according to the first aspect, wherein the center area is defined by a rotation center portion of the turntable and an inner upper surface of the chamber, and wherein the center area is purged with the first purge gas.

A third aspect of the present invention provides a film deposition apparatus according to the first aspect, wherein the center area includes a pillar member provided between an inner upper surface of the chamber and a bottom surface of the chamber, and a rotation sleeve rotatably provided in order to allow the pillar member to be located inside of the rotation sleeve, and wherein the rotation sleeve serves as a rotation shaft for the turntable.

A fourth aspect of the present invention provides a film deposition apparatus according to any one of the first through the third aspects, wherein the evacuation opening is provided in order to evacuate the chamber through a gap between an outer circumferential edge of the turntable and an inner circumferential wall of the chamber.

A fifth aspect of the present invention provides a film deposition apparatus according to any one of the first through the fourth aspects, wherein a pressure in the separation area is greater than a pressure in the first and the second process areas.

A sixth aspect of the present invention provides a film deposition apparatus according to any one of the first through the fifth aspects, wherein a height difference between a surface of the substrate placed in the substrate receiving portion and a top surface of the turntable, the top surface being excluded from the substrate receiving portion, is smaller than or equal to 5 mm.

A seventh aspect of the present invention provides a film deposition apparatus according to any one of the first through the sixth aspects, further including a first gas introduction port configured to introduce the first reaction gas to the first gas supplying portion; a second gas introduction port configured to introduce the second reaction gas to the second gas supplying portion; and a third gas introduction port configured to introduce the separation gas to the separation gas supplying portion; wherein the first, the second, and the third gas introduction ports are provided in at least one of a circumferential wall of the chamber and a rotation center portion of the chamber.

An eighth aspect of the present invention provides a film deposition apparatus according to any one of the first through the seventh aspects, wherein the separation gas supplying portion includes plural ejection holes arranged in one of plural directions from a rotation center of the turntable to the outer circumference of the turntable and from the circumference to the rotation center.

A ninth aspect of the present invention provides a film deposition apparatus according to any one of the first through the eighth aspects, wherein the ceiling surface of the separation area is flat.

A tenth aspect of the present invention provides a film deposition apparatus according to any one of the first through the eighth aspects, wherein the ceiling surface of the separation area is curved.

An eleventh aspect of the present invention provides a film deposition apparatus according to any one of the first through the tenth aspects, wherein plural of the evacuation openings are provided corresponding to the first process area and the second process area in order to evacuate substantially exclusively the first reaction gas from one of the evacuation openings and the second reaction gas from another of the evacuation openings.

A twelfth aspect of the present invention provides a film deposition apparatus according to any one of the first through the eleventh aspects, further including a heating portion that heats the turntable.

A thirteenth aspect of the present invention provides a film deposition apparatus according to any one of the first through the twelfth aspects, wherein the heating member is located below the turntable.

A fourteenth aspect of the present invention provides a film deposition apparatus according to any one of the first through the twelfth aspects, wherein the heating member is located above the turntable.

A fifteenth aspect of the present invention provides a film deposition apparatus according to any one of the first through the fourteenth aspects, further comprising a purge gas supplying portion that supplies a purge gas to a space below the turntable in order to reducing an amount of the first reaction gas and the second reaction gas flowing into the space from the outer circumference of the turntable.

A sixteenth aspect of the present invention provides a film deposition apparatus according to any one of the first through the fifteenth aspects, wherein the separation area includes a bent portion bent from an edge of the ceiling surface, the edge being adjacent to an inner circumferential wall of the chamber, in order to intervene between an outer circumference of the turntable and the inner circumferential wall, and wherein a gap between the bent portion and the outer circumference of the turntable is determined so that the gap may prevent the first reaction gas and the second reaction gas from entering the gap.

A seventeenth aspect of the present invention provides a film deposition apparatus according to any one of the first through the sixteenth aspects, wherein the ceiling surface that creates the thin space in the separation area has a distance of about 50 mm or more along an arc corresponding to a route through which a center of the substrate placed in the substrate receiving portion of the turntable passes when the turntable rotates.

An eighteenth aspect of the present invention provides a film deposition apparatus according to any one of the first through the seventeenth aspects, wherein the turntable includes plural of the substrate receiving portions along the rotation direction of the turntable.

A nineteenth aspect of the present invention provides a film deposition apparatus according to any one of the first through the eighteenth aspects, wherein the chamber has a transfer opening through which the substrate is transferred back and forth between the turntable and a transfer mechanism outside of the chamber, the transfer opening being openable/closable by a gate valve provided on a side wall of the chamber.

A twentieth aspect of the present invention provides a deposition apparatus according to any one of the first through the nineteenth aspects, wherein a distance along the rotation direction between the separation gas supplying portion and a ceiling surface edge located upstream relative to the rotation direction becomes longer at an outer position along a radial direction of the turntable.

A twenty first aspect of the present invention provides a deposition apparatus according to the twentieth aspect, wherein the ceiling surface of the separation area is substantially sector-shaped.

A twenty second aspect of the present invention provides a substrate processing apparatus including a transfer chamber having a substrate transfer mechanism inside of the transfer chamber; the film deposition apparatus of claim 1 connected hermetically to the transfer chamber; and a preparation chamber that may be evacuated to a vacuum, the preparation chamber being connected hermetically to the transfer chamber.

A twenty third aspect of the present invention provides a film deposition method for depositing a film on a substrate by carrying out a cycle of alternately supplying at least two kinds of reaction gases that react with each other to the substrate to produce a layer of a reaction product in a chamber. This film deposition method including steps of placing the substrate on a turntable rotatably provided in the chamber; rotating the turntable on which the substrate is placed; supplying a first reaction gas from a first reaction gas supplying portion to the turntable; supplying a second reaction gas from a second reaction gas supplying portion to the turntable, the second reaction gas supplying portion being separated from the first reaction gas supplying portion along a rotation direction of the turntable; supplying a first separation gas from a separation gas supplying portion provided in a separation area located between a first process area in which the first reaction gas is supplied from the first reaction gas supplying portion and a second process area in which the second reaction gas is supplied from the second reaction gas supplying portion in order to flow the first separation gas from the separation area to the process area relative to the rotation direction of the turntable in a thin space created between a ceiling surface of the separation area and the turntable; supplying a second separation gas from an ejection hole formed in a center area located in a center portion of the chamber; and evacuating the chamber.

A twenty fourth aspect of the present invention provides a deposition method according to the twenty third aspect, wherein the center area is defined by a rotation center portion of the turntable and an inner upper surface of the chamber, and wherein the center area is purged with the first purge gas.

A twenty fifth aspect of the present invention provides a film deposition method according to the twenty third aspect, wherein the center area includes a pillar member provided between an inner upper surface of the chamber and a bottom surface of the chamber, and a rotation sleeve rotatably provided in order to allow the pillar member to be located inside of the rotation sleeve, and wherein the rotation sleeve serves as a rotation shaft for the turntable.

A twenty sixth aspect of the present invention provides a film deposition method according to any one of the twenty third through the twenty fifth aspects, wherein the chamber is evacuated through a gap between an outer circumferential edge of the turntable and an inner circumferential wall of the chamber in the evacuating step.

A twenty seventh aspect of the present invention provides a film deposition method according to any one of the twenty third through the twenty sixth aspects, wherein the ceiling surface that creates the thin space in the separation area has a distance of about 50 mm or more along an arc corresponding to a route through which a center of the substrate placed in the substrate receiving portion of the turntable passes when the turntable rotates.

A twenty eighth aspect of the present invention provides a film deposition method according to any one of the twenty third through the twenty seventh, wherein a pressure in the separation area is greater than a pressure in the first and the second process areas.

A twenty ninth aspect of the present invention provides a film deposition method according to any one of the twenty third through the twenty eighth aspects, wherein a pressure in the separation area is greater than a pressure in the first and the second process areas.

A thirtieth aspect of the present invention provides a film deposition method according to any one of the twenty third through the twenty ninth aspects, further including a step of heating the turntable.

A thirty first aspect of the present invention provides a film deposition method of any one of the twenty third through the thirty first aspects, wherein the first reaction gas is evacuated substantially exclusively from one of the plural evacuation openings provided corresponding to the number of the reaction gases, and the second reaction gas is evacuated substantially exclusively from another of the plural evacuation openings.

A thirty second aspect of the present invention provides a film deposition method according to any one of the twenty third through the thirty first aspects, further including a step of supplying a purge gas to a space below the turntable when film deposition is carried out.

A thirty third aspect of the present invention provides a computer readable storage medium storing a program to be used in a film deposition apparatus in which a film is deposited on a substrate by carrying out a cycle of alternately supplying at least two kinds of reaction gases that react with each other to the substrate to produce a layer of a reaction product in a chamber, the program comprising a group of steps that cause the film deposition apparatus to carry out the film deposition method of claim 23.

A thirty fourth aspect of the present invention provides a film deposition apparatus according to any of the first through the twenty first aspects, further comprising a third reaction gas supplying portion configured to supply a third reaction gas to the one surface; a fourth reaction gas supplying portion configured to supply a fourth reaction gas to the one surface, wherein the third reaction gas and the fourth reaction gas may form a second reaction product different from a first reaction product formed from the first reaction gas and the second reaction gas, the fourth reaction gas supplying portion being separated from the third reaction gas supplying portion along the rotation direction of the turntable; and a controlling portion configured to control the first through the fourth reaction gas supplying portions so that depositing a first film from the first reaction gas from the first reaction gas supplying portion and the second reaction gas from the second reaction gas supplying portion is carried out alternately with depositing a second film from the third reaction gas from the third reaction gas supplying portion and the fourth reaction gas from the fourth reaction gas supplying portion.

A thirty fifth aspect of the present invention provides a film deposition method according to the thirty third aspect, wherein the first reaction gas supplying portion serves also as the third reaction gas supplying portion, and the second reaction gas supplying portion serves also as the fourth reaction gas supplying portion.

A thirty sixth aspect of the present invention provides a film deposition method according to the twenty third through the thirty fourth aspects, further comprising a step of alternately supplying a third gas from a third reaction gas supplying portion and a fourth gas from a fourth reaction gas supplying portion to the substrate to deposit a reaction product that is different from a reaction product deposited from the first reaction gas and the second reaction gas, the third reaction gas supplying portion and the fourth gas supplying portion being arranged apart from each other in a rotation direction of the turntable, wherein the step of alternately supplying the third reaction gas and the fourth reaction gas is carried out after the step of supplying the first reaction gas and the step of supplying the second reaction gas are alternately carried out.

A thirty seventh aspect of the present invention provides a film deposition method according to the thirty sixth aspect, wherein the first reaction gas supplying portion serves also as the third reaction gas supplying portion, and the second reaction gas supplying portion serves also as the fourth reaction gas supplying portion.

According to embodiments of the present invention, when plural reaction gases, which react with each other, are alternately supplied to a surface of a wafer and the alternating supplying is repeated plural times to form plural layers of the reaction product, the wafer is placed on the turntable and the plural reaction gases are supplied to the wafer surface by rotating the turntable, thereby realizing a high throughput film deposition.

Moreover, the separation gas supplying portion is provided between the first reaction gas supplying portion and the second reaction gas supplying portion, and the lower ceiling surfaces are provided on both sides of the separation gas supplying portion in order to produce a thin space between the lower ceiling surfaces and the turntable, so that the reaction gases are prevented from entering the separation area. In addition to this, a first separation gas is ejected from a center area toward an outer circumference of the turntable and the reaction gases are evacuated, along with the first separation gas that is ejected from the center area and the second separation gas that diffuse toward both sides of the separation area, through the gap between the inner circumferential wall and the outer circumference of the turntable. Therefore, the first and the second reaction gases are prevented from being mixed, thereby performing the MLD (ALD) mode film deposition as expected.

BRIEF DESCRIPTION OF THE DRAWINGS

Other objects, features and advantages of the present invention will become more apparent from the following detailed description when read in conjunction with the accompanying drawings, in which:

FIGS. 4A and 4B are developed cross-sectional view showing a separation area and process areas;

FIG. 5 is a partial cross-sectional view of the film deposition apparatus of FIG. 1;

DETAILED DESCRIPTION OF THE PREFERRED EMBODIMENT

Figure 1:
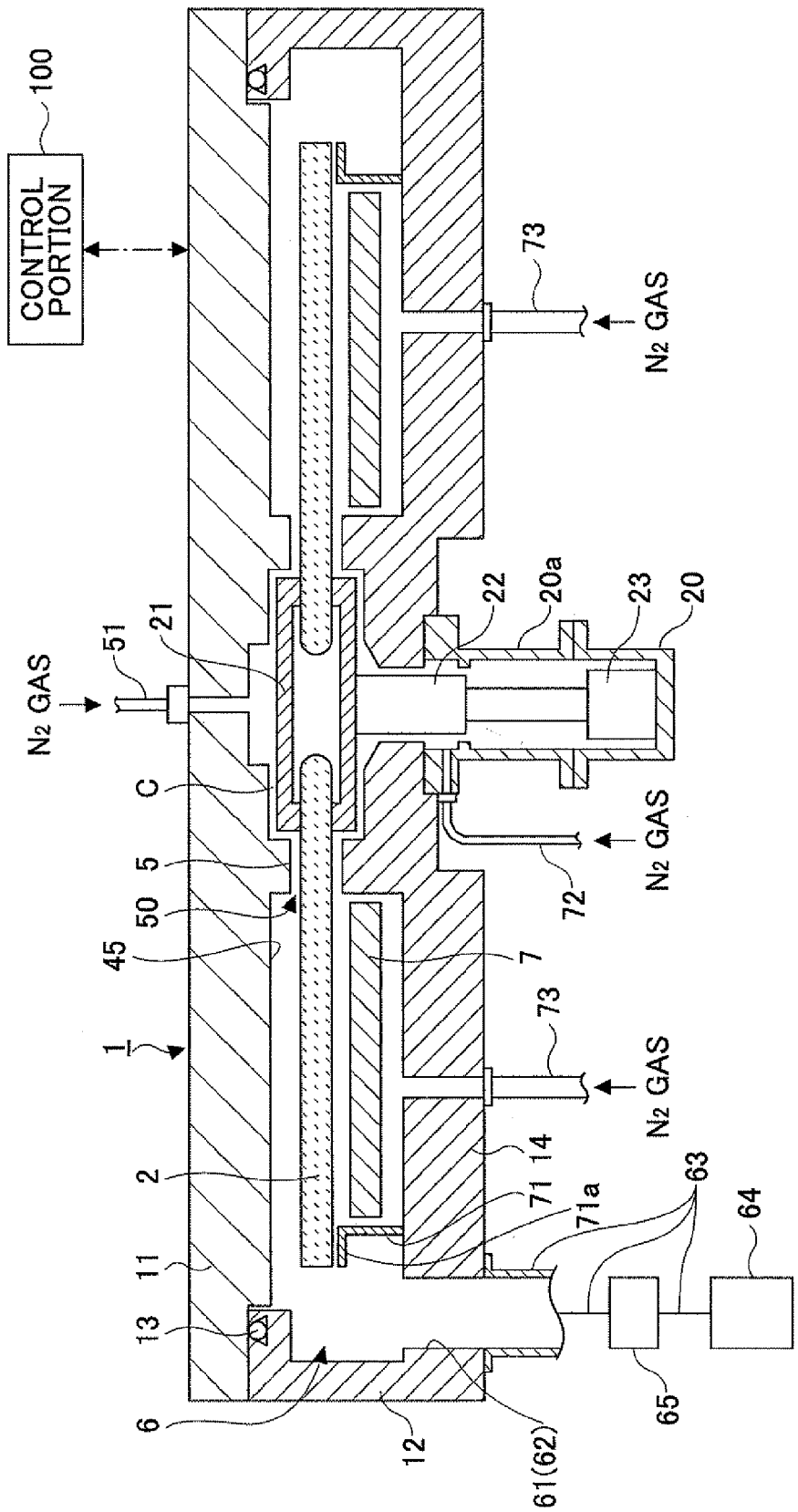
FIG. 1 is a cut-away diagram of a film deposition apparatus according to an embodiment of the present invention.

Non-limiting, exemplary embodiments of the present invention will now be described with reference to the accompanying drawings. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

Figure 3:
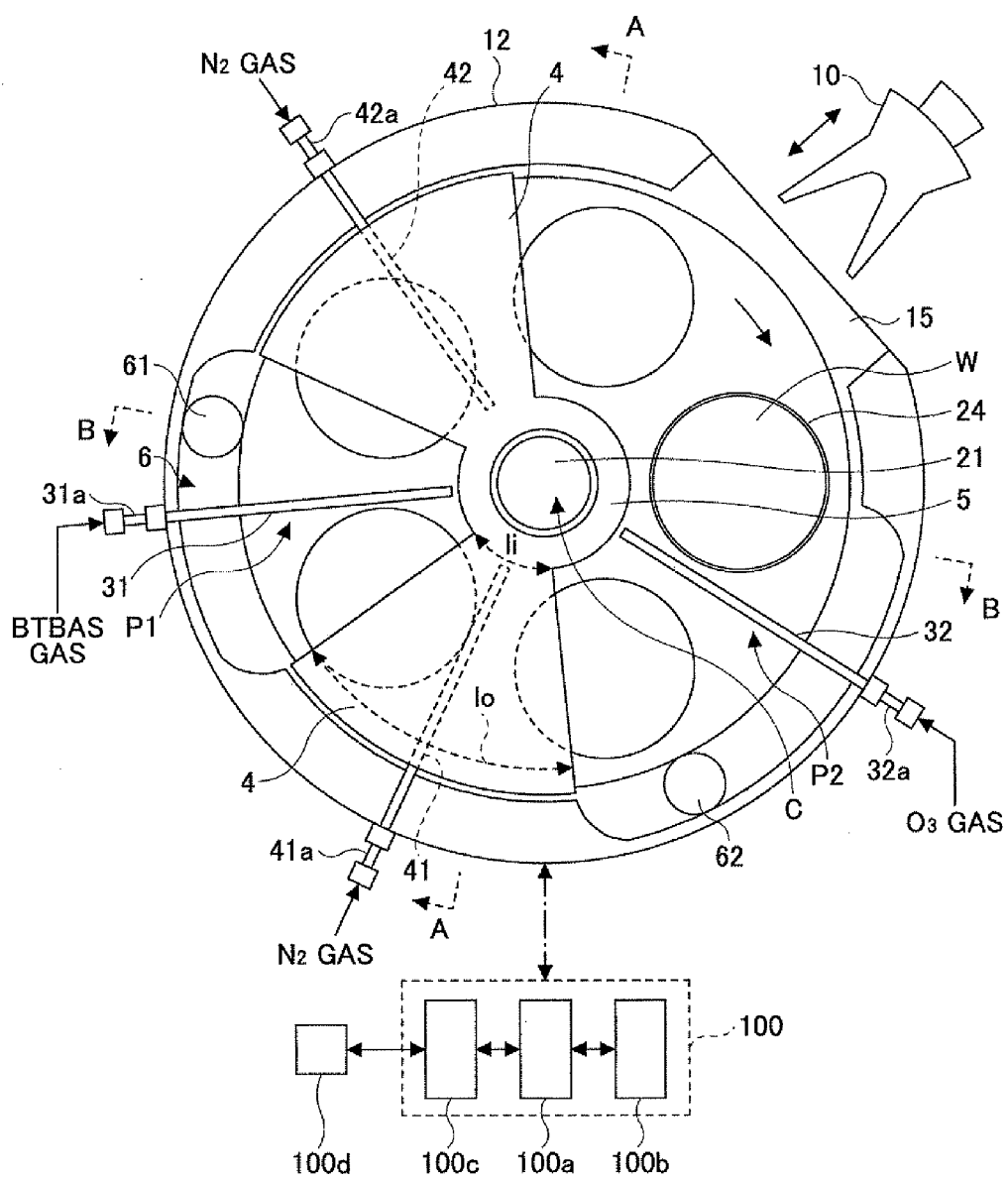
FIG. 3 is a plan view of the film deposition apparatus of FIG. 1.

Referring to FIG. 1, which is a cut-away diagram taken along B-B line in FIG. 3, a film deposition apparatus according to an embodiment of the present invention has a vacuum chamber 1 having a flattened cylinder shape, and a turn table 2 that is located inside the chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a ceiling member such as an O ring 13, so that the vacuum chamber 1 is hermetically sealed. On the other hand, the ceiling plate 11 can be raised by a driving mechanism (not shown) when the ceiling plate 11 has to be removed from the chamber body 12.

The turntable 2 is rotatably fixed onto a cylindrically shaped core portion 21. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 is hermetically fixed to a bottom surface of the bottom portion 14 via a flanged pipe portion 20a, which isolates an inner environment of the case body 20 from an outer environment.

Figure 2:
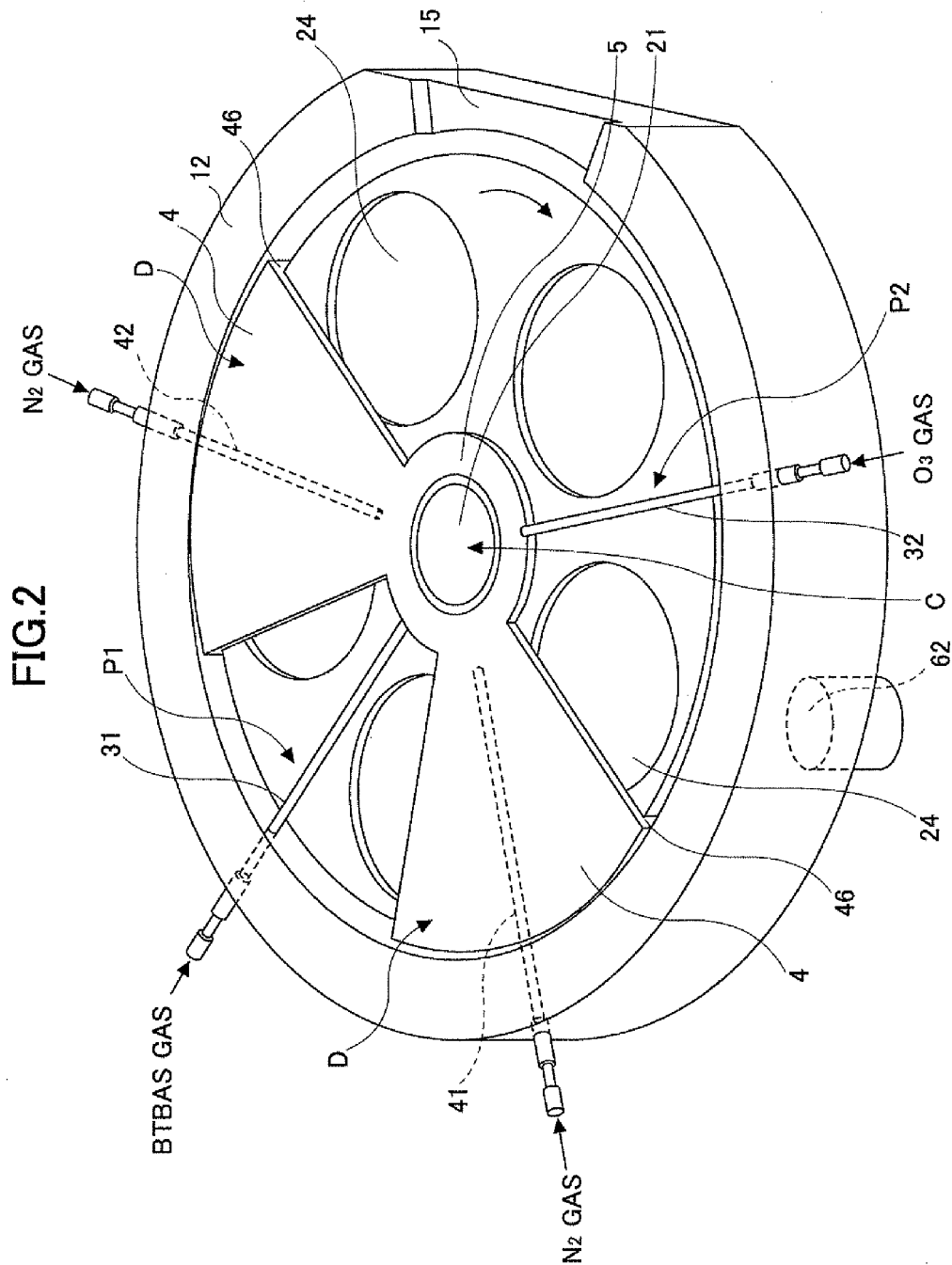
FIG. 2 is a perspective view of the film deposition apparatus of FIG. 1.

As shown in FIGS. 2 and 3, plural (five in the illustrated example) circular concave portions 24, each of which receives a wafer W, are formed in a top surface of the turntable 2, although only one wafer W is illustrated in FIG. 3. The concave portions 24 are located at equal angular intervals in the turntable 2. FIG. 4A is a projected cross-sectional diagram taken along an arc extending from a first reaction gas nozzle 31 to a second reaction gas nozzle 32 in FIG. 3. As shown in FIG. 4A, the concave portion 24 has a diameter slightly larger, for example, by 4 mm than the diameter of the wafer W and a depth equal to a thickness of the wafer W. Therefore, when the wafer W is placed in the concave portion 24, a surface of the wafer W is at the same elevation of a surface of an area of the turntable 2, the area excluding the concave portions 24. If there is a relatively large step between the area and the wafer W, gas flow turbulence is caused by the step, which may affect thickness uniformity across the wafer W. This is why the two surfaces are at the same elevation. While "the same elevation" may mean here that a height difference is less than or equal to about 5 mm, the difference has to be as close to zero as possible to the extent allowed by machining accuracy. In the bottom of the concave portion 24 there are formed three through holes (not shown) through which three corresponding elevation pins (see FIG. 8) are raised/lowered. The elevation pins support a back surface of the wafer W and raises/lowers the wafer W.

The concave portions 24 are wafer W receiving areas provided to position the wafers W and prevent the wafers W from being thrown out by centrifugal force caused by rotation of the turntable 2. However, the wafer W receiving areas are not limited to the concave portions 24, but may be performed by guide members that are located at predetermined angular intervals on the turntable 2 to hold the edges of the wafers W. For example, the wafer W receiving areas may be performed by electrostatic chucks.

Referring again to FIGS. 2 and 3, the chamber 1 includes a first reaction gas nozzle 31, a second reaction gas nozzle 32, and separation gas nozzles 41, 42 above the turntable 2, all of which extend in radial directions and at predetermined angular intervals. With this configuration, the concave portions 24 can move through and below the nozzles 31, 32, 41, and 42. In the illustrated example, the second reaction gas nozzle 32, the separation gas nozzle 41, the first reaction gas nozzle 31, and the separation gas nozzle 42 are arranged clockwise in this order. These gas nozzles 31, 32, 41, and 42 penetrate the circumferential wall portion of the chamber body 12 and are supported by attaching their base ends, which are gas inlet ports 31a, 32a, 41a, 42a, respectively, on the outer circumference of the wall portion. Although the gas nozzles 31, 32, 41, 42 are introduced into the chamber 1 from the circumferential wall portion of the chamber 1 in the illustrated example, these nozzles 31, 32, 41, 42 may be introduced from a ring-shaped protrusion portion 5 (described later). In this case, an L-shaped conduit may be provided in order to be open on the outer circumferential surface of the protrusion portion 5 and on the outer top surface of the ceiling plate 11. With such an L-shaped conduit, the nozzle 31 (32, 41, 42) can be connected to one opening of the L-shaped conduit inside the chamber 1 and the gas inlet port 31a (32a, 41a, 42a) can be connected to the other opening of the L-shaped conduit outside the chamber 1.

Although not shown, the reaction gas nozzle 31 is connected to a gas supplying source of bis (tertiary-butylamino) silane (BTBAS), which is a first source gas, and the reaction gas nozzle 32 is connected to a gas supplying source of $O_3$ (ozone) gas, which is a second source gas.

The reaction gas nozzles 31, 32 have plural ejection holes 33 to eject the corresponding source gases downward. The plural ejection holes 33 are arranged in longitudinal directions of the reaction gas nozzles 31, 32 at predetermined intervals. The ejection holes 33 have an inner diameter of about 0.5 mm, and are arranged at intervals of about 10 mm in this embodiment. The reaction gas nozzles 31, 32 are a first reaction gas supplying portion and a second reaction gas supplying portion, respectively, in this embodiment. In addition, an area below the reaction gas nozzle 31 is a first process area P1 in which the BTBAS gas is adsorbed on the wafer W, and an area below the reaction gas nozzle 32 is a second process area P2 in which the $O_3$ gas is adsorbed on the wafer W.

On the other hand, the separation gas nozzles 41, 42 are connected to gas supplying sources of $N_2$ (nitrogen) gas (not shown). The separation gas nozzles 41, 42 have plural ejection holes 40 to eject the separation gases downward from the plural ejection holes 40. The plural ejection holes 40 are arranged at predetermined intervals in longitudinal directions of the separation gas nozzles 41, 42. The ejection holes 40 have an inner diameter of about 0.5 mm, and are arranged at intervals of about 10 mm in this embodiment.

The separation gas nozzles 41, 42 are provided in separation areas D that are configured to separate the first process area P1 and the second process area P2. In each of the separation areas D, there is provided a convex portion 4 on the ceiling plate 11, as shown in FIGS. 2 through 4. The convex portion 4 has a top view shape of a sector whose apex lies at the center of the chamber 1 and whose arced periphery lies near and along the inner circumferential wall of the chamber body 12. In addition, the convex portion 4 has a groove portion 43 that extends in the radial direction as if the groove portion 43 substantially bisected the convex portion 4. The separation gas nozzle 41 (42) is located in the groove portion 43. A circumferential distance between the center axis of the separation gas nozzle 41 (42) and one side of the sector-shaped convex portion 4 is substantially equal to the other circumferential distance between the center axis of the separation gas nozzle 41 (42) and the other side of the sector-shaped convex portion 4. By the way, while the groove portion 43 is formed in order to bisect the convex portion 4 in this embodiment, the groove portion 42 is formed so that an upstream side of the convex portion 4 relative to the rotation direction of the turntable 2 is wider, in other embodiments.

With the above configuration, there are flat low ceiling surfaces 44 (first ceiling surfaces) on both sides of the separation gas nozzle 41 (42), and high ceiling surfaces 45 (second ceiling surfaces) outside of the corresponding low ceiling surfaces 44, as shown in FIG. 4A. The convex portion 4 (ceiling surface 44) provides a separation space, which is a thin space H, between the convex portion 4 and the turn table 2 in order to impede the first and the second gases from entering the thin space and from being mixed.

Referring to FIG. 4B, the $O_3$ gas is impeded from entering the space between the convex portion 4 and the turn table 2, the $O_3$ gas flowing toward the convex portion 4 from the reaction gas nozzle 32 along the rotation direction of the turntable 2, and the BTBAS gas is impeded from entering the space between the convex portion 4 and the turn table 2, the BTBAS gas flowing toward the convex portion 4 from the reaction gas nozzle 31 along the counter-rotation direction of the turn table 2. "The gases being impeded from entering" means that the $N_2$ gas as the separation gas ejected from the separation gas nozzle 41 diffuses between the first ceiling surfaces 44 and the upper surface of the turn table 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gas are completely prevented from entering the separation space, but that the gases cannot proceed farther toward the separation gas nozzle 41 and thus be mixed with each other even when a fraction of the reaction gases to enter the separation space. Namely, as long as such effect is demonstrated, the separation area D is to separate the first process area P1 and the second process area P2. By the way, the BTBAS gas or the $O_3$ gas adsorbed on the wafer W can pass through below the convex portion 4. Therefore, the gases in "the gases being impeded from entering" mean the gases in a gaseous phase.

Referring to FIGS. 1, 2, and 3, a ring-shaped protrusion portion 5 is provided on a back surface of the ceiling plate 11 so that the inner circumference of the protrusion portion 5 faces the outer circumference of the core portion 21. The protrusion portion 5 opposes the turntable 2 at an outer area of the core portion 21. In addition, a back surface of the protrusion portion 5 and a back surface of the convex portion 4 form one plane surface. In other words, a height of the back surface of the protrusion portion 5 from the turntable 2 is the same as a height of the back surface of the convex portion 4, which will be referred to as a height h below. By the way, the convex portion 4 is formed not integrally with but separately from the protrusion portion 5 in other embodiments. FIGS. 2 and 3 show the inner configuration of the chamber 1 whose top plate 11 is removed while the convex portions 4 remain inside the chamber 1.

The separation area D is configured by forming the groove portion 43 in a sector-shaped plate to be the convex portion 4, and locating the separation gas nozzle 41 (42) in the groove portion 43 in the above embodiment. However, two sector-shaped plates may be attached on the lower surface of the ceiling plate 11 by screws so that the two sector-shaped plates are located on both sides of the separation gas nozzle 41 (32).

When the wafer W having a diameter of about 300 mm is supposed to be processed in the chamber 1, the convex portion 4 has a circumferential length of, for example, about 146 mm along an inner arc li (FIG. 3) that is at a distance 140 mm from the rotation center of the turntable 2, and a circumferential length of, for example, about 502 mm along an outer arc lo (FIG. 3) corresponding to the outermost portion of the concave portions 24 of the turntable 2 in this embodiment. In addition, a circumferential length from one side wall of the convex portion 4 through the nearest side wall of the groove portion 43 along the outer arc lo is about 246 mm.

In addition, the height h (FIG. 4A) of the back surface of the convex portion 4, or the ceiling surface 44, measured from the top surface of the turntable 2 (or the wafer W) is, for example, about 0.5 mm through about 10 mm, and preferably about 4 mm. In this case, the rotational speed of the turntable 2 is, for example, 1 through 500 rotations per minute (rpm). In order to ascertain the separation function performed by the separation area D, the size of the convex portion 4 and the height h of the ceiling surface 44 from the turntable 2 may be determined depending on the pressure in the chamber 1 and the rotational speed of the turntable 2 through experimentation. By the way, the separation gas is $N_2$ in this embodiment but may be an inert gas such as He and Ar, or $H_2$ in other embodiments, as long as the separation gas does not affect the deposition of silicon dioxide.

FIG. 5 shows a half portion of a cross-sectional view of the chamber 1, taken along an A-A line in FIG. 3, where the convex portion 4 is shown along with the protrusion portion 5 formed integrally with the convex portion 4. Referring to FIG. 5, the convex portion 4 has a bent portion 46 that bends in an L-shape at the outer circumferential edge of the convex portion 4. Although there are slight gaps between the bent portion 46 and the turntable 2 and between the bent portion 46 and the chamber body 12 because the convex portion 4 is attached on the back surface of the ceiling portion 11 and removed from the chamber body 12 along with the ceiling portion 11, the bent portion 46 substantially fills out a space between the turntable 2 and the chamber body 12, thereby preventing the first reaction gas (BTBAS) ejected from the first reaction gas nozzle 31 and the second reaction gas (ozone) ejected from the second reaction gas nozzle 32 from being mixed through the space between the turntable 2 and the chamber body 12. The gaps between the bent portion 46 and the turntable 2 and between the bent portion 46 and the chamber body 12 may be the same as the height h of the ceiling surface 44 from the turntable 2. In the illustrated example, a side wall facing the outer circumferential surface of the turntable 2 serves as an inner circumferential wall of the separation area D.

Now, referring again to FIG. 1, which is a cross-sectional view taken along a B-B line in FIG. 3, the chamber body 12 has an indented portion at the inner circumferential portion opposed to the outer circumferential surface of the turntable 2. The dented portion is referred to as an evacuation area 6 hereinafter. Below the evacuation area 6, there is an evacuation port 61 (see FIG. 3 for another evacuation port 62) which is connected to a vacuum pump 64 via an evacuation pipe 63, which can also be used for the evacuation port 62. In addition, the evacuation pipe 63 is provided with a pressure controller 65. Plural pressure controllers 65 may be provided to the corresponding evacuation ports 61, 62.

Referring again to FIG. 3, the evacuation port 61 is located between the first reaction gas nozzle 31 and the convex portion 4 that is located downstream relative to the clockwise rotation direction of the turntable 2 in relation to the first reaction gas nozzle 31, when viewed from above. With this configuration, the evacuation port 61 can substantially exclusively evacuate the BTBAS gas ejected from the reaction gas nozzle 31. On the other hand, the evacuation port 62 is located between the first reaction gas nozzle 32 and the convex portion 4 that is located downstream relative to the clockwise rotation direction of the turntable 2 in relation to the first reaction gas nozzle 32, when viewed from above. With this configuration, the evacuation port 62 can substantially exclusively evacuate the $O_3$ gas ejected from the reaction gas nozzle 32. Therefore, the evacuation ports 61, 62 so configured may assist the separation areas D to prevent the BTBAS gas and the $O_3$ gas from being mixed.

Although the two evacuation ports 61, 62 are made in the chamber body 12 in this embodiment, three evacuation ports may be provided in other embodiments. For example, an additional evacuation port may be made in an area between the second reaction gas nozzle 32 and the separation area D located upstream relative to the clockwise rotation of the turntable 2 in relation to the second reaction gas nozzle 32. In addition, a further additional evacuation port may be made somewhere in the chamber body 12. While the evacuation ports 61, 62 are located below the turntable 2 to evacuate the chamber 1 through an area between the inner circumferential wall of the chamber body 12 and the outer circumferential surface of the turntable 2 in the illustrated example, the evacuation ports may be located in the side wall of the chamber body 12. In addition, when the evacuation ports 61, 62 are provided in the side wall of the chamber body 12, the evacuation ports 61, 62 may be located higher than the turntable 2. In this case, the gases flow along the upper surface of the turntable 2 into the evacuation ports 61, 62 located higher the turntable 2. Therefore, it is advantageous in that particles in the chamber 1 are not blown up by the gases, compared to when the evacuation ports are provided, for example, in the ceiling plate 11.

Figure 6:
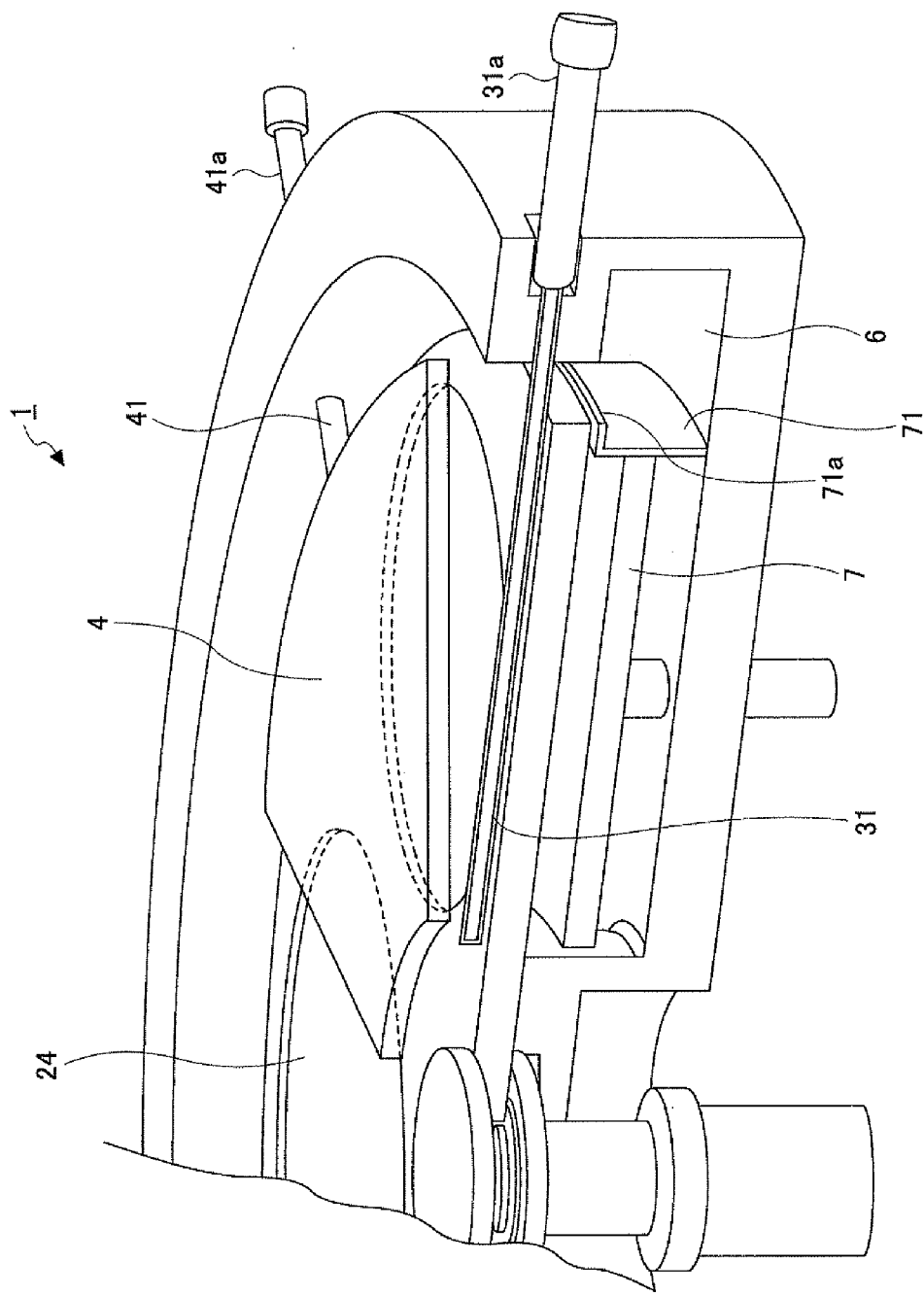
FIG. 6 is a perspective view of the film deposition apparatus of FIG. 1, especially showing a reaction gas supplying portion.

As shown in FIGS. 1, 2, and 6, a ring-shaped heater unit 7 as a heating portion is provided in a space between the bottom portion 14 of the chamber body 12 and the turntable 2, so that the wafers W placed on the turntable 2 are heated through the turntable 2 at a temperature determined by a process recipe. In addition, a cover member 71 is provided beneath the turntable 2 and near the outer circumference of the turntable 2 in order to surround the heater unit 7, so that the space where the heater unit 7 is located is partitioned from the outside area of the cover member 71. The cover member 71 has a flange portion 71a at the top. The flange portion 71a is arranged so that a slight gap is maintained between the back surface of the turntable 2 and the flange portion in order to prevent gas from flowing inside the cover member 71.

Referring back to FIG. 1, the bottom portion 14 has a raised portion in an inside area of the ring-shaped heater unit 7. The top surface of the raised portion comes close to the back surface of the turntable 2 and the core portion 21, leaving slight gaps between the raised portion and the turntable 2 and between the raised portion and the core portion 21. In addition, the bottom portion 14 has a center hole through which the rotational shaft 22 passes. The inner diameter of the center hole is slightly larger than the diameter of the rotational shaft 22, leaving a gap for communication with the case body 20 through the flanged pipe portion 20a. A purge gas supplying pipe 72 is connected to an upper portion of the flanged pipe portion 20a. In addition, plural purge gas supplying pipes 73 are connected at predetermined angular intervals to areas below the heater unit 7 in order to purge the space where the heater unit 7 is housed.

With these configurations, $N_2$ purge gas may flow from the purge gas supplying pipe 72 to the heater unit space through the gap between the rotational shaft 22 and the center hole of the bottom portion 14, the gap between the core portion 21 and the raised portion of the bottom portion 14, and the gap between the raised portion of the bottom portion 14 and the back surface of the turntable 2. In addition, $N_2$ purge gas may flow from the purge gas supplying pipes 73 to the space below the heater unit 7. Then, these $N_2$ purge gases flow into the evacuation port 61 through the gap between the flange portion 71a of the cover member 71 and the back surface of the turntable 2. These flows of the $N_2$ purge gas are schematically illustrated by arrows in FIG. 7. These $N_2$ purge gases serve as separation gases that prevent the first (second) reaction gas from flowing around the space below the turntable 2 to be mixed with the second (first) reaction gas.

Figure 7:
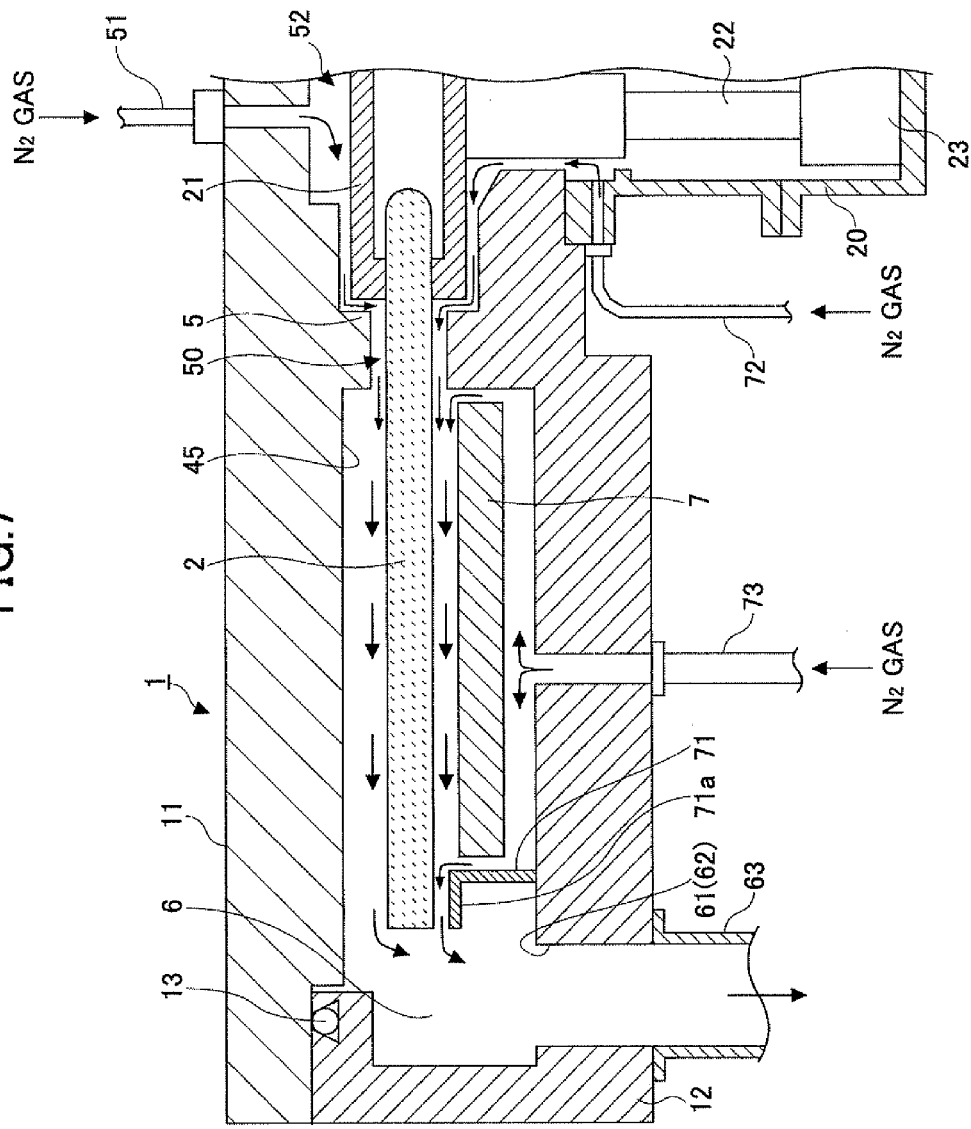
FIG. 7 is a partial cross-sectional view of the film deposition apparatus of FIG. 1.

Referring to FIG. 7, a separation gas supplying pipe 51 is connected to the top center portion of the ceiling plate 11 of the chamber 1, so that $N_2$ gas is supplied as a separation gas to a space 52 between the ceiling plate 11 and the core portion 21. The separation gas supplied to the space 52 flows through the thin gap 50 between the protrusion portion 5 and the turntable 2 and then along the top surface of the turntable 2, and reaches the evacuation area 6. Because the space 52 and the gap 50 are filled with the $N_2$ gas, the reaction gases (BTBAS, $O_3$) cannot be mixed through the center portion of the turntable 2. In other words, the film deposition apparatus according to this embodiment is provided with a center area C that is defined by the center portion of the turntable 2 and the chamber 1 in order to isolate the first process area P1 and the second process area P2 and is configured to have an ejection opening that ejects the separation gas toward the top surface of the turntable 2. The ejection opening corresponds to the gap 50 between the protrusion portion 5 and the turntable 2, in the illustrated example.

Figure 8:
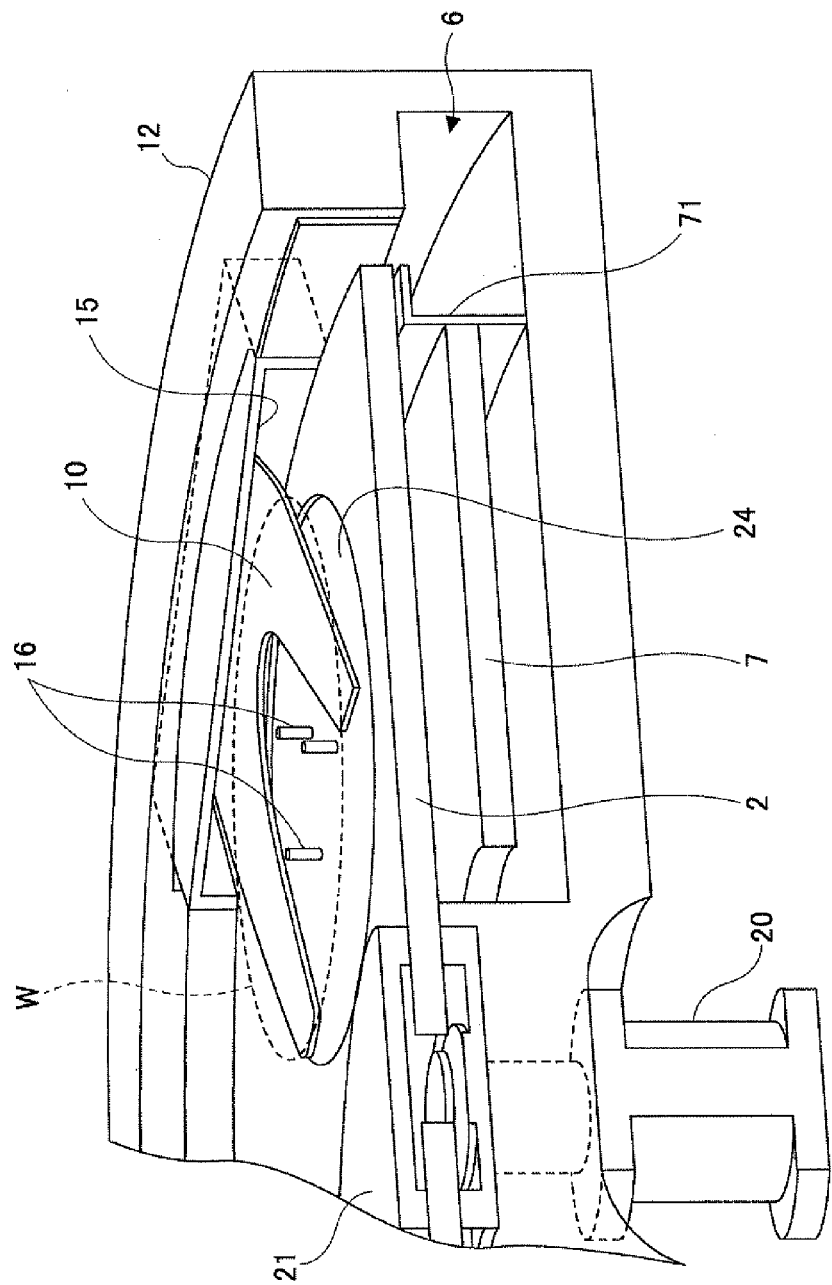
FIG. 8 is a fragmentary perspective view of the film deposition apparatus of FIG. 1.

In addition, a transfer opening 15 is formed in a side wall of the chamber body 12 as shown in FIGS. 2, 3 and 8. Through the transfer opening 15, the wafer W is transferred into or out from the chamber 1 by a transfer arm 10 (FIGS. 3 and 8). The transfer opening 15 is provided with a gate valve (not shown) by which the transfer opening 15 is opened or closed. When the concave portion 24 of the turntable 2 is in alignment with the transfer opening 15 and the gate valve is opened, the wafer W is transferred into the chamber 1 and placed in the concave portion 24 as a wafer receiving portion of the turntable 2 from the transfer arm 10. In order to lower/raise the wafer W into/from the concave portion 24, there are provided elevation pins 16 that are raised or lowered through corresponding through holes formed in the concave portion 24 of the turntable 2 by an elevation mechanism (not shown).

In addition, the film deposition apparatus according to this embodiment is provided with a control portion 100 that controls total operations of the deposition apparatus. The control portion 100 includes a process controller 100a formed of, for example, a computer, a user interface portion 100b, and a memory device 100c. The user interface portion 100b has a display that shows operations of the film deposition apparatus, and an input/output (I/O) device including a key board and a touch panel that allows an operator of the film deposition apparatus to select a process recipe and an administrator of the film deposition apparatus to change parameters in the process recipe.

The memory device 100c stores a control program and a process recipe that cause the controlling portion 100 to carry out various operations of the deposition apparatus, and various parameters in the process recipe. These programs have groups of steps for carrying out the operations described later, for example. These programs are installed into and run by the process controller 100a by instructions from the user interface portion 100b. In addition, the programs are stored in a computer readable storage medium 100d and installed into the memory device 100c from the storage medium 100d. The computer readable storage medium 100d may be a hard disk, a compact disc, a magneto optical disk, a memory card, a floppy disk, or the like. Moreover, the programs may be downloaded to the memory device 100c through a communications network.

Next, operations of the film deposition apparatus according to this embodiment of the present invention are described.

First, the turntable 2 is rotated so that the concave portion 24 is in alignment with the transfer opening 15, and the gate valve (not shown) is open. Second, the wafer W is brought into the chamber 1 through the transfer opening 15 by the transfer arm 10. The wafer W is received by the elevation pins 16 and lowered to the concave portion 24 by the elevation pins 16 driven by the elevation mechanism (not shown) after the transfer arm 10 is pulled away from the chamber 1. Then, the series of operations above are repeated five times, and thus five wafers W are loaded on the turntable 2. Next, the vacuum pump 64 (FIG. 1) is activated in order to maintain the chamber 1 at a predetermined reduced pressure. The turntable 2 starts rotating clockwise when seen from above. The turntable 2 is heated to a predetermined temperature (e.g., 300° C.) in advance by the heater unit 7, which in turn heats the wafers W on the turntable 2. After the wafers W are heated and maintained at the predetermined temperature, which may be confirmed by a temperature sensor (not shown), the first reaction gas (BTBAS) is supplied to the first process area P1 through the first reaction gas nozzle 31, and the second reaction gas ($O_3$) is supplied to the second process area P2 through the second reaction gas nozzle 32. In addition, the separation gases ($N_2$) are supplied to the separation areas D through the separation nozzles 41, 42.

When the wafer W passes through the first process area P1 below the first reaction gas nozzle 31, BTBAS molecules are adsorbed on the surface of the wafer W, and when the wafer W pass through the second process area P2 below the second reaction gas nozzle 32, $O_3$ molecules are adsorbed on the surface of the wafer W, so that the BTBAS molecules are oxidized by the $O_3$ molecules. Therefore, when the wafer W passes through both areas P1, P2 with one rotation of the turntable 2, one molecular layer of silicon dioxide is formed on the surface of the wafer W. Then, the wafer W alternates passing through areas P1, P2 plural times, and a silicon dioxide layer having a predetermined thickness is formed on the surfaces of the wafers W. After the silicon dioxide film having the predetermined thickness is deposited, the BTBAS gas and the $O_3$ gas are stopped, and the rotation of the turntable 2 is stopped. Then, the wafer W is taken out from the chamber 1 in a manner opposite to when the wafer W is transferred into the chamber 1.

In addition, during the deposition operations above, the $N_2$ gas as the separation gas is supplied from the separation gas supplying pipe 51, and is ejected toward the top surface of the turntable 2 from the center area C, that is, the gap 50 between the protrusion portion 5 and the turntable 2. In this embodiment, a space below the second ceiling surface 45, where the reaction gas nozzle 31 (32) is arranged, has a lower pressure than the center area C and the thin space between the first ceiling surface 44 and turntable 2. This is because the evacuation area 6 is provided adjacent to the space below the ceiling surface 45 (see FIGS. 1 and 3) and the space is directly evacuated through the evacuation area 6. Additionally, it is partly because the thin space is provided so that the height h can maintain the pressure difference between the thin space and the place where the reaction gas nozzle 31 (32) or the first (the second) process area P1 (P2) is located.

Figure 9:
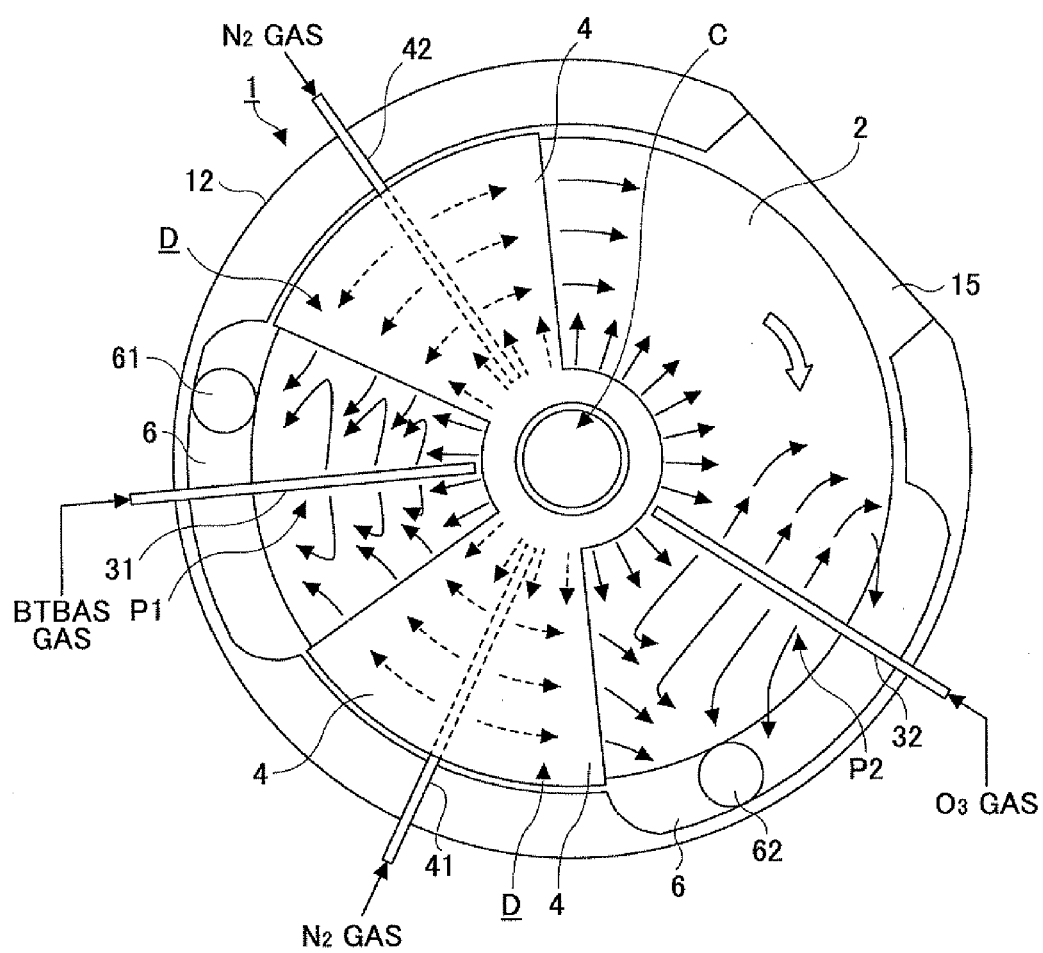
FIG. 9 shows flow patterns of the gases supplied to a chamber of the film deposition apparatus of FIG. 1.

Next, the flow patterns of the gases supplied into the chamber 1 from the gas nozzles 31, 32, 41, 42 are described in reference to FIG. 9, which schematically shows the flow patterns. As shown, part of the $O_3$ gas ejected from the second reaction gas nozzle 32 hits and flows along the top surface of the turntable 2 (and the surface of the wafer W) in a direction opposite to the rotation direction of the turntable 2. Then, the $O_3$ gas is pushed back by the $N_2$ gas flowing along the rotation direction, and changes the flow direction toward the edge of the turntable 2 and the inner circumferential wall of the chamber body 12. Finally, this part of the $O_3$ gas flows into the evacuation area 6 and is evacuated from the chamber 1 through the evacuation port 62.

Another part of the $O_3$ gas ejected from the second reaction gas nozzle 32 hits and flows along the top surface of the turntable 2 (and the surface of the wafers W) in the same direction as the rotation direction of the turntable 2. This part of the $O_3$ gas mainly flows toward the evacuation area 6 due to the $N_2$ gas flowing from the center portion C and suction force through the evacuation port 62. On the other hand, a small portion of this part of the $O_3$ gas flows toward the separation area D located downstream of the rotation direction of the turntable 2 in relation to the second reaction gas nozzle 32 and may enter the gap between the ceiling surface 44 and the turntable 2. However, because the height h of the gap is designed so that the $O_3$ gas is impeded from flowing into the gap at film deposition conditions intended, the small portion of the $O_3$ gas cannot flow into the gap. Even when a small fraction of the $O_3$ gas flows into the gap, the fraction of the $O_3$ gas cannot flow farther into the separation area D, because the fraction of the $O_3$ gas can be pushed backward by the $N_2$ gas ejected from the separation gas nozzle 41. Therefore, substantially all the part of the $O_3$ gas flowing along the top surface of the turntable 2 in the rotation direction flows into the evacuation area 6 and is evacuated by the evacuation port 62, as shown in FIG. 9.

Similarly, part of the BTBAS gas ejected from the first reaction gas nozzle 31 to flow along the top surface of the turntable 2 (and the surface of the wafers W) in a direction opposite to the rotation direction of the turntable 2 is prevented from flowing into the gap between the turntable 2 and the ceiling surface 44 of the convex portion 4 located upstream relative to the rotation direction of the turntable 2 in relation to the first reaction gas supplying nozzle 31. Even if only a fraction of the BTBAS gas flows into the gap, this BTBAS gas is pushed backward by the $N_2$ gas ejected from the separation gas nozzle 41 in the separation area D. The BTBAS gas pushed backward flows toward the outer circumferential edge of the turntable 2 and the inner circumferential wall of the chamber body 12, along with the $N_2$ gases from the separation gas nozzle 41 and the center portion C, and then is evacuated by the evacuation port 61 through the evacuation area 6.

Another part of the BTBAS gas ejected from the first reaction gas nozzle 31 to flow along the top surface of the turntable 2 (and the surface of the wafers W) in the same direction as the rotation direction of the turntable 2 cannot flow into the gap between the turntable 2 and the ceiling surface 44 of the convex portion 4 located downstream relative to the rotation direction of the turntable 2 in relation to the first reaction gas supplying nozzle 31. Even if a fraction of this part of the BTBAS gas flows into the gap, this BTBAS gas is pushed backward by the $N_2$ gases ejected from the center portion C and the separation gas nozzle 42 in the separation area D. The BTBAS gas pushed backward flows toward the evacuation area 6, along with the $N_2$ gases from the separation gas nozzle 41 and the center portion C, and then is evacuated by the evacuation port 61.

As stated above, the separation areas D may prevent the BTBAS gas and the $O_3$ gas from flowing thereinto, or may greatly reduce the amount of the BTBAS gas and the $O_3$ gas flowing thereinto, or may push the BTBAS gas and the $O_3$ gas backward. The BTBAS molecules and the $O_3$ molecules adsorbed on the wafer W are allowed to go through the separation area D, contributing to the film deposition.

Additionally, the BTBAS gas in the first process area P1 (the $O_3$ gas in the second process area P2) is prevented from flowing into the center area C, because the separation gas is ejected toward the outer circumferential edge of the turntable 2 from the center area C, as shown in FIGS. 7 and 9. Even if a fraction of the BTBAS gas in the first process area P1 (the $O_3$ gas in the second process area P2) flows into the center area C, the BTBAS gas (the $O_3$ gas) is pushed backward, so that the BTBAS gas in the first process area P1 (the $O_3$ gas in the second process area 22) is prevented from flowing into the second process area P2 (the first process area P1) through the center area C.

Moreover, the BTBAS gas in the first process area P1 (the $O_3$ gas in the second process area P2) is prevented from flowing into the second process area P2 (the first process area P1) through the space between the turntable 2 and the inner circumferential wall of the chamber body 12. This is because the bent portion 46 is formed downward from the convex portion 4 so that the gaps between the bent portion 46 and the turntable 2 and between the bent portion 46 and the inner circumferential wall of the chamber body 12 are as small as the height h of the ceiling surface 44 of the convex portion 4, the height being measured from the turntable 2, thereby substantially avoiding pressure communication between the two process areas, as stated above. Therefore, the BTBAS gas is evacuated from the evacuation port 61, and the $O_3$ gas is evacuated from the evacuation port 62, and thus the two reaction gases are not mixed. In addition, the space below the turntable 2 is purged by the $N_2$ gas supplied from the purge gas supplying pipes 72, 73. Therefore, the BTBAS gas cannot flow through below the turntable 2 into the second process area P2.

An example of process parameters preferable in the film deposition apparatus according to this embodiment is listed below.

rotational speed of the turntable 2: 1-500 rpm (in the case of the wafer W having a diameter of 300 mm)
pressure in the chamber 1: 1067 Pa (8 Torr)
wafer temperature: 350° C.
flow rate of BTBAS gas: 100 sccm
flow rate of $O_3$ gas: 10000 sccm
flow rate of $N_2$ gas from the separation gas nozzles 41, 42: 20000 sccm
flow rate of $N_2$ gas from the separation gas supplying pipe 51: 5000 sccm
the number of rotations of the turntable 2: 600 rotations (depending on the film thickness required)

According to the film deposition apparatus of this embodiment, because the film deposition apparatus has the separation areas D including the low ceiling surface 44 between the first process area P1, to which the BTBAS gas is supplied from the first reaction gas nozzle 31, and the second process area P2, to which the $O_3$ gas is supplied from the second reaction gas nozzle 32, the BTBAS gas (the $O_3$ gas) is prevented from flowing into the second process area P2 (the first process area P1) and being mixed with the $O_3$ gas (the BTBAS gas). Therefore, an MLD (or ALD) mode deposition of silicon dioxide is assuredly performed by rotating the turntable 2 on which the wafers W are placed in order to allow the wafers W to pass through the first process area P1, the separation area D, the second process area P2, and the separation area D. In addition, the separation areas D further include the separation gas nozzles 41, 42 from which the $N_2$ gases are ejected in order to further assuredly prevent the BTBAS gas (the $O_3$ gas) from flowing into the second process area P2 (the first process area P1) and being mixed with the $O_3$ gas (the BTBAS gas). Moreover, because the chamber 1 of the film deposition apparatus according to this embodiment has the center area C having the ejection holes from which the $N_2$ gas is ejected, the BTBAS gas (the $O_3$ gas) is prevented from flowing into the second process area P2 (the first process area P1) through the center area C and being mixed with the $O_3$ gas (the BTBAS gas). Furthermore, because the BTBAS gas and the $O_3$ gas are not mixed, almost no deposits of silicon dioxide are made on the turntable 2, thereby reducing particle problems.

By the way, although the turntable 2 has the five concave portions 24 and five wafers W placed in the corresponding concave portions 24 can be processed in one run in this embodiment, only one wafer W is placed in one of the five concave portions 24, or the turntable 2 may have only one concave portion 24.

The reaction gases that may be used in the film deposition apparatus according to an embodiment of the present invention are dichlorosilane (DCS), hexachlorodisilane (HOD), Trimethyl Aluminum (TMA), tetrakis-ethyl-methyl-amino-zirconium (TEMAZr), tris(dimethyl amino)silane (3DMAS), tetrakis-ethyl-methyl-amino-hafnium (TEMHf), bis(tetra methyl heptandionate)strontium $(Sr(THD)_2)$, (methyl-penta-dionate)(bis-tetra-methyl-heptandionate)titanium (Ti(MPD)(THD)), monoamino-silane, or the like.

Because a larger centrifugal force is applied to the gases in the chamber 1 at a position closer to the outer circumference of the turntable 2, the BTBAS gas, for example, flows toward the separation area D at a higher speed in the position closer to the outer circumference of the turntable 2. Therefore, the BTBAS gas is more likely to enter the gap between the ceiling surface 44 and the turntable 2 in the position closer to the circumference of the turntable 2. Because of this situation, when the convex portion 4 has a greater width (a longer arc) toward the circumference, the BTBAS gas cannot flow farther into the gap in order to be mixed with the $O_3$ gas. In view of this, it is preferable for the convex portion 4 to have a sector-shaped top view, as explained in the above embodiment.

Figure 10A:
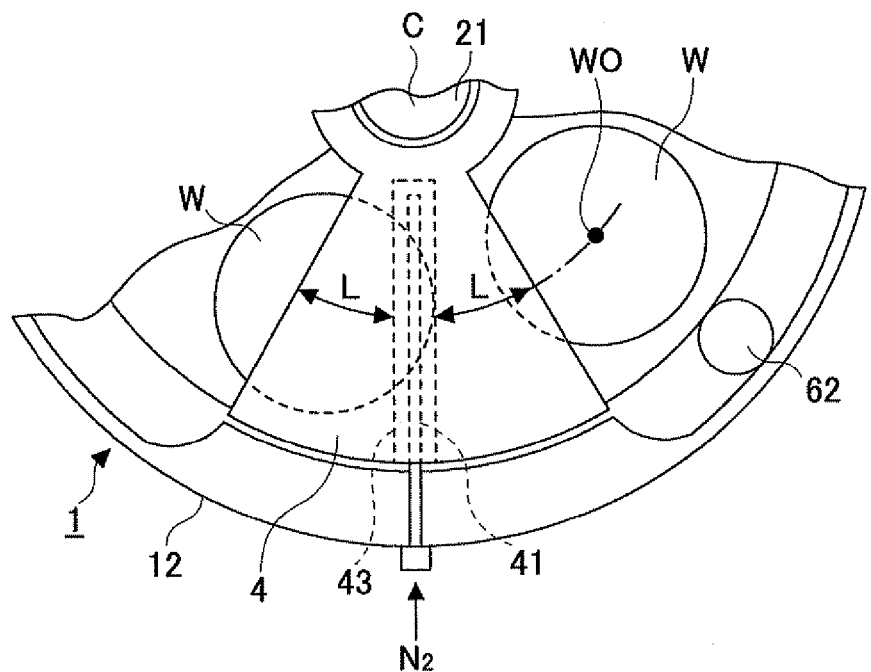
FIG. 10A is a partial plan view for explaining a size of a ceiling surface (or a convex portion) of the film deposition apparatus of FIG. 1.
Figure 10B:
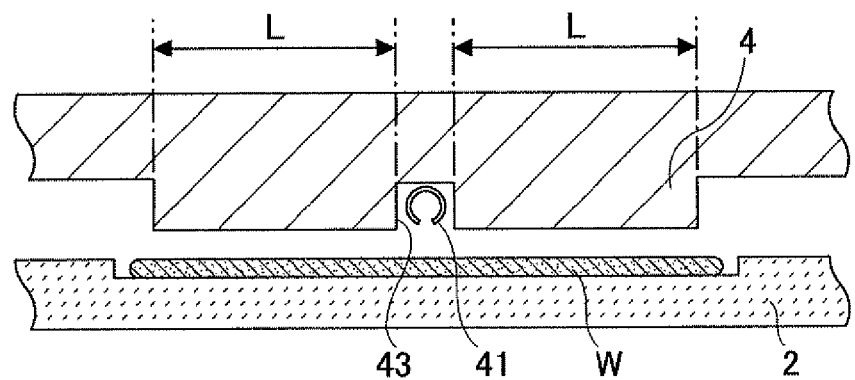
FIG. 10B is a partial side view for explaining a size of a ceiling surface (or a convex portion) of the film deposition apparatus of FIG. 1.

The size of the convex portion 4 for the ceiling surface 44) is exemplified again below. Referring to FIGS. 10A and 10B, the ceiling surface 44 that creates the thin space in both sides of the separation gas nozzle 41 (42) may preferably have a length L ranging from about one-tenth of a diameter of the wafer W through about a diameter of the wafer W, preferably, about one-sixth or more of the diameter of the wafer W along an arc that corresponds to a route through which a wafer center WO passes. Specifically, the length L is preferably about 50 mm or more when the wafer W has a diameter of 300 mm. When the length L is small, the height h of the thin space between the ceiling surface 44 and the turntable 2 (wafer W) has to be accordingly small in order to effectively prevent the reaction gases from flowing into the thin space. However, when the length L becomes too small and thus the height h has to be extremely small, the turntable 2 may hit the ceiling surface 44, which may cause wafer breakage and wafer contamination through particle generation. Therefore, measures to damp vibration of the turntable 2 or measures to stably rotate the turntable 2 are required in order to avoid the turntable 2 hitting the ceiling surface 44. On the other hand, when the height h of the thin space is kept relatively greater while the length L is small, a rotation speed of the turntable 2 has to be lower in order to avoid the reaction gases flowing into the thin gap between the ceiling surface 44 and the turntable 2, which is rather disadvantageous in terms of production throughput. From these considerations, the length L of the ceiling surface 44 along the arc corresponding to the route of the wafer center WO is preferably about 50 mm or more when the wafers W having a diameter of 300 mm are processed, as stated above. However, the size of the convex portion 4 or the ceiling surface 44 is not limited to the above size, but may be adjusted depending on the process parameters and the size of the wafer to be used. In addition, as clearly understood from the above explanation, the height h of the thin space may be adjusted depending on an area of the ceiling surface 44 in addition to the process parameters and the size of the wafer to be used, as long as the thin space has a height that allows the separation gas to flow from the separation area D through the process area P1 (P2).

Figure 11:
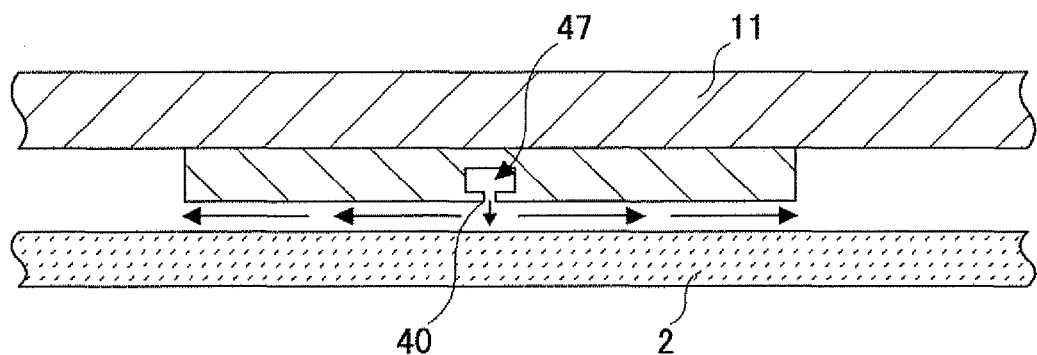
FIG. 11 is a partial cross sectional view of a modification example of a convex portion in the film deposition apparatus of FIG. 1.

The separation gas nozzle 41 (42) is located in the groove portion 43 formed in the convex portion 4 and the lower ceiling surfaces 44 are located in both sides of the separation gas nozzle 41 (42) in the above embodiment. However, as shown in FIG. 11, a conduit 47 extending along the radial direction of the turntable 2 may be made inside the convex portion 4, instead of the separation gas nozzle (42), and plural holes 40 may be formed along the longitudinal direction of the conduit 47 so that the separation gas ($N_2$ gas) may be ejected from the plural holes 40 in other embodiments.

Figure 12A:
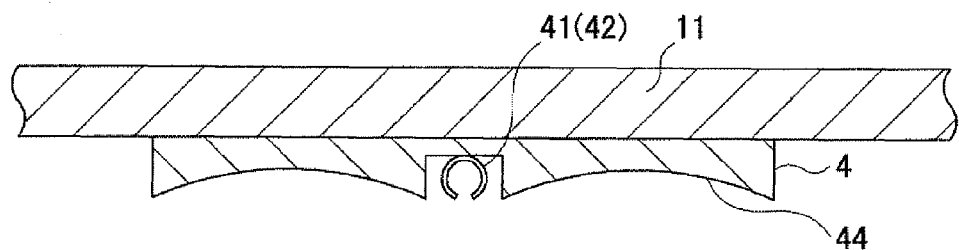
FIGS. 12A through 12C are modification examples of a convex portion of the film deposition apparatus of FIG. 1.
Figure 12B:
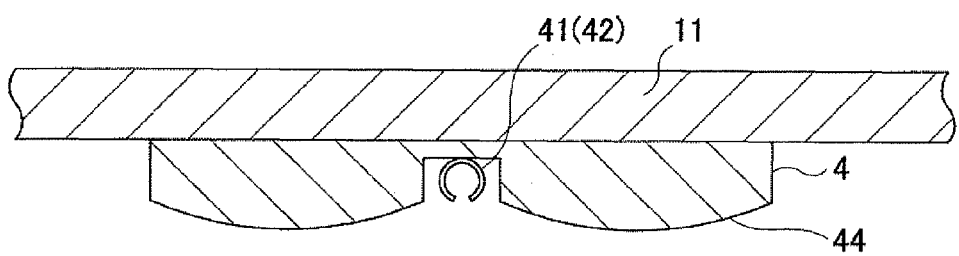
Figure 12C:
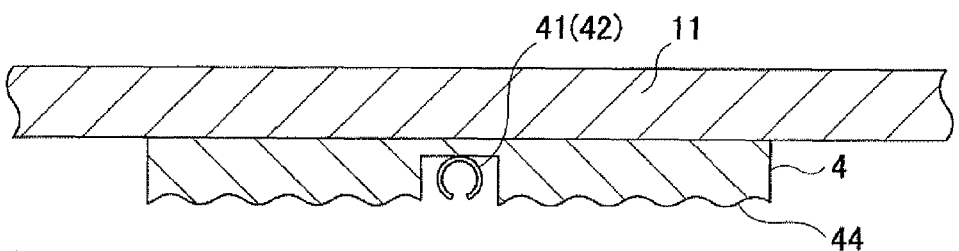

The ceiling surface 44 of the separation area D is not necessarily flat in other embodiments. For example, the ceiling surface 44 may be concavely curved as shown in FIG. 12A, convexly curved as shown in FIG. 12B, or corrugated as shown in FIG. 12C.

In addition, the convex portion 4 may be hollow and the separation gas may be introduced into the hollow convex portion 4. In this case, the plural gas ejection holes 33 may be arranged as shown in FIGS. 13A, 13B, 13C.

Figure 13A:
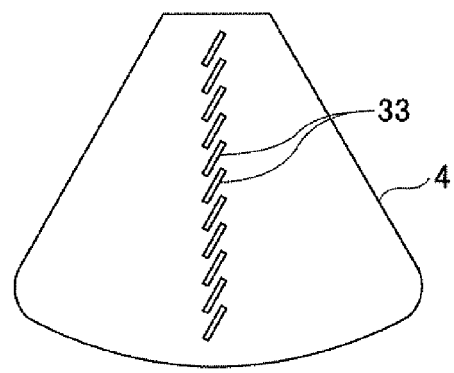
FIGS. 13A through 13C are modification examples of ejection hole arrangement in the film deposition apparatus of FIG. 1.
Figure 13B:
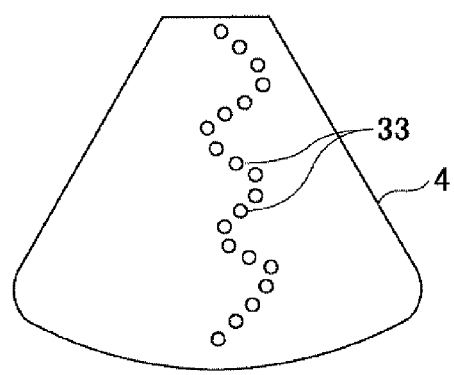
Figure 13C:
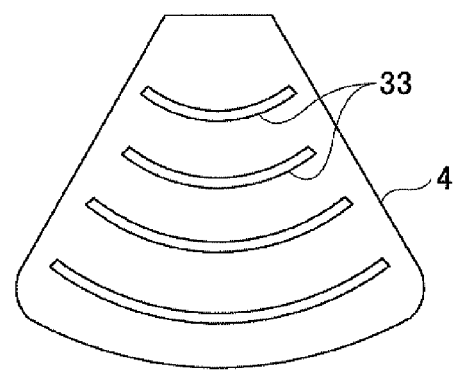

Referring to FIG. 13A, the plural gas ejection holes 33 each have a shape of a slanted slit. These slanted slits (gas ejection holes 33) are arranged to be partially overlapped with an adjacent slit along the radial direction of the turntable 2. In FIG. 13B, the plural gas ejection holes 33 are circular. These circular holes (gas ejection holes 33) are arranged along a winding line that extends in the radial direction as a whole. In FIG. 13C, each of the plural gas ejection holes 33 has the shape of an arc-shaped slit. These arc-shaped slits (gas ejection holes 33) are arranged at predetermined intervals in the radial direction.

Figure 13D:
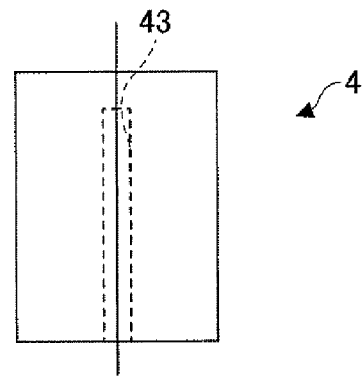
FIGS. 13D through 13G are other modification examples of the convex portion of the film deposition apparatus of FIG. 1.
Figure 13E:
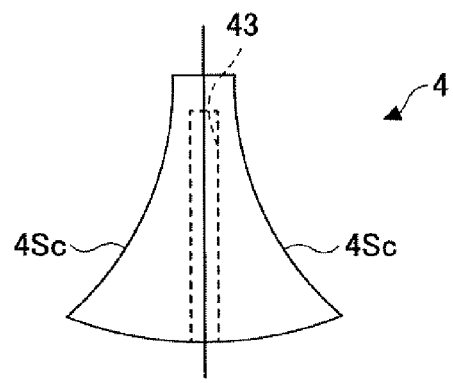
Figure 13F:
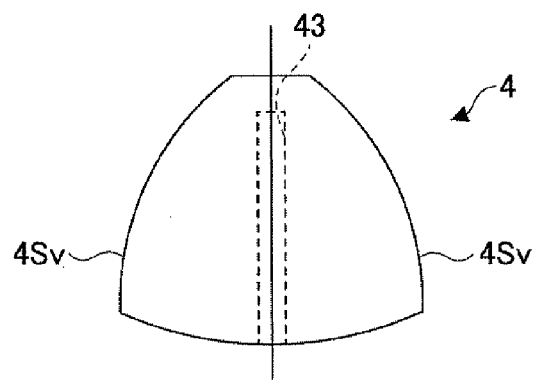
Figure 13G:
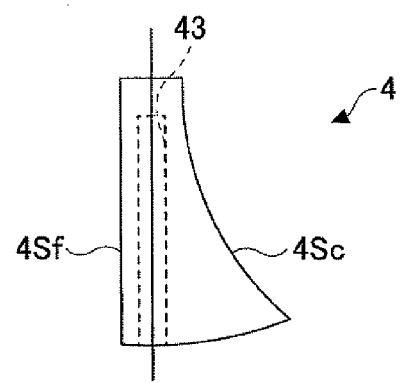

While the convex portion 4 has the sector-shaped top view shape in this embodiment, the convex portion 4 may have a rectangle top view shape as shown in FIG. 13D, or a square top view shape in other embodiments. Alternatively, the convex portion 4 may be sector-shaped as a whole in the top view and have concavely curved side surfaces 4Sc, as shown in FIG. 13E. In addition, the convex portion 4 may be sector-shaped as a whole in the top view and have convexly curved side surfaces 4Sv, as shown in FIG. 13F. Moreover, an upstream portion of the convex portion 4 relative to the rotation direction of the turntable 2 (FIG. 1) may have a concavely curved side surface 4Sc and a downstream portion of the convex portion 4 relative to the rotation direction of the turntable 2 (FIG. 1) may have a flat side surface 4Sf, as shown in FIG. 13G. By the way, dotted lines in FIGS. 13D through 13G represent the groove portions 43. In these cases, the separation gas nozzle 41 (42), which is housed in the groove portion 43, extends from the center portion of the chamber 1, for example, from the protrusion portion 5.

The heater unit 7 for heating the wafers W is configured to have a lamp heating element instead of the resistance heating element. In addition, the heater unit 7 may be located above the turntable 2, or above and below the turntable 2.

Figure 14:
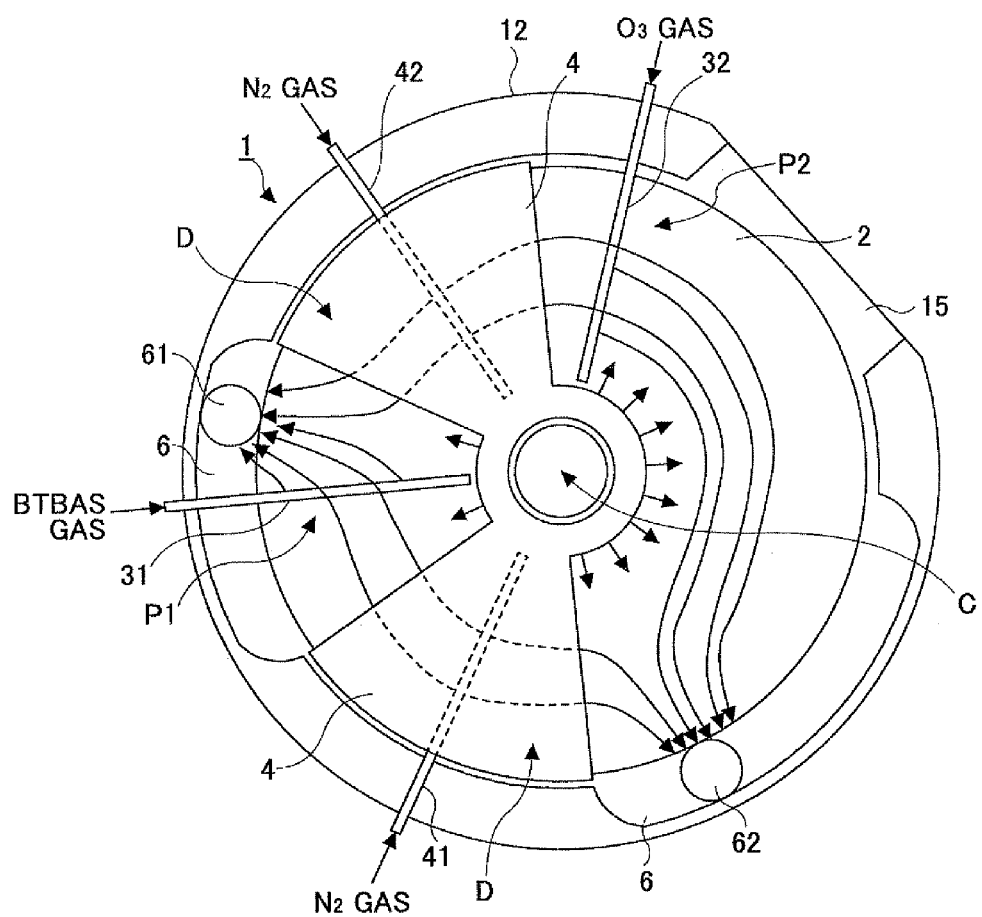
FIG. 14 is a plan view of another configuration of gas supplying nozzles.

The process areas P1, P2 and the separation area D may be arranged in other embodiments, as shown in FIG. 14. Referring to FIG. 14, the second reaction gas nozzle 32 for supplying the second reaction gas (e.g., $O_3$ gas) is located at upstream of the rotation direction relative to the transfer opening 15, or between the separation gas nozzle 42 and the transfer opening 15. Even in such an arrangement, the gases ejected from the nozzle 31, 32, 41, 42 and the center area C flow generally along arrows shown in FIG. 14, so that the first reaction gas and the second reaction gas cannot be mixed. Therefore, a proper ALD (or MLD) mode film deposition can be realized by such an arrangement.

Figure 15:
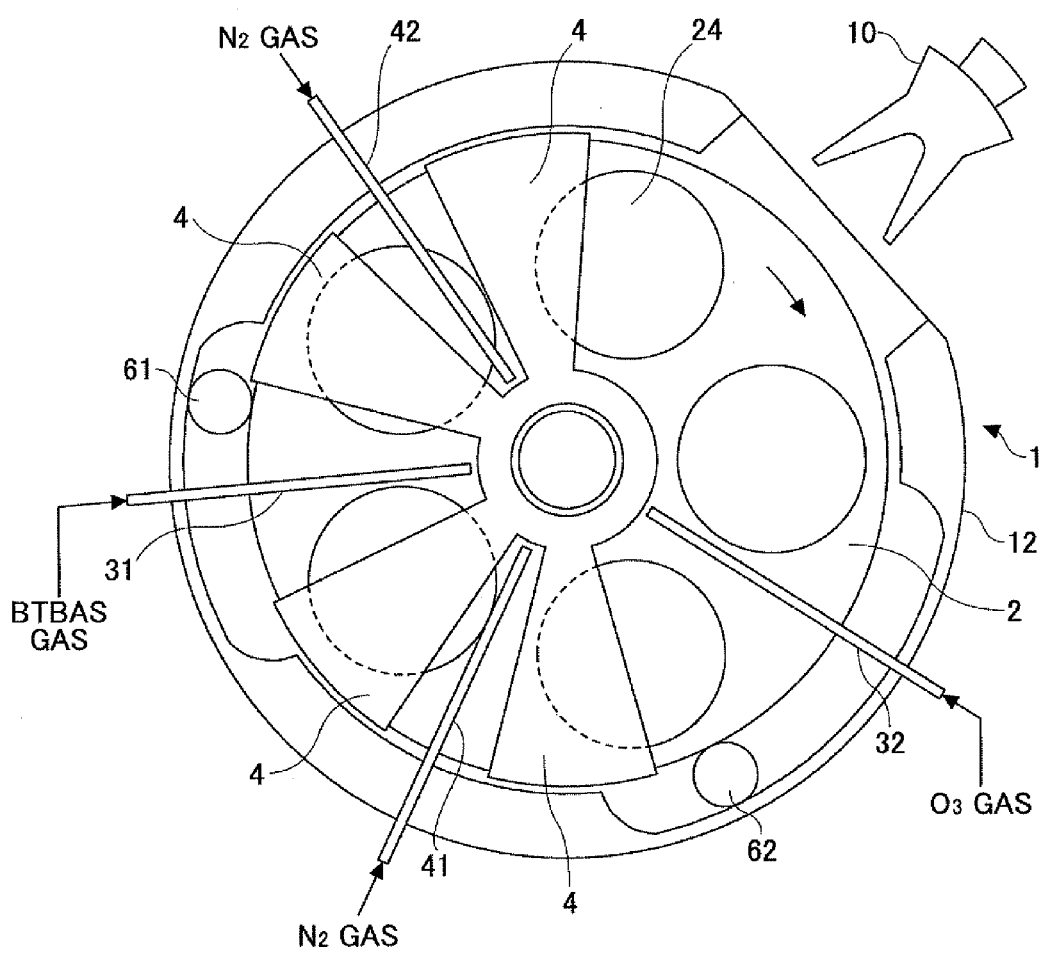
FIG. 15 is a plan view of a modification example of the convex portion of the film deposition apparatus of FIG. 1.

In addition, the separation area D may be configured by attaching two sector-shaped plates on the bottom surface of the ceiling plate 1 by screws so that the two sector-shaped plates are located on both sides of the separation gas nozzle 41 (42), as stated above. FIG. 15 is a plan view of such a configuration. In this case, the distance between the convex portion 4 and the separation gas nozzle 41 (42), and the size of the convex portion 4 can be determined taking into consideration ejection rates of the separation gas and the reaction gas in order to effectively demonstrate the separation function of the separation area D.

Figure 16:
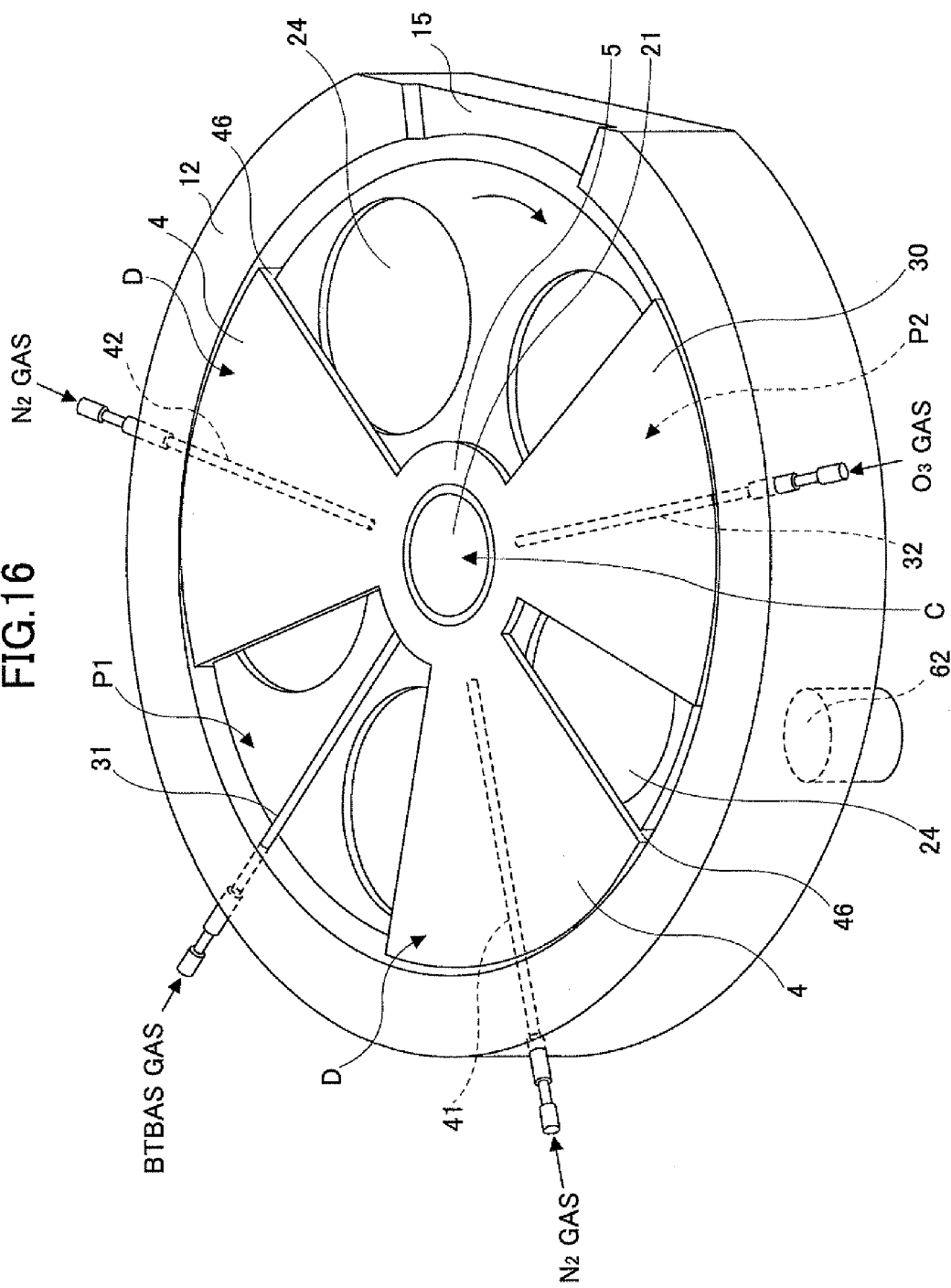
FIG. 16 is a perspective view of another modification example of a convex portion of the film deposition apparatus of FIG. 1.

In the above embodiment, the first process area P1 and the second process area P2 correspond to the areas having the ceiling surface 45 higher than the ceiling surface 44 of the separation area D. However, at least one of the first process area 21 and the second process area P2 may have another ceiling surface that opposes the turntable 2 in both sides of the reaction gas supplying nozzle 31 (32) and is lower than the ceiling surface 45 in order to prevent gas from flowing into a gap between the ceiling surface concerned and the turntable 2. This ceiling surface, which is lower than the ceiling surface 45, may be as low as the ceiling surface 44 of the separation area D. FIG. 16 shows an example of such a configuration. As shown, a sector-shaped convex portion 30 is located in the second process area P2, where $O_3$ gas is adsorbed on the wafer W, and the reaction gas nozzle 32 is located in the groove portion (not shown) formed in the convex portion 30. In other words, this second process area P2 shown in FIG. 16 is configured in the same manner as the separation area D, while the gas nozzle is used in order to supply the reaction gas. In addition, the convex portion 30 may be configured as a hollow convex portion, example of which is illustrated in FIGS. 13A through 13C.

Figure 17:
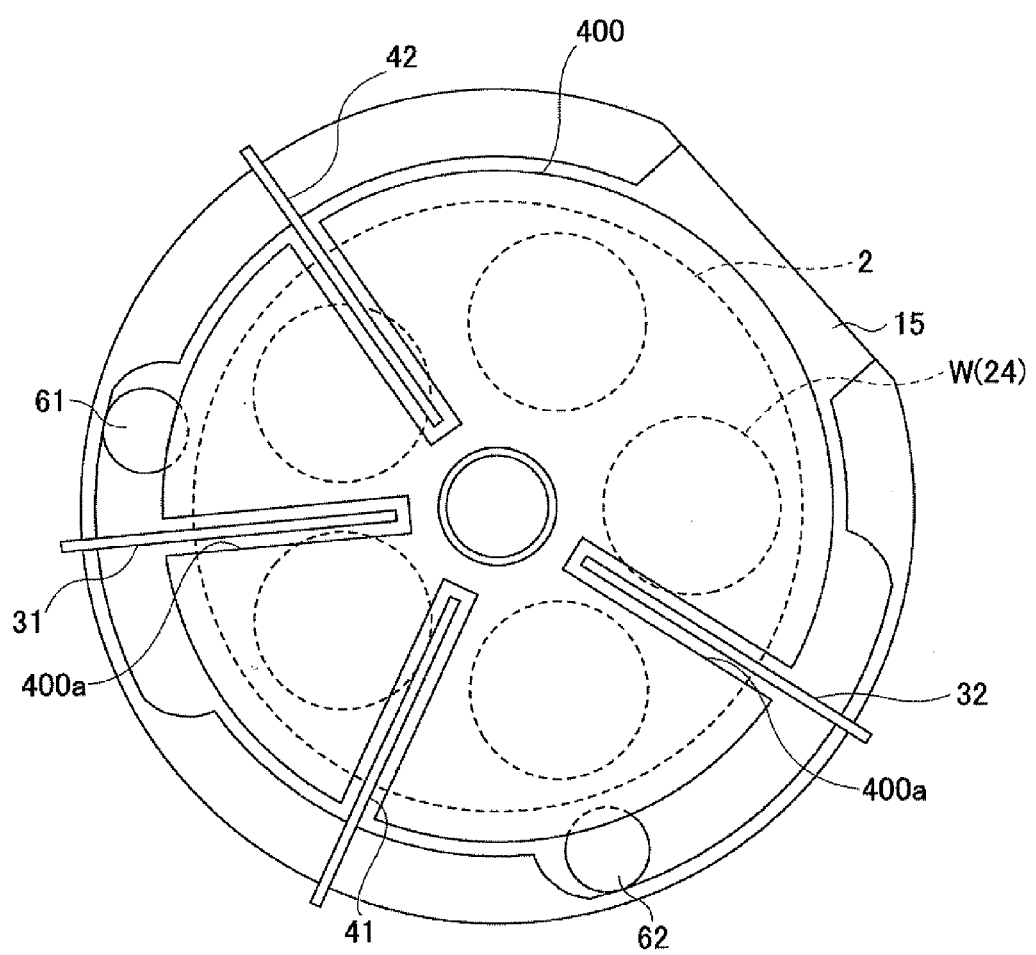
FIG. 17 is a plan view of another modification example of a convex portion of the film deposition apparatus of FIG. 1.

Moreover, the ceiling surface, which is lower than the ceiling surface 45 and as low as the ceiling surface 44 of the separation area D, may be provided for both reaction gas nozzles 31, 32 and extended to reach the ceiling surfaces 44 in other embodiments, as shown in FIG. 17, as long as the low ceiling surfaces 44 are provided on both sides of the reaction gas nozzle 41 (42). In other words, another convex portion 400 may be attached on the bottom surface of the ceiling plate 11, instead of the convex portion 4. The convex portion 400 has a shape of substantially circular plate, opposes substantially the entire top surface of the turntable 2, has four slots 400a where the corresponding gas nozzles 31, 32, 41, 42 are housed, the slots 400a extending in a radial direction, and leaves a thin space below the convex portion 400 in relation to the turntable 2. A height of the thin space may be comparable with the height h stated above. When the convex portion 400 is employed, the reaction gas ejected from the reaction gas nozzle 31 (32) diffuses to both sides of the reaction gas nozzle 31 (32) below the convex portion 400 (or in the thin space) and the separation gas ejected from the separation gas nozzle 41 (42) diffuses to both sides of the separation gas nozzle 41 (42). The reaction gas and the separation gas flow into each other in the thin space and are evacuated through the evacuation port 61 (62). Even in this case, the reaction gas ejected from the reaction gas nozzle 31 cannot be mixed with the other reaction gas ejected from the reaction gas nozzle 32, thereby realizing a proper ALD (or MLD) mode film deposition.

By the way, the convex portion 400 may be configured by combining the hollow convex portions 4 shown in any of FIGS. 13A through 13C in order to eject the reaction gases and the separation gases from the corresponding ejection holes 33 in the corresponding hollow convex portions 4 without using the gas nozzles 31, 32, 41, 42 and the slits 400a.

Figure 18:
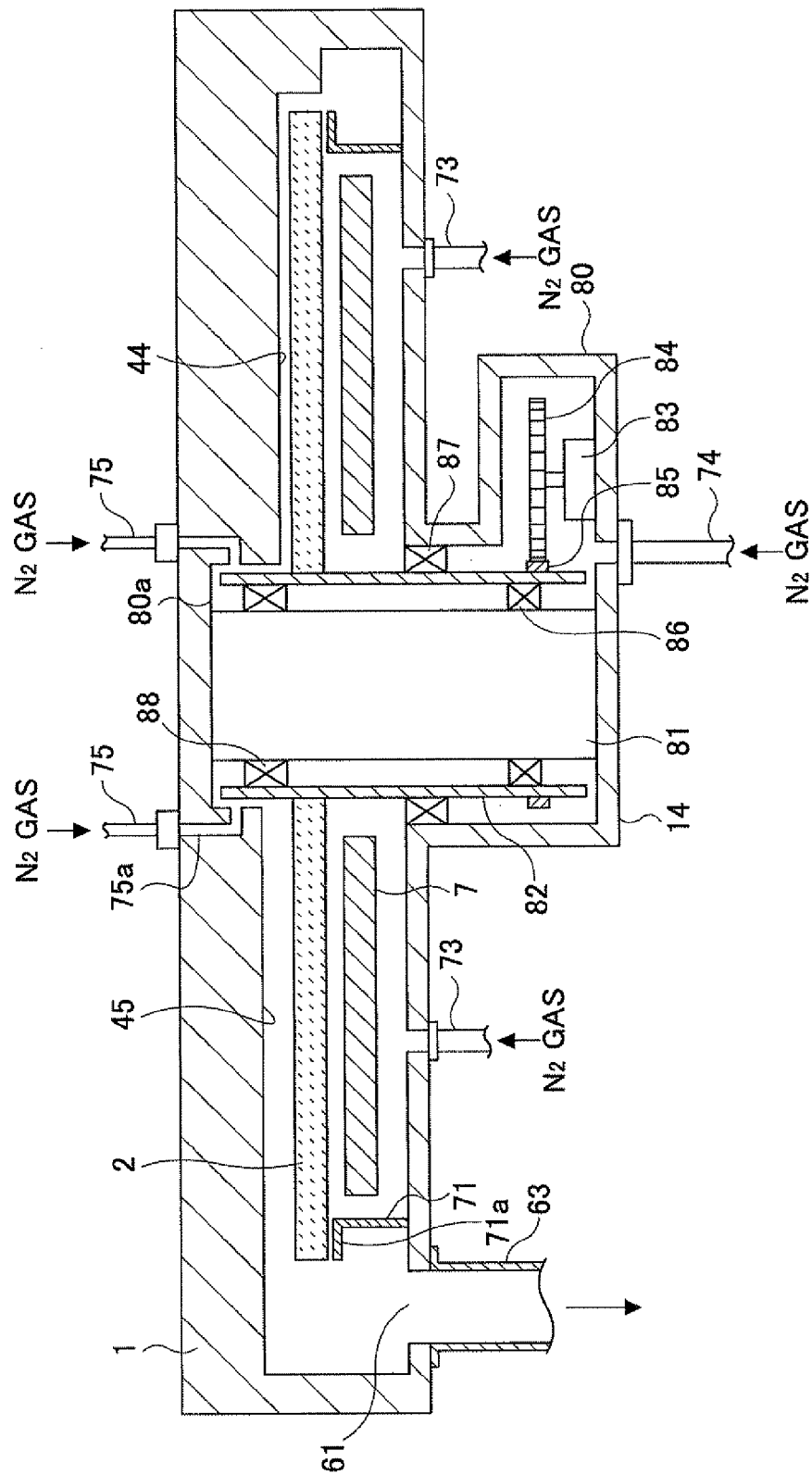
FIG. 18 is a cut-away diagram of a film deposition apparatus according to another embodiment of the present invention.

In the above embodiments, the rotational shaft 22 for rotating the turntable 2 is located in the center portion of the chamber 1. In addition, the space 52 between the core portion 21 and the ceiling plate 11 is purged with the separation gas in order to prevent the reaction gases from being mixed through the center portion. However, the chamber 1 may be configured as shown in FIG. 18 in other embodiments. Referring to FIG. 18, the bottom portion 14 of the chamber body 12 has a center opening to which a housing case 80 is hermetically attached. Additionally, the ceiling plate 11 has a center concave portion 80a. A pillar 81 is placed on the bottom surface of the housing case 80, and a top end portion of the pillar 81 reaches a bottom surface of the center concave portion 80a. The pillar 81 can prevent the first reaction gas (BTBAS) ejected from the first reaction gas nozzle 31 and the second reaction gas ($O_3$) ejected from the second reaction gas nozzle 32 from being mixed through the center portion of the chamber 1.

In addition, a rotation sleeve 82 is provided so that the rotation sleeve 82 coaxially surrounds the pillar 81. The rotation sleeve 82 is supported by bearings 86, 88 attached on an outer surface of the pillar 81 and a bearing 87 attached on an inner side wall of the housing case 80. Moreover, the rotation sleeve 82 has a gear portion 85 formed or attached on an outer surface of the rotation sleeve 82. Furthermore, an inner circumference of the ring-shaped turntable 2 is attached on the outer surface of the rotation sleeve 82. A driving portion 83 is housed in the housing case 80 and has a gear 84 attached to a shaft extending from the driving portion 83. The gear 84 is meshed with the gear portion 85. With such a configuration, the rotation sleeve 82 and thus the turntable 2 are rotated by a driving portion 83.

A purge gas supplying pipe 74 is connected to an opening formed in a bottom of the housing case 80, so that a purge gas is supplied into the housing case 80. With this, an inner space of the housing case 80 may be kept at a higher pressure than an inner space of the chamber 1, in order to prevent the reaction gases from flowing into the housing case 80. Therefore, no film deposition takes place in the housing case 80, thereby reducing maintenance frequencies. In addition, purge gas supplying pipes 75 are connected to corresponding conduits 75a that reach from an upper outer surface of the chamber 1 to an inner side wall of the concave portion 80a, so that a purge gas is supplied toward an upper end portion of the rotation sleeve 82. Because of the purge gas, the BTBAS gas and the $O_3$ gas cannot be mixed through a space between the outer surface of the rotation sleeve 82 and the side wall of the concave portion 80a. Although the two purge gas supplying pipes 75 are illustrated in FIG. 18, the number of the pipes 75 and the corresponding conduits 75a may be determined so that the purge gas from the pipes 75 can assuredly avoid gas mixture of the BTBAS gas and the $O_3$ gas in and around the space between the outer surface of the rotation sleeve 82 and the side wall of the concave portion 80a.

In the embodiment illustrated in FIG. 18, a space between the side wall of the concave portion 80a and the upper end portion of the rotation sleeve 82 corresponds to the ejection hole for ejecting the separation gas. In addition, the center area is configured with the ejection hole, the rotation sleeve 82, and the pillar 81.

Although the two kinds of reaction gases are used in the film deposition apparatus according to the above embodiment, three or more kinds of reaction gases may be used in other film deposition apparatus according to other embodiments of the present invention. In this case, a first reaction gas nozzle, a separation gas nozzle, a second reaction gas nozzle, a separation gas nozzle, and a third reaction gas nozzle may be located in this order at predetermined angular intervals, each nozzle extending along the radial direction of the turntable 2. Additionally, the separation areas D including the corresponding separation gas nozzles are configured in the same as explained above.

Figure 19:
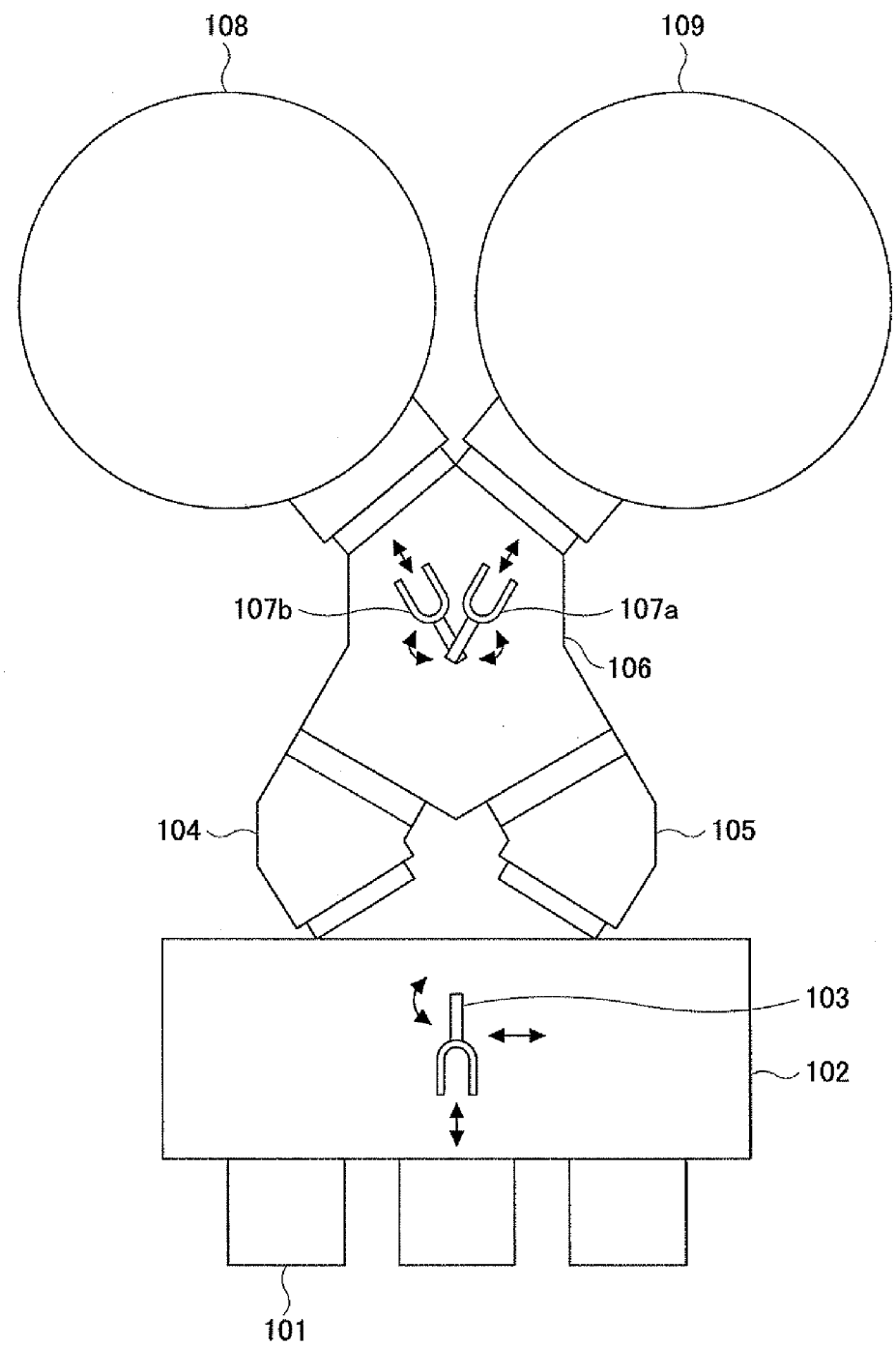
FIG. 19 is a schematic diagram of a substrate process apparatus to which the film deposition apparatus of FIG. 1 or 18 is integrated.

The film deposition apparatus according to embodiments of the present invention may be integrated into a wafer process apparatus, an example of which is schematically illustrated in FIG. 19. The wafer process apparatus includes an atmospheric transfer chamber 102 in which a transfer arm 103 is provided, a load lock chamber (preparation chamber) 105 whose atmosphere is changeable between vacuum and atmospheric pressure, a vacuum transfer chamber 106 in which two transfer arms 107a, 107b are provided, and film deposition apparatuses 108, 109 according to embodiments of the present invention. In addition, the wafer process apparatus includes cassette stages (not shown) on which a wafer cassette 101 such as a Front Opening Unified Pod (FOUP) is placed. The wafer cassette 101 is brought onto one of the cassette stages, and connected to a transfer in/out port provided between the cassette stage and the atmospheric transfer chamber 102. Then, a lid of the wafer cassette (FOUP) 101 is opened by an opening/closing mechanism (not shown) and the wafer is taken out from the wafer cassette 101 by the transfer arm 103. Next, the wafer is transferred to the load lock chamber 104 (105). After the load lock chamber 104 (105) is evacuated, the wafer in the load lock chamber 104 (105) is transferred further to one of the film deposition apparatuses 108, 109 through the vacuum transfer 115 chamber 106 by the transfer arm 107a (107b). In the film deposition apparatus 108 (109), a film is deposited on the wafer in such a manner as described above. Because the wafer process apparatus has two film deposition apparatuses 108, 109 that can house five wafers at a time, the ALD (or MLD) mode deposition can be performed at high throughput.

While the film deposition apparatus and the film deposition method in which the BTBAS gas as the first reaction gas and the $O_3$ gas as the second reaction gas are supplied from the first reaction nozzle 31 and the second reaction nozzle 32, respectively, in order to deposit the silicon oxide film have been explained in the above embodiments, plural films made of different materials may be continuously deposited in other embodiments. For example, the embodiments of the present invention are applicable when two kinds of films are alternately deposited to form a multilayer film. Specific examples of a film deposition apparatus and a film deposition method according to the present invention, which are preferable for depositing such a multilayer film, are explained in the following. More specifically, the film deposition apparatus and the film deposition method in which a silicon oxide film and a silicon nitride film are alternately deposited to form an insulating multilayer film are explained in the following.

Figure 20:
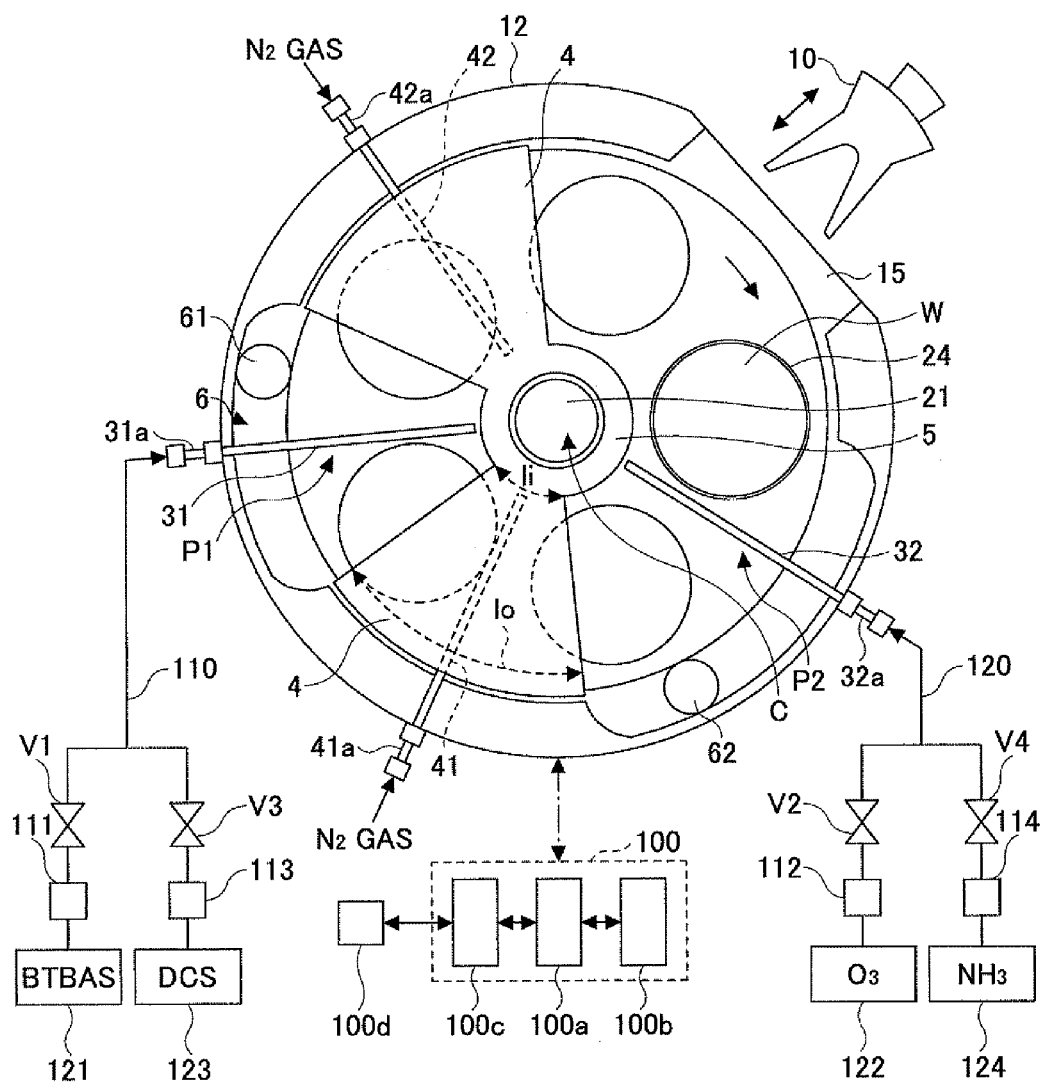
FIG. 20 is a schematic top view of a film deposition apparatus according to another embodiment of the present invention.

As shown in FIG. 20, one end of a first gas supplying line 110 is connected to the first reaction gas nozzle 31 via the gas inlet ports 31a of the first reaction gas nozzle 31. The other end of the first gas supplying line 110 is branched into two branch lines, one of which is connected to a first gas supplying source 121 storing the BTBAS gas as the first reaction gas via a valve V1 and a flow rate controller 111, and the other of which is connected to a third gas supplying source 123 storing dichlorosilane ($SiH_2Cl_2$ (DCS)) gas as a third reaction gas via a valve V3 and a flow rate controller 113.

In addition, one end of a second gas supplying line 120 is connected to the second reaction gas nozzle 32 via the gas inlet ports 32a of the second reaction gas nozzle 32. The other end of the second gas supplying line 120 is branched into two branch lines, one of which is connected to a second gas supplying source 122 storing the $O_3$ gas as the second reaction gas via a valve V2 and a flow rate controller 112, and the other of which is connected to a fourth gas supplying source 124 storing ammonia ($NH_3$) gas as a fourth reaction gas via a valve V4 and a flow rate controller 114. With such a configuration, the first gas nozzle 31 serves as the first reaction gas supplying portion and a third reaction gas supplying portion, and the second gas nozzle 32 serves as the second reaction gas supplying portion and a fourth reaction gas supplying portion. The same elements or components as those in the film deposition apparatus shown in FIG. 1 are not explained, in order to avoid undue repetition.

Figure 21A:
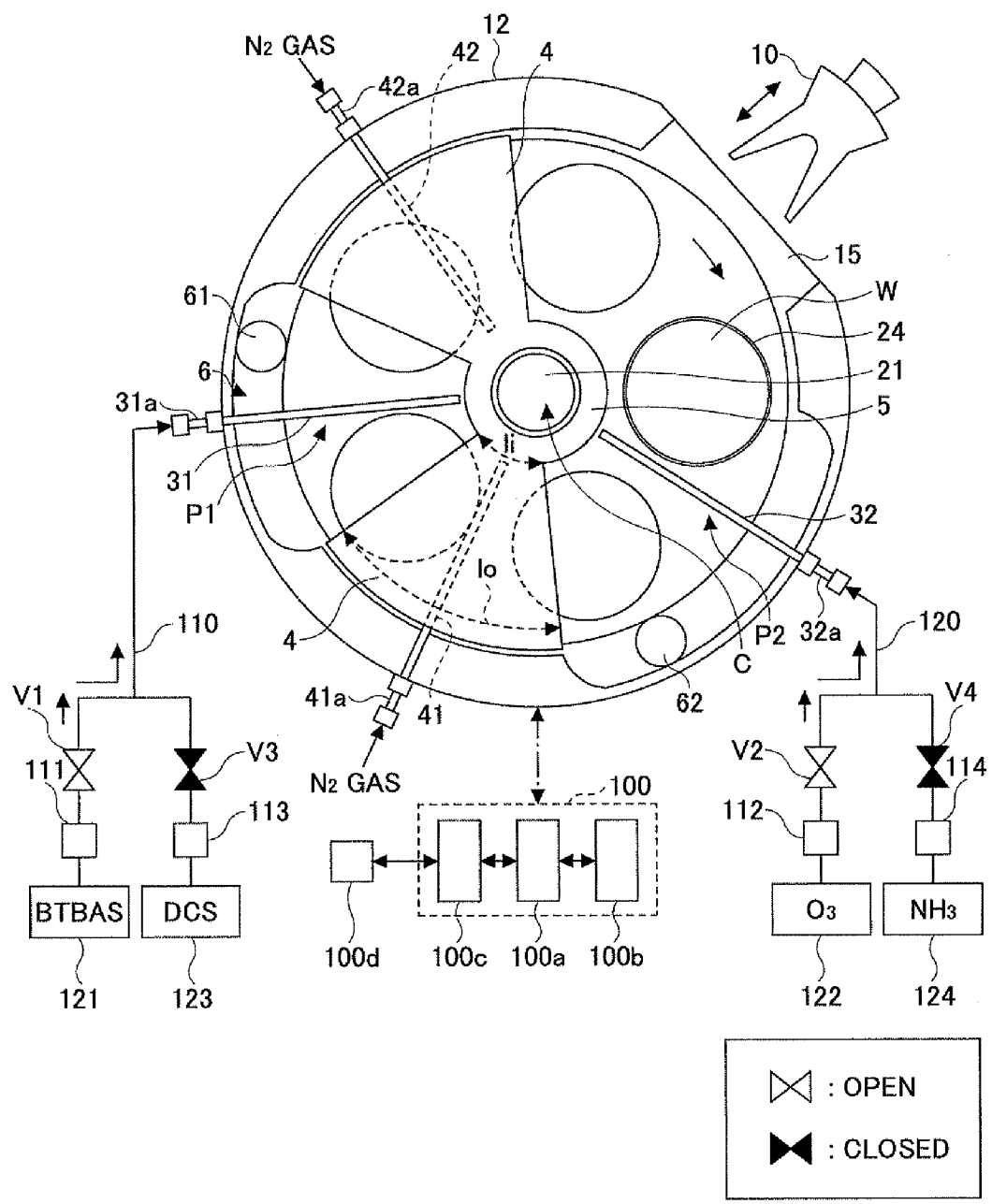
FIG. 21A is a schematic top view of a film deposition apparatus according to another embodiment of the present invention.
Figure 21B:
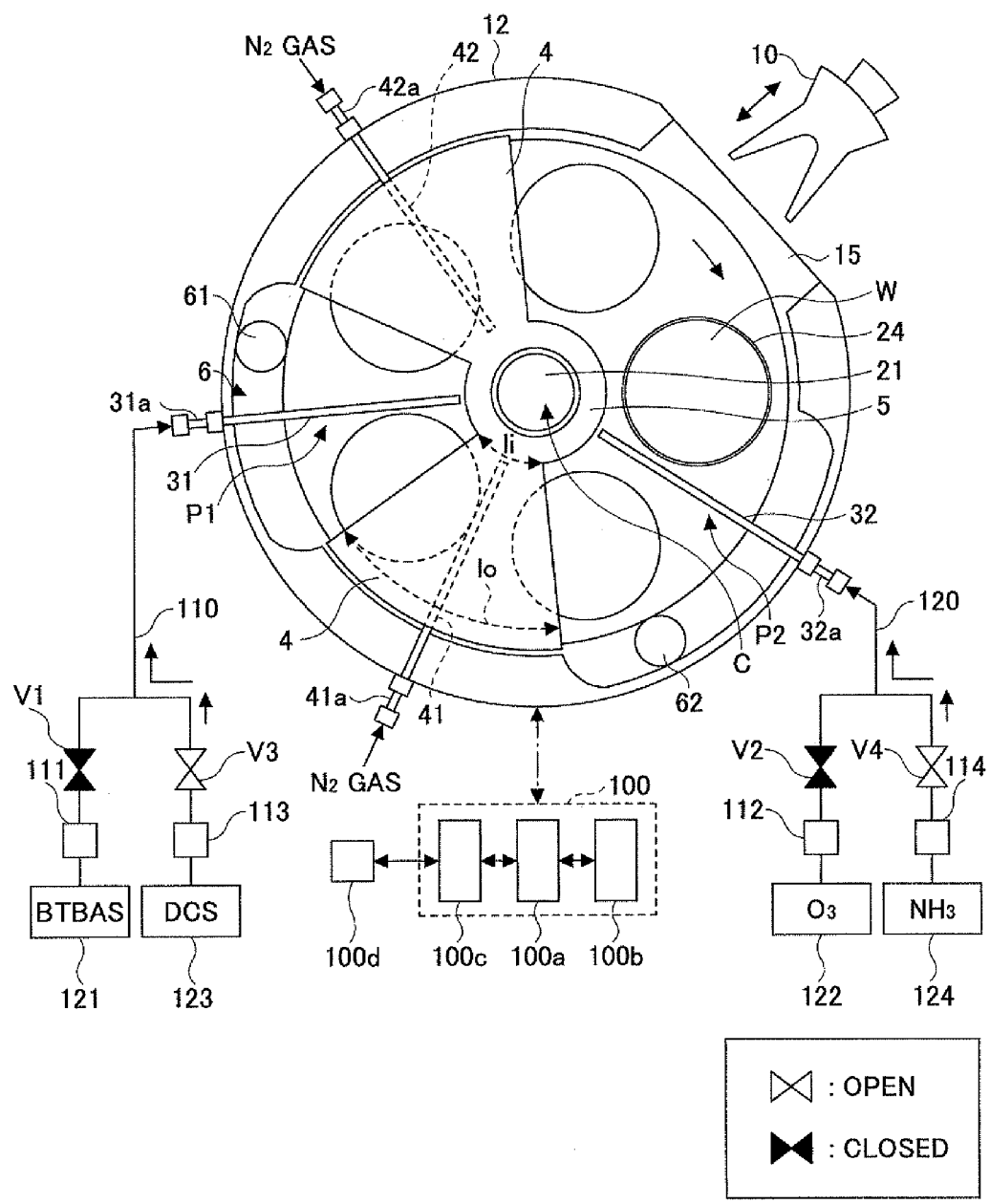
FIG. 21B is a schematic top view of a film deposition apparatus according to another embodiment of the present invention.

Next, the film deposition method of depositing the multilayer film using the film deposition apparatus shown in FIG. 20 is explained. First, the valves V1, V2 are opened as shown in FIG. 21A to deposit the silicon oxide film as the first film in the same manner as described above. During this deposition, the $N_2$ gases are supplied to the separation areas D, the center area C, and the area below the turntable 2 in order to avoid mixture of the BTBAS gas and the $O_3$ gas in the vacuum chamber 1. Therefore, the first reaction gas nozzle 31 is exposed only to the BTBAS gas, and the second reaction gas nozzle 32 is exposed only to the $O_3$ gas, which results in substantially no silicon oxide deposition or adsorption on the nozzles 31, 32. In FIGS. 21A and 21B, white valve symbols (double triangles) indicate open valves, and black valve symbols indicate closed valves.

Next, the valves V1, V2 are closed and the vacuum chamber 1 is evacuated to lowest possible pressures by the vacuum pump 64 (FIG. 1), so that the BTBAS gas and the $O_3$ gas are purged of not only the vacuum chamber 1 and the nozzles 31, 32 but also the first and the second gas supplying lines 110, 120 from the valves V1, V3 and V2, V4, respectively.

Then, the heater unit 7 is controlled so that the wafers W on the turntable 2 are set at a predetermined temperature, for example, about 300° C. Next, an opening amount of the pressure controller 65 is adjusted so that the inside pressure of the vacuum chamber 1 is set at a predetermined pressure. After the wafer temperature and the chamber pressure are set, the valves V3, V4 are opened and the DCS gas and the $NH_3$ gas are supplied at predetermined flow rates into the vacuum chamber 1 from the first reaction gas nozzle 31 and the second reaction gas nozzle 32, respectively. The $N_2$ gases are also supplied at predetermined flow rates to the separation areas D, the center area C, and the area below the turntable 2.

While the turntable 2 is being rotated at predetermined rotations, for example, 200 rotations, adsorption of the DCS gas onto the upper surface of the wafer W and successive nitridation of the adsorbed DCS by the $NH_3$ gas are repeated by predetermined times, so that the silicon nitride film having a predetermined thickness, as the second film, is deposited on the silicon oxide film that have been deposited on the wafer W deposited in the previous deposition. During the deposition of the silicon nitride film, because the $N_2$ gases are supplied to the separation areas D, the center area C, and the area below the turntable 2 in order to avoid mixture of the DCS gas and the $NH_3$ gas in the vacuum chamber 1, no silicon nitride is adsorbed on the nozzles 31, 32.

Next, the valves V3, V4 are closed and the vacuum chamber 1 is evacuated to lowest possible pressures by the vacuum pump 64 (FIG. 1), so that the DOS gas and the $NH_3$ gas are purged of not only the vacuum chamber 1 and the nozzles 31, 32 but also the first and the second gas supplying lines 110, 120 downstream from the valves V1, V3 and V2, V4, respectively. After this, the valves V3, V4 are opened again, and the silicon nitride film is deposited on the deposited silicon nitride film, in the same manner as above.

Figure 22:
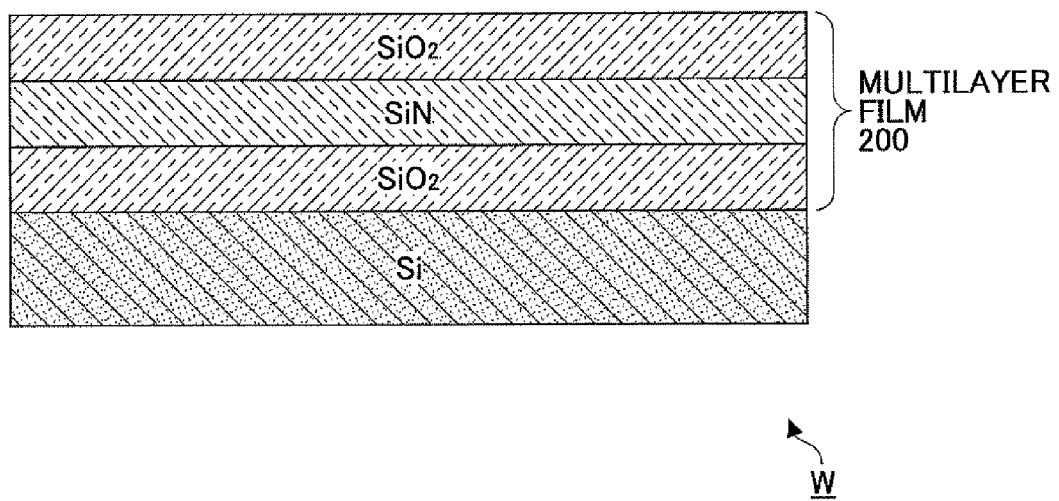
FIG. 22 is a schematic cross-sectional view of a multilayer film preferably formed by a film deposition apparatus according to an embodiment of the present invention.

In such a manner, the insulating multilayer film 200, which is a so-called ONO film having the silicon oxide film, the silicon nitride film, and the silicon oxide film in this order from bottom to top, is deposited on the wafer W, as shown in FIG. 22. Such a multilayer film 200 is deposited, for example, on the upper surface of a gate insulation film formed on the wafer W in a semiconductor manufacturing process, although the gate insulation film is omitted in FIG. 22.

In the above examples, because the first process area P1 and the second process area P2 are separated, mixture of the BTBAS gas and the $O_3$ gas and mixture of the DCS gas and the $NH_3$ gas can be substantially prevented, and thus deposition or adsorption of the reaction product (the silicon oxide film and the silicon nitride film) on the nozzles 31, 32 is substantially prevented. When the ALD (MLD) mode film deposition is carried out using a conventional single wafer film deposition apparatus or vertical film deposition apparatus, the reaction products may be deposited on gas nozzles, when used, because reaction gases are supplied in a single process chamber. The reaction products deposited on the gas nozzles may cause a particle problem. However, substantially no reaction products are deposited on the gas supplying nozzles 31, 32 in the embodiment of the present invention, thereby substantially preventing the particle problem.

In addition, when plural different films need to be deposited at the ALD (MLD) mode using a conventional single wafer film deposition apparatus or a vertical film deposition apparatus, plural process chambers corresponding to the plural different films are required, because unintended reaction products or by-products may be formed due to residual reaction gases in the process chamber. As a result, the apparatus inevitably becomes large and complicated. However, because the reaction gases are supplied into corresponding limited areas (i.e., the first process area P1 or the second process area P2) separated by the separation areas D and relatively easily purged by evacuating the areas to vacuum in the embodiment of the present invention. In addition, because the reaction gas nozzles 31, 32 are arranged above the wafer W on the turntable 2, the nozzles 31, 32 may be kept at temperatures that substantially prevent thermal decomposition of the reaction gases and adsorption of the reaction gas molecules on the nozzles 31, 32. Therefore, the first (second) reaction gas nozzle 31 (32) can be used to supply plural different reaction gases. Accordingly, the film deposition apparatus according to an embodiment of the present invention does not require plural process chambers, thereby keeping the apparatus relatively small, simple, and inexpensive.

While the multilayer film 200 is formed by alternately depositing the silicon oxide film and the silicon nitride film in the above example, the present invention is not limited to this example. In other examples, the multilayer film 200 (STO film) having a strontium oxide (SrO) film as a first film and a titanium oxide (TiO) film as a second film can be formed by alternately depositing the SrO film and the TiO film. A film deposition apparatus and a film deposition method, according to an example of the present invention, for forming such a multilayer film 200 are explained in the following.

Figure 23:
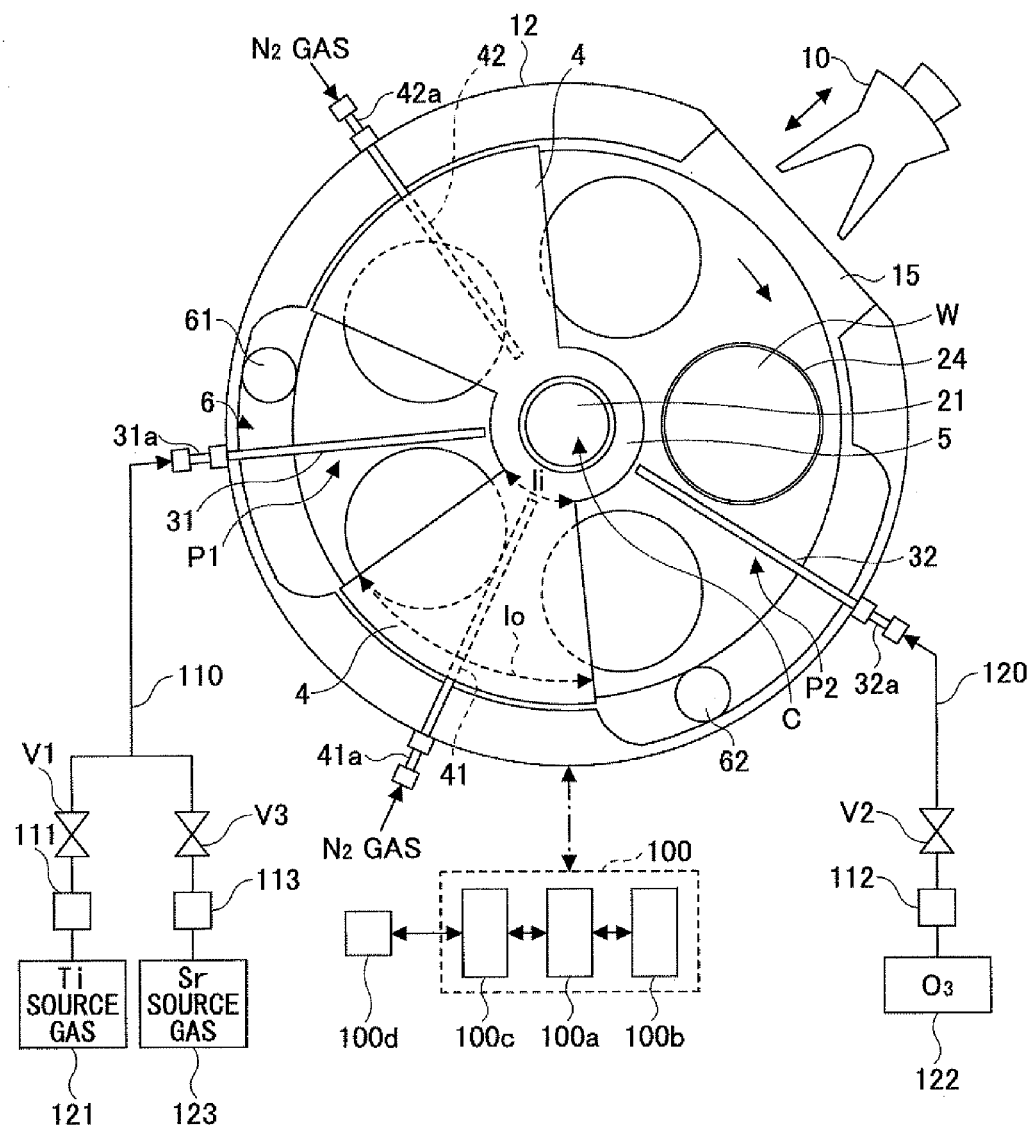
FIG. 23 is a schematic top view of a film deposition apparatus according to another embodiment of the present invention.
Figure 24A:
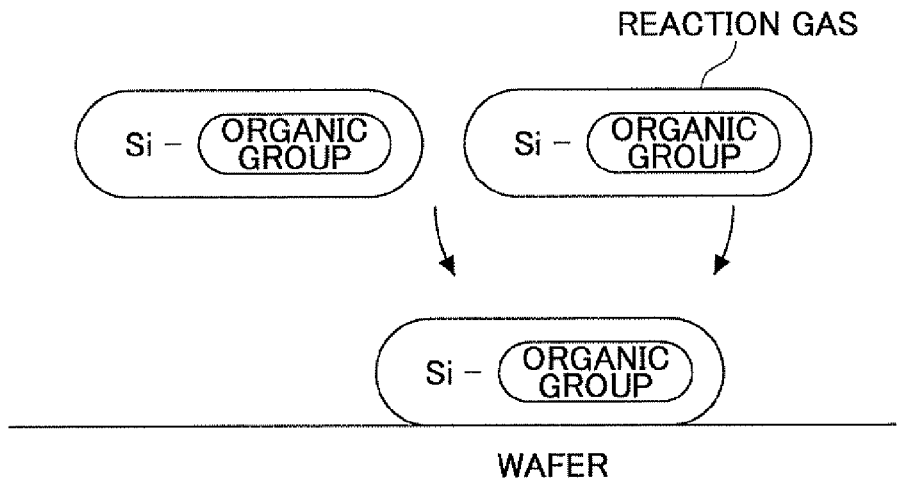
FIG. 24A is a schematic representation of a behavior of reaction gas molecules in the vicinity of the wafer.
Figure 24B:
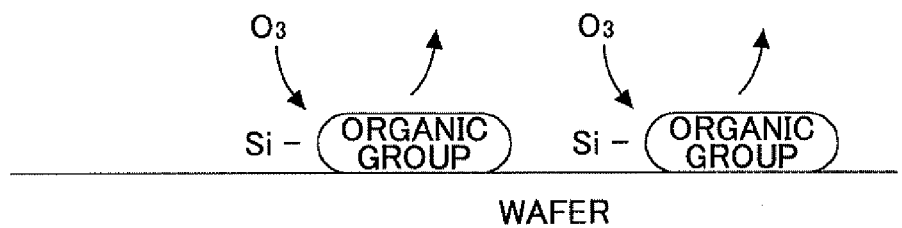
FIG. 24B is a schematic representation of oxidation of reaction gas molecules by $O_3$ molecules in the vicinity of the wafer.
Figure 24C:
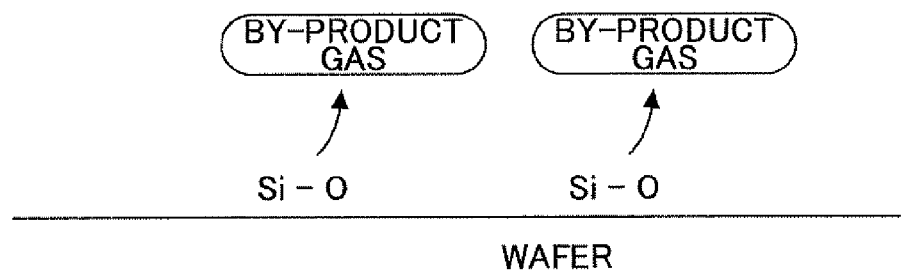
FIG. 24C is a schematic representation of by-products releasing from the wafer.

As shown in FIG. 23, the first gas supplying source 121 stores a titanium source gas as the first reaction gas such as a titanium-containing compound including titanium bis(iso-propoxide)bis(tetramethyl heptanedionate) (Ti(O-iPr)$_2$(THD)$_2$), titanium tetra(iso-propoxide) (Ti(OiPr)) and the like, and supplies the titanium source gas in vapor (gaseous) phase. In addition, the third gas supplying source 123 stores a strontium source gas as the third reaction gas such as a strontium-containing compound including strontium bis(tetramethyl heptanedionate) (Ti(THD)$_2$) bis(pentamethyl-cyclopentadienyl)strontium (Sr(Me$_5$Cp)$_2$) and the like, and supplies the strontium source gas in vapor (gaseous) phase.

In this example, because the O$_3$ gas is used as a reaction gas that reacts with the titanium source gas and the strontium source gas that are adsorbed on the wafer W, the second reaction gas nozzle 32 is connected only to the second gas supplying source 122 storing the O$_3$ gas as the second reaction gas via the second as supplying line 120.

In this film deposition apparatus shown in FIG. 23, the strontium source gas and the titanium source gas are alternately switched in such a manner described above, and the titanium source gas absorbed on the wafer W is exposed to the O$_3$ gas and the strontium source gas adsorbed on the wafer W is exposed to the O$_3$ gas. In such a manner, the strontium oxide film and the titanium oxide film are alternately deposited, thereby forming the multilayer film 200 having the strontium oxide films and the titanium oxide films. Even in this example, the same advantages as described about the ONO multilayer film 200 are demonstrated.

The number of the layers in the multilayer film 200 is not limited to two, and the multilayer film may have two or four or more layers in other examples. In addition, the film deposition apparatus according to other embodiments of the present invention may have four gas nozzles for supplying the BTBAS gas, the O$_3$ gas, the DCS gas, and the NH$_3$ gas, respectively, in this order in the circumferential direction of the turntable 2, and the four separation areas D between two adjacent gas nozzles in order to avoid gas mixture, when the multilayer film 200 is formed. Moreover, the film deposition apparatus according to other embodiments of the present invention may have two gas nozzles for supplying the BTBAS gas and the DCS gas, respectively, in the first process area P1 and other two gas nozzles for supplying the O$_3$ gas and the NH$_3$ gas, respectively, in the second process area P2, in which the reaction gases may be switched depending on composition and/or structure of the multilayer film 200 to be deposited on the wafer W (the gate insulation film).

In addition, the first gas supplying line 110 and the second gas supplying line 120 may be branched into three or more branch lines rather than two branch lines, and the three or more branch lines may be connected to the corresponding gas sources, which may include a N2 gas source for purging the gas supplying lines 110, 120.

While the BTBAS gas and the like are used as the reaction gas in order to deposit the silicon oxide film in the foregoing examples, another preferable reaction gas may be used in other examples, as described in the following.

Figure 25A:
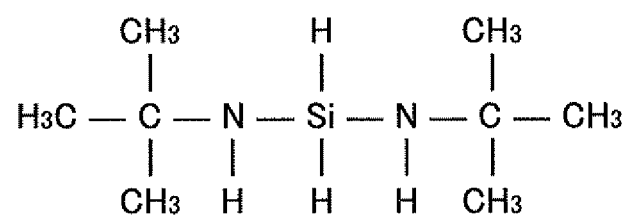
FIG. 25A is a molecular structure of BTBAS molecule.
Figure 25B:
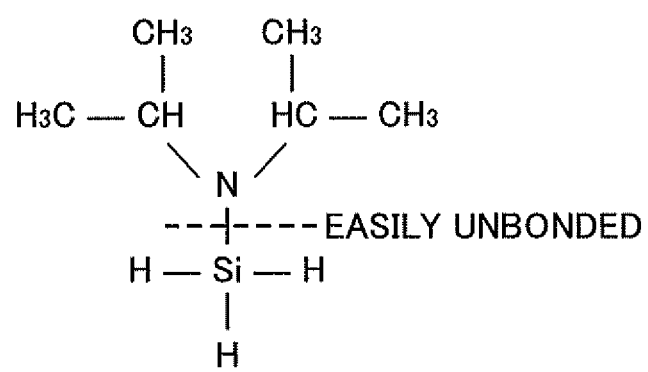
FIG. 25B is a molecular structure of DIPAS molecule.

First, the above ALD mode film deposition of the silicon oxide film using the BTBAS gas is reviewed. As stated above, the BTBAS molecules are adsorbed on the wafer W in the first process area P1, as shown in FIG. 25A; the BTBAS molecules are oxidized by the O$_3$ gas in the second process area P2, as shown in FIG. 25B; and thus a reaction product including the oxygen from the O$_3$ gas and the silicon from the BTBAS gas and organic compounds are released as by-products gases from the BTBAS molecules, as shown in FIG. 25C. Such a reaction product is formed across the wafer W and thus, the silicon oxide film is deposited on the wafer W. Namely, the silicon oxide film is deposited on the wafer W by repeating adsorption of the BTBAS molecules and oxidization of the BTBAS molecules by the O$_3$ gas.

A BTBAS molecule has a relatively low vapor pressure and a relatively large molecular structure as shown in FIG. 25A. Namely, the BTBAS molecule is composed of a silicon atom, two nitrogen atoms respectively on both sides of the silicon atom, and two t-butyl groups ($-C(CH_3)_3$) bonded with the corresponding nitrogen atoms. Therefore, the BTBAS may be somewhat disadvantageous in terms of a deposition rate, gap-filling characteristic, and properties of the silicon oxide film, depending on places where the silicon oxide film is deposited using the BTBAS gas in a semiconductor device, or performance requirements of the device. As a more preferable reaction gas for depositing the silicon oxide film, there is a diisoprpyl amine silane (DIPAS) gas.

The DIPAS has a vapor pressure higher than the vapor pressure of the BTBAS. When the BTBAS gas is used, it is rather difficult to obtain a higher deposition rate. This is because the vapor pressure of the BTBAS gas is relatively lower, which makes it difficult to supply the BTBAS gas at a sufficiently high flow rate when the process pressure in the vacuum chamber 1 is relatively higher. On the other hand, a higher deposition rate can be obtained by using the DIPAS gas because the vapor pressure of the DIPAS is, for example, about ten times higher than that of the BTBAS at a temperature of 50° C., and thus a gas flow rate and a process pressure can be increased.

In addition, a steric hindrance problem may be caused to a relatively higher degree in the BTBAS because the BTBAS molecule has the t-butyl groups on both sides of the Si atom, as shown in FIG. 25A. On the other hand, such a steric hindrance problem is caused to a less degree in the DIPAS. Moreover, a chemical bond between the silicon atom and the nitrogen atom in the DIPAS molecule is relatively easily unbonded by O$_3$ because the O$_3$ molecules can reach the Si atom without being hindered by the organic group. Therefore, an increased deposition rate may possibly be obtained when the DIPAS is used. Furthermore, the organic compounds and nitric compounds as the by-products are relatively rapidly released from the DIPAS molecules, because the chemical bond between the silicon atom and the nitrogen atom is relatively easily unbonded. Therefore, residual impurities are reduced in the resultant silicon oxide film, thereby yielding a better electric characteristic.

Furthermore, because the DIPAS has the relatively smaller molecular structure, the DIPAS molecules can be densely adsorbed on the wafer W, and thus the silicon oxide film having a higher density can be obtained. In addition, because of the higher density, the silicon oxide film is shrunk only to a limited degree by the subsequent annealing process. Therefore, even after the silicon oxide-film is etched into a micro- (or nano-) pattern, such micro (or nano-) pattern structure is less likely to collapse, which may be caused by internal stress in a largely shrunk film. Moreover, because the DIPAS has the smaller molecular structure and the gas flow rate and/or the process pressure can be increased when using the DIPAS gas, a gap-filling characteristic can be improved when a gap in the micro- (or nano-) pattern is filled with the silicon oxide.

In addition, the DIPAS molecules can be adsorbed at a higher rate on the wafer W, thereby reducing gas consumption. Moreover, because an across-wafer uniformity can be generally adjusted by adjusting the flow rate of the reaction gas and/or the process pressure in a process chamber, a process window regarding the across-wafer uniformity can be widened by using the DIPAS gas that can widen a process window for the flow rate and/process pressure originated from a higher vapor pressure.

An example of process parameters preferable in using the DIPAS gas in the film deposition apparatus according to this embodiment is:

rotational speed of the turntable 2: 240 rpm process pressure: 2.13 kPa (16 Torr)

wafer temperature: 350-500° C.

flow rate of DIPAS gas: 275 sccm flow rate of $O_3$ gas: 10,000 sccm flow rate of $N_2$ gas from the separation gas nozzles 41, 42: 20,000 sccm

EXAMPLES

Next, film characteristics of the film deposited using the DIPAS gas as the reaction gas are explained.

Experiment 1

Deposition Rate

First, experimental results about the deposition rate are explained. These experiments were carried out for comparing the deposition rates between the DIPAS gas and the BTBAS gas, and investigating dependence of the gas flow rate, the process pressure, and the wafer temperature on the deposition rate when using the DIPAS gas. Experiment conditions are listed as examples 1-1 through 1-9 in Table I. The rotational speed of the turntable 2 was 240 rpm for all the examples 1-1 through 1-9. In "example 1-1" of Table I, the conditions that yielded a highest deposition rate in the condition range studied using the BTBAS gas are listed.

TABLE I

| Example # | Process Press. (kPa (Torr)) | wafer temp. (° C.) | reaction gas | flow rate (sccm) |
|---|---|---|---|---|
| 1-1 | 1.07 (8) | 350 | BTBAS | 200 |
| 1-2 | 1.07 (8) | 350 | DIPAS | 100 |
| 1-3 | 1.07 (8) | 350 | DIPAS | 200 |
| 1-4 | 1.07 (8) | 350 | DIPAS | 275 |
| 1-5 | 1.60 (12) | 350 | DIPAS | 275 |
| 1-6 | 2.13 (16) | 350 | DIPAS | 275 |
| 1-7 | 1.07 (8) | 400 | DIPAS | 275 |
| 1-8 | 1.07 (8) | 450 | DIPAS | 275 |
| 1-9 | 1.07 (8) | 500 | DIPAS | 275 |

Figure 26:
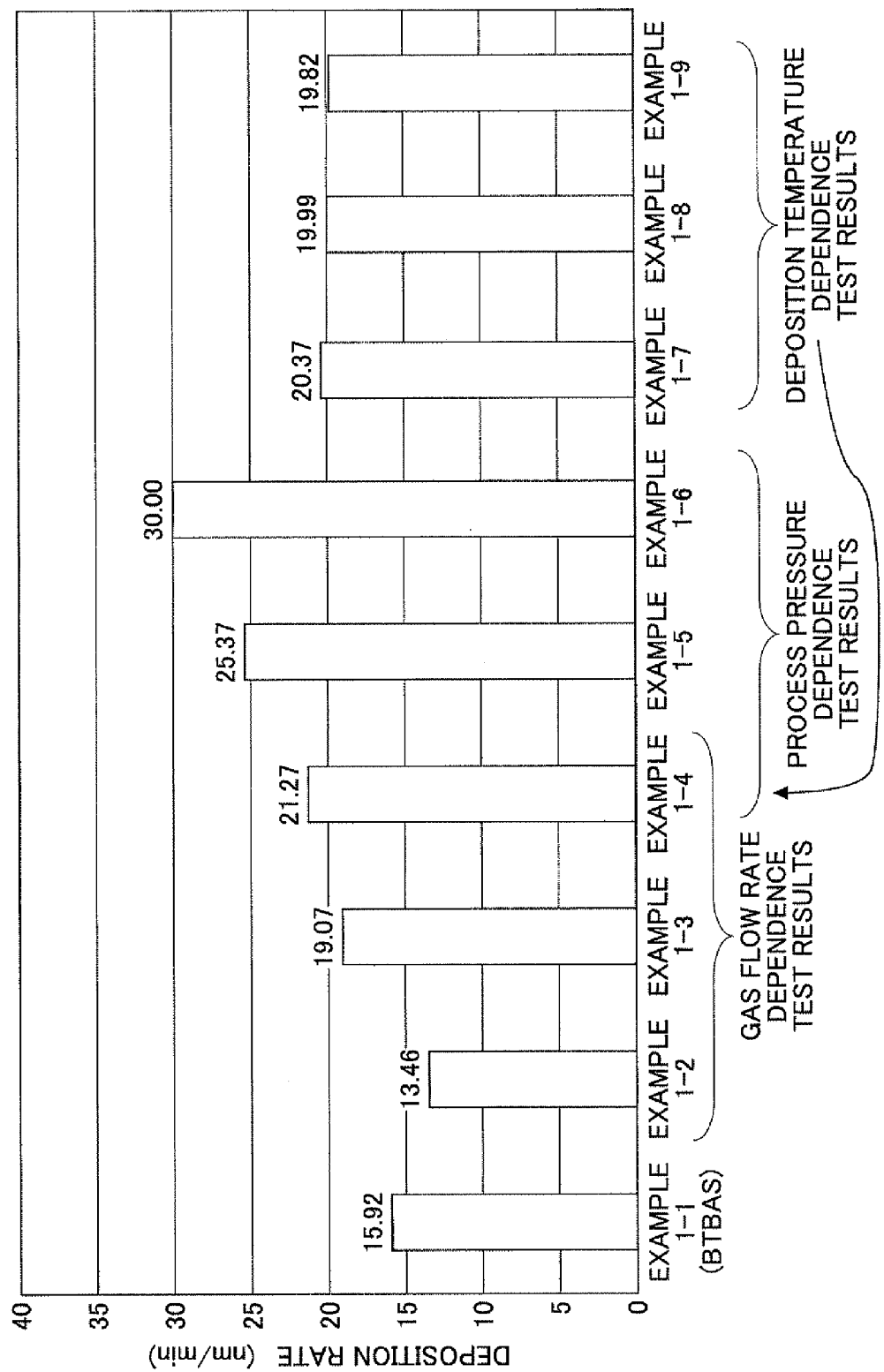
FIG. 26 shows experimental results of Experiment 1 carried out according to a film deposition method of an embodiment of the present invention.
Figure 27:
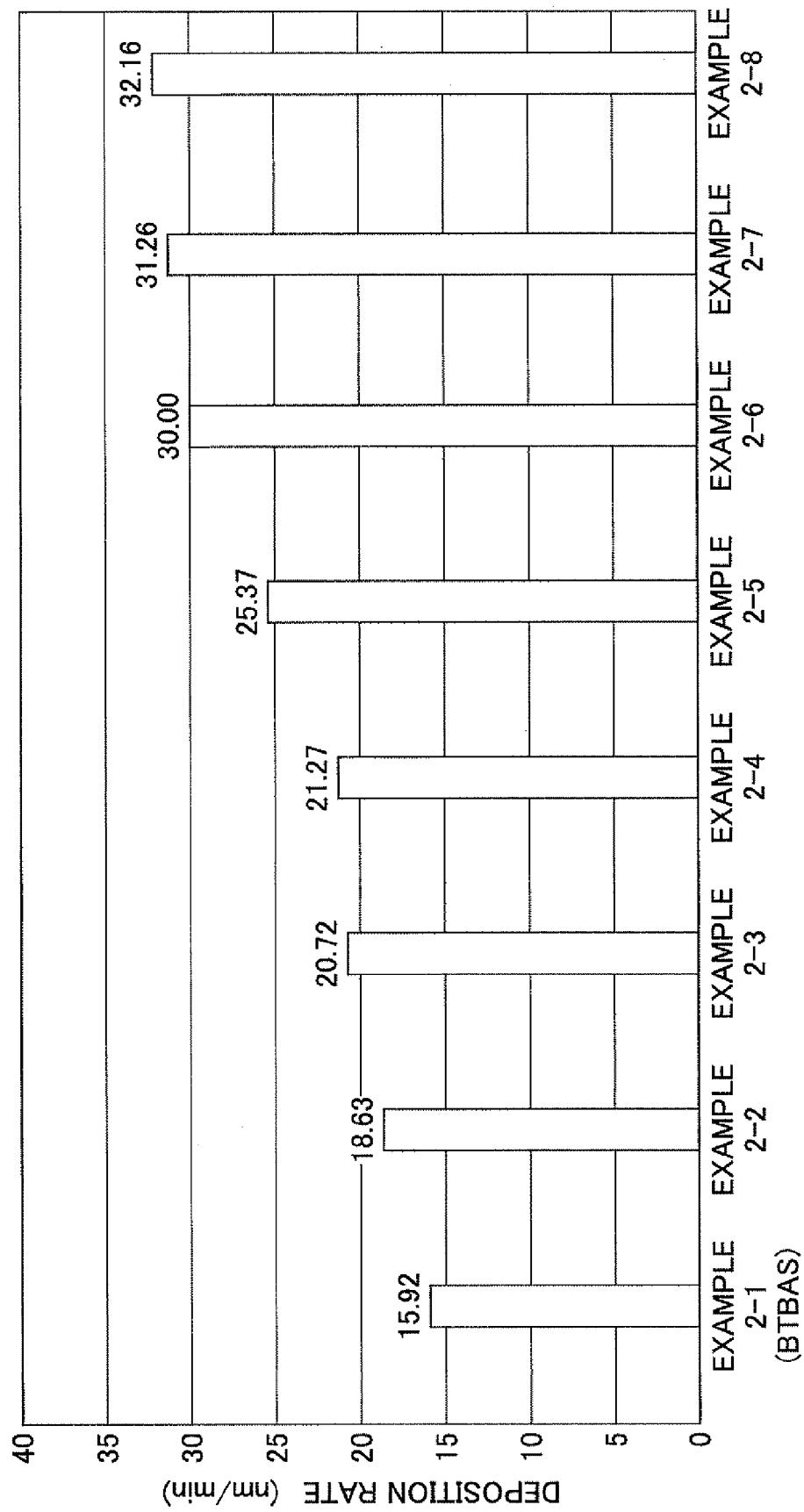
FIG. 27 shows experimental results of Experiment 2 carried out according to a film deposition method of an embodiment of the present invention.

FIG. 26 summarizes the deposition rates of the silicon oxide films deposited under the conditions listed in Table I. From FIG. 26, a higher deposition rate is obtained by using the DIPAS gas than the BTBAS gas under the same conditions (see Examples 1-1, 1-3). In addition, when the DIPAS gas is used, the gas flow rate and the process pressure can be set higher than the upper limit when the BTBAS gas is used, and the deposition rates are made higher in accordance with an incremental amount of these process parameters. Specifically, the deposition rate in Example 1-6 is about 80% higher than the deposition rate in Example 1-1 where the BTBAS gas is used.

In addition, when the DIPAS is used, the deposition rates are almost constant in a temperature range from 350° C. through 500° C. (see Examples 1-4, 1-7, 1-8, 1-9 in FIG. 26).

This may indicate that the DIPAS molecule is stable in this temperature range, decomposed not thermally but mainly through oxidation by $O_3$.

Experiment 2

Deposition Rate

Next, experimental results of another experiment carried out at higher process pressures are explained. The experiment conditions are summarized in Table II. In the same manner as Table I, experiment conditions for the BTBAS gas are listed as Example 2-1 in Table II. When the reaction gas flow rate and/or the process pressure are increased, flow rates of the $O_3$ gas supplied through the second reaction gas nozzle 32, the $N_2$ gas supplied through the separation gas supplying pipe 51, and the $N_2$ gas supplied from the purge gas supplying pipes 72 are accordingly increased. The wafer temperature is 350° C. and the rotational speed of the turntable 2 was 240 rpm for all the examples 2-1 through 2-8 in Table II.

TABLE II

| Ex. # | Process Press. (kPa (Torr)) | react. gas | react. gas flow rate (sccm) | $O_3$ flow rate (slm) | $N_2$ gas from pipe 51 (slm) | $N_2$ gas from pipe 72 (slm) |
|---|---|---|---|---|---|---|
| 2-1 | 1.07 (8) | BTBAS | 200 | 10 | 10 | 10 |
| 2-2 | 0.53 (8) | DIPAS | 275 | 6 | 5 | 4 |
| 2-3 | 0.80 (6) | DIPAS | 275 | 8 | 8 | 7 |
| 2-4 | 1.07 (8) | DIPAS | 275 | 10 | 10 | 9 |
| 2-5 | 1.60 (12) | DIPAS | 275 | 10 | 10 | 9 |
| 2-6 | 2.13 (16) | DIPAS | 275 | 10 | 10 | 9 |
| 2-7 | 3.20 (24) | DIPAS | 275 | 10 | 15 | 9 |
| 2-8 | 4.27 (32) | DIPAS | 275 | 10 | 20 | 9 |

Figure 28:
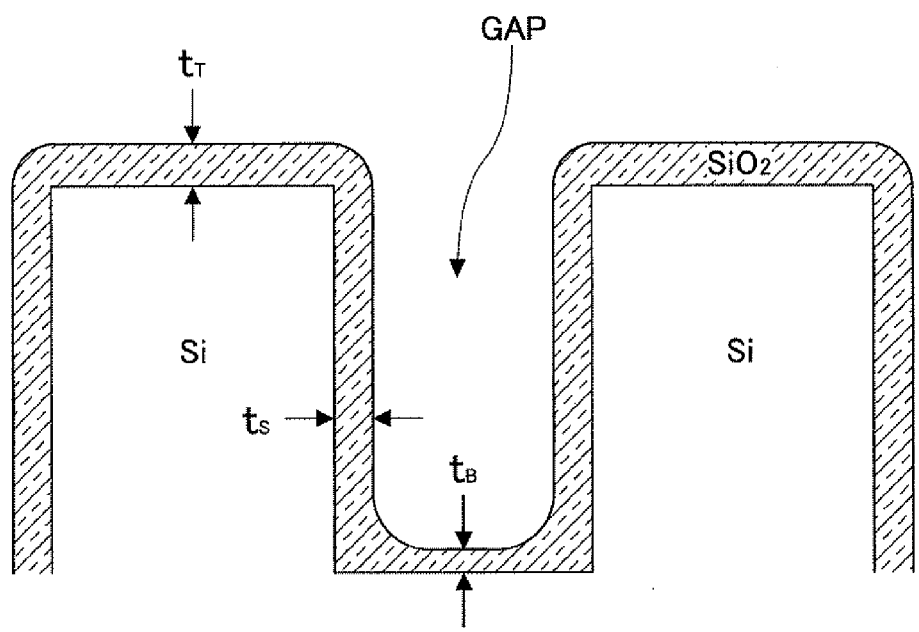
FIG. 28 is a schematic cross-sectional view of openings made in a wafer to be used in Experiment 3 out according to a film deposition method of an embodiment of the present invention.

FIG. 28 summarizes the deposition rates of the silicon oxide films deposited under the above conditions. As shown, the film deposition can be carried out even at a higher process pressure of 4.27 kPa (32 Torr) when the DIPAS gas is used, which is almost twice as high as the deposition rate reachable using the BTBAS gas.

Experiment 3

Gap-Filling Characteristic

Next, experimental results of another experiment carried out to study a gap-filling characteristic are explained. In this experiment, relatively deep-bottomed openings each having an aspect ratio of 30 (depth: 10 μm, width: 0.3 μm) were made in the wafer W and the openings were filled with silicon oxide using the film deposition apparatus according to the present invention. After the openings were filled with silicon oxide, cross-sections of the filled openings were observed using a Scanning Electron Microscope (SEM), as schematically shown in FIG. 28. In this observation, the silicon oxide thicknesses on the surface of the wafer W, (namely, on a place where the openings are not made), on the side wall of the openings, and on the bottom surface of the openings are measured, and referred to as $t_T$, $t_S$, and $t_B$, respectively, as shown in FIG. 28. In order to numerically evaluate the gap-filling characteristic, ratios $R_S$ and $R_B$ of the silicon oxide thicknesses $t_S$ and $t_B$ with respect to the silicon thickness $t_T$ ($R_S=(t_S/t_T)\times100$, $R_B (t_B/t_T)\times100$) are calculated, taking account of generic difficulties in depositing silicon oxide on the side wall and the bottom of such openings.

Deposition conditions of silicon oxide to fill the openings are listed in Table III, where the deposition condition for the BTBAS gas is also listed. The rotational speed of the turntable 2 of 30, 60, 120, and 240 rpm are tested in each of Examples 3-1 through 3-3. In addition, the wafer temperature is 350° C., the flow rate of the $O_3$ gas having a concentration of 300 g/Nm3 is 10 slm, and the wafer temperature is 350° C. for all the Examples in Table III.

TABLE III

| Example # | react. gas | react. gas flow rate (sccm) | Process Pressure (kPa (Torr)) |
| --- | --- | --- | --- |
| 3-1 | BTBAS | 200 | 1.07 (8) |
| 3-2 | DIPAS | 275 | 1.07 (8) |
| 3-3 | DIPAS | 275 | 2.13 (16) |

Figure 29:
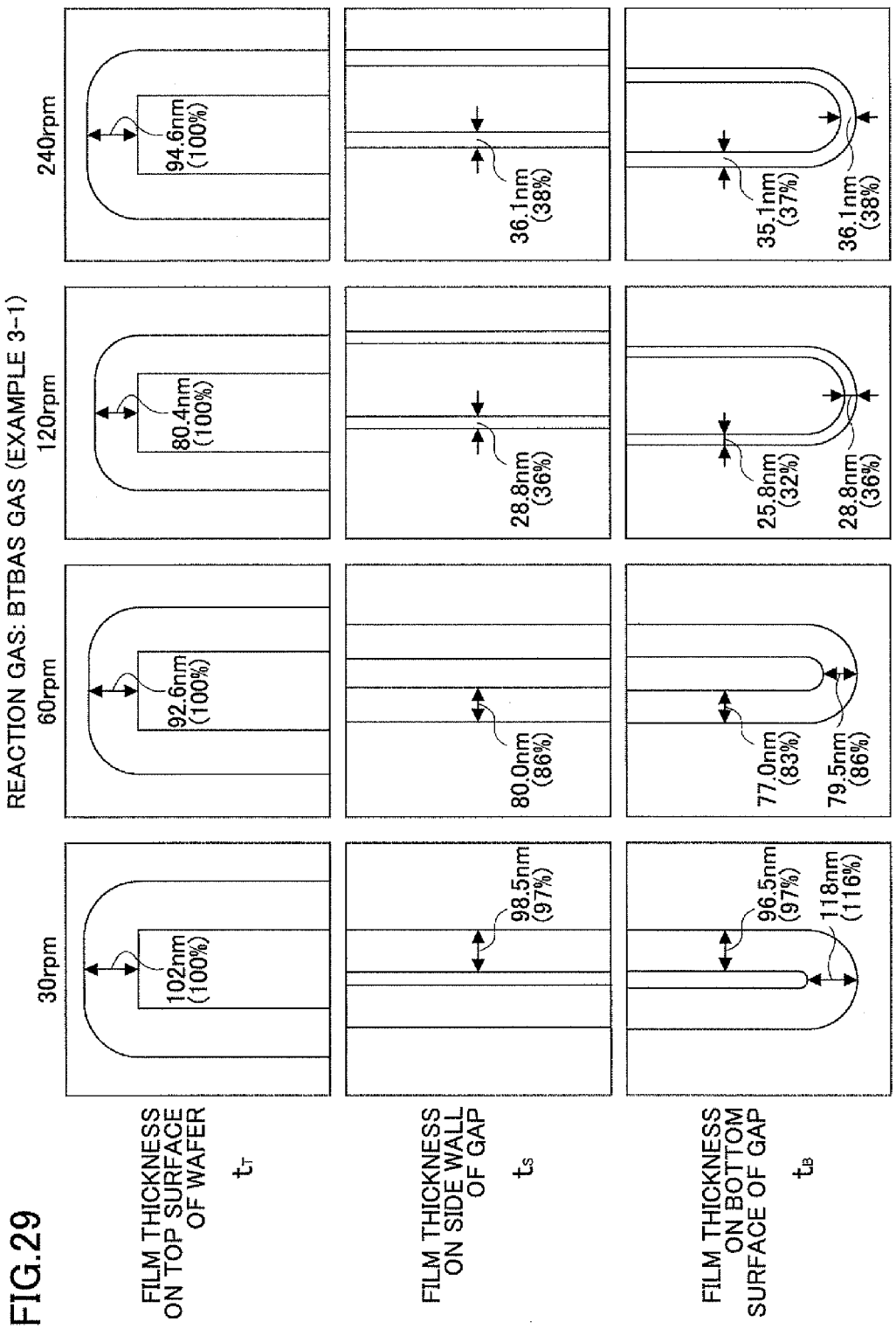
FIG. 29 is a schematic cross-sectional view of the openings partly filled with silicon oxide in Experiment 3.
Figure 30:
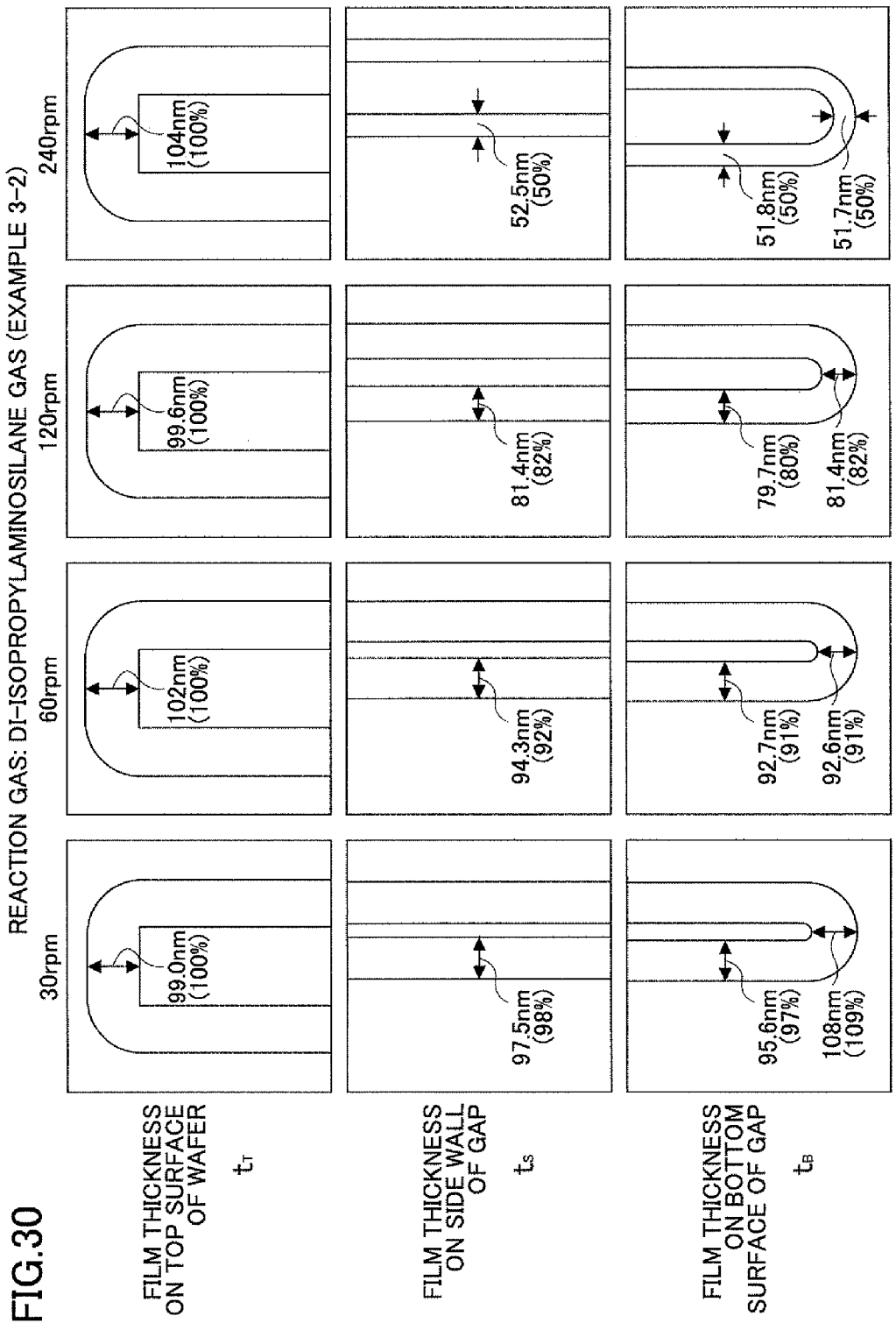
FIG. 30 is another schematic cross-sectional view of the openings partly filled with silicon oxide in Experiment 3.
Figure 31:
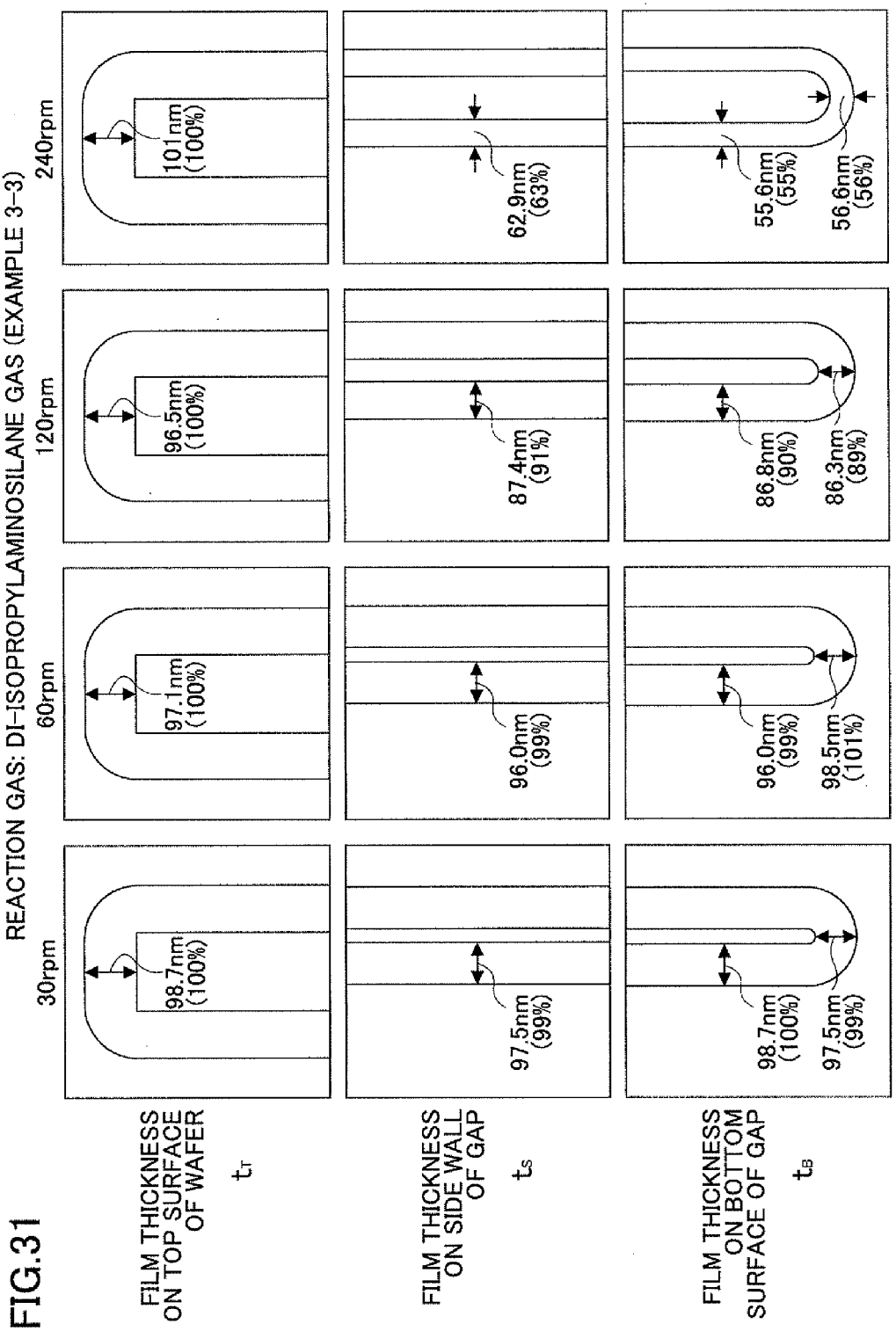
FIG. 31 is yet another schematic cross-sectional view of the openings partly filled with silicon oxide in Experiment 3.

FIGS. 29 through 31 schematically illustrate observation results of the filled openings obtained in this experiment, which were observed using the SEM. In FIGS. 29 through 31, numerals in round brackets indicate the ratios $R_S$, $R_B$ calculated from the corresponding observations. As for the ratio $R_S$, additional values calculated using $t_S$ measured near the bottoms of the openings are shown at the bottom row in FIGS. 29 through 31.

In Example 3-1 (FIG. 29) where the BTBAS gas is used, the ratios $R_S$ and $R_B$ are decreased, which indicates the gap-filling characteristic becomes degraded, as the rotation speed of the turntable 2 is increased. For example, the ratio $R_S$ at a rotation speed of 240 rpm is about 38% (see the right-bottom view in FIG. 29). While the same tendency can be seen in Examples 3-2 (FIG. 30) and 3-3 (FIG. 31) where the DIPAS is used, the ratios $R_S$ at the same rotation speed of 240 rpm are as high as about 50% (FIG. 30) and 59% (FIG. 31). From these results, it has been found that a better gap-filling characteristic can be obtained with the DIPAS gas than with the BTBAS gas.

Figure 32:
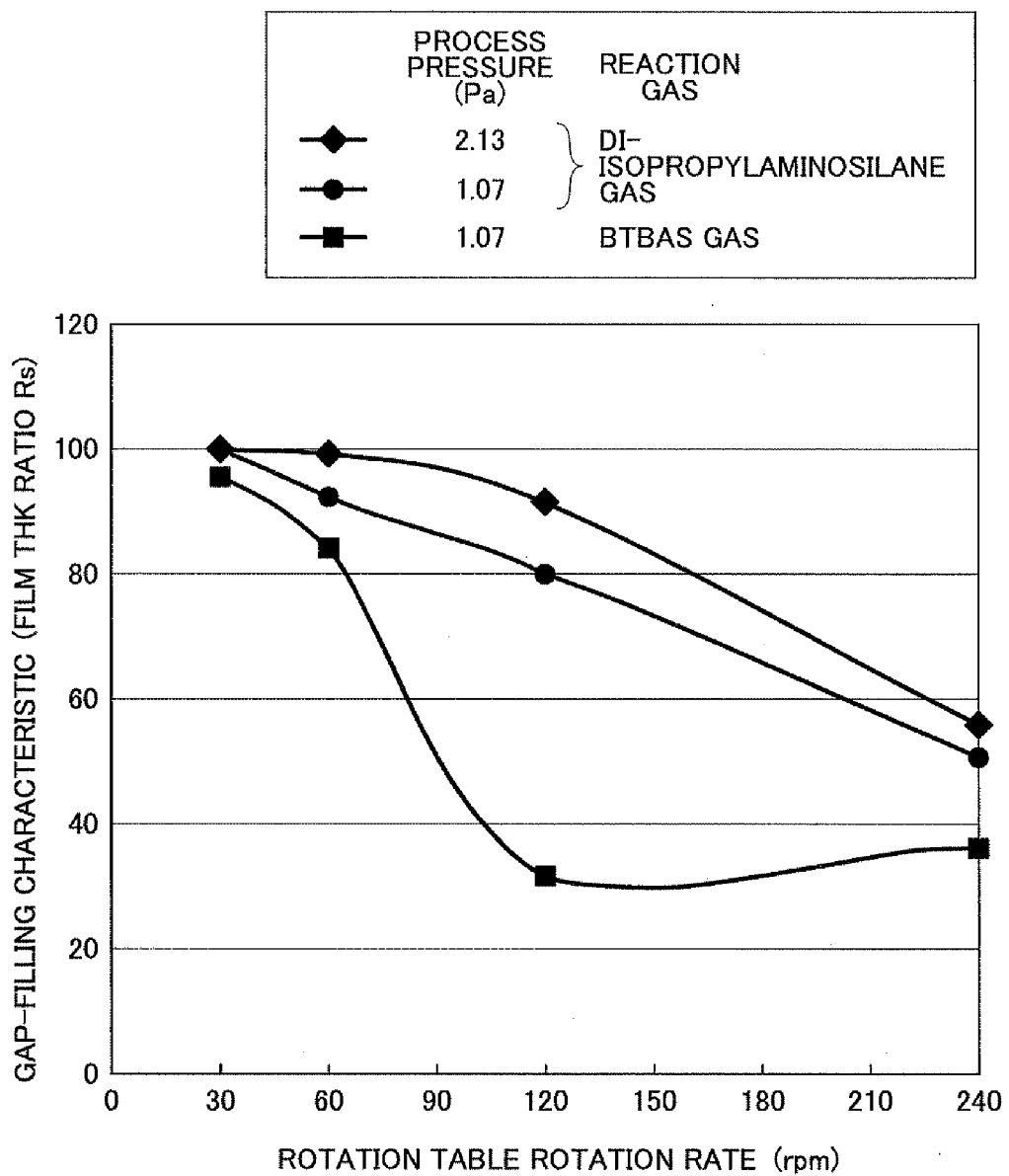
FIG. 32 shows dependence of rotation speed of a turntable on a gap-filling characteristic obtained in Experiment 3.

In addition, the gap-filling characteristic improvement with the decreased rotation speed of the turntable 2 is clearly shown in FIG. 32, where the ratios $R_S$ calculated using the $t_S$ value measured near the bottom of the opening are plotted against the rotation speed of the turntable 2. The ratios $R_B$ exceeding 100% are observed at a rotation speed of 30 rpm in Examples 3-1 and 3-2 (see the left-bottom views in FIGS. 30 and 31, respectively). This is because the thicknesses $t_B$ is excessively increased due to the silicon oxide deposited on the side wall of the opening near the bottom.

Moreover, it is understood by comparing the Examples 3-2 and 3-3 that a higher process pressure is advantageous in obtaining a better gap-filling characteristic.

Table IV summarizes dependence of the rotation speed on the deposition rate in Examples 3-1 through 3-3. In all the Examples, the deposition rate is increased as the rotation speed of the turntable 2 is increased.

TABLE IV

| | Rotation Speed (rpm) | | | |
| --- | --- | --- | --- | --- |
| | 30 | 60 | 120 | 240 |
| Example 3-1 | 3.51 | 6.54 | 10.44 | 16.17 |
| Example 3-2 | 5.35 | 9.16 | 14.86 | 21.28 |
| Example 3-3 | 5.59 | 10.14 | 17.01 | 30.86 |

Experiment 4

Wet Etching Characteristic

Figure 33:
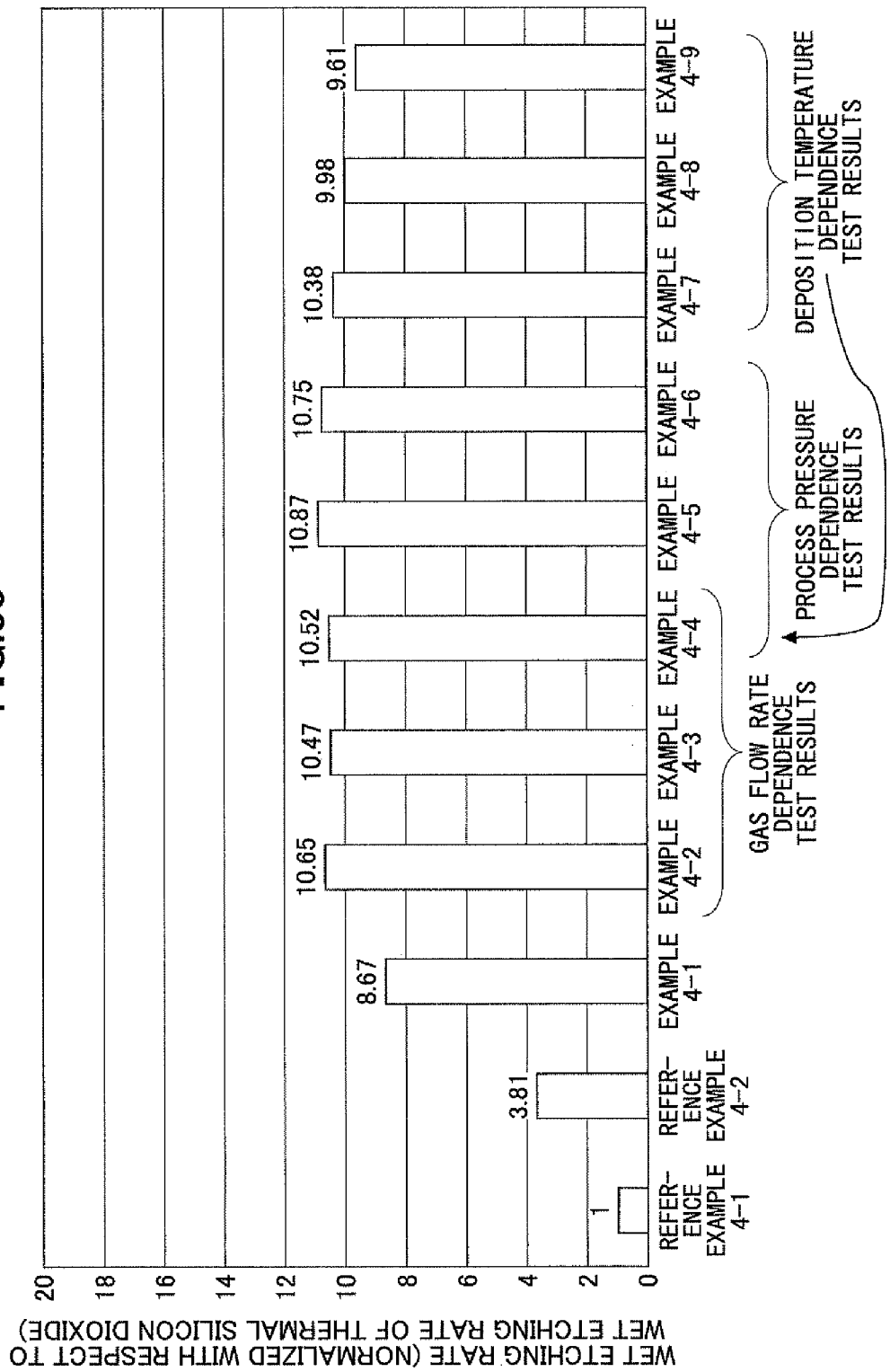
FIG. 33 shows experimental results of Experiment 4 carried out according to a film deposition method of an embodiment of the present invention.

Next, experimental results of another experiment carried out to study wet etching characteristic are explained. In this experiment, the silicon oxide films obtained with the film deposition conditions Examples 4-1 through 4-9 that are respectively the same as Examples 1-1 through 1-9 listed in Table I were etched by an etchant of 1 wt % hydrofluoric acid aqueous solution, and etching rates were obtained for all the samples. FIG. 33 illustrates the etching rates for Examples 4-1 through 4-9. In FIG. 33, a Reference Example 4-1 indicates a wet etching rate obtained by etching silicon dioxide thermally grown at 950° C. with the etchant, and a Reference Example 4-2 indicates a wet etching rate obtained by etching silicon oxide film deposited at 780° C. by a CVD method using a di-chlorosilane and $N_2O$. The etching rates of Examples 4-1 through 4-9 in FIG. 33 are normalized with the etching rate of the thermal silicon dioxide.

From FIG. 33, it is found that the etching rates are almost constant even when the gas flow rate or the process pressure is changed when the DIPAS is used. On the other hand, the etching rate is slightly decreased with an increased wafer temperature.

In FIG. 33, the etching rate of the silicon oxide film deposited using the BTBAS gas is lower than the etching rate of the silicon oxide film deposited using the DIPAS gas. This may be explained by a larger content of nitrogen atoms in the BTBAS based silicon oxide film, the nitrogen atoms being incorporated into the silicon oxide film from the BTBAS molecule, and the incorporated atoms enhances an etching resistance against the hydrofluoric acid based etchant. In other words, use of the DIPAS gas decreases the nitrogen content, or the DIPAS based silicon oxide film has less impurities than the BTBAS based silicon oxide film.

Experiment 5

Wet Etching Characteristic

Next, experimental results of another experiment carried out to study density of the silicon oxide film are explained. As stated above, when the reaction gas (silicon source gas) contains relatively large organic groups, the resultant silicon oxide film tends to have a lower density, and such a silicon oxide film is largely shrunk by the annealing process carried out after the film deposition. When a silicon oxide film having a lower density is patterned into a micro (or nano) pattern and undergoes the annealing process, the micro (or nano) pattern may collapse. Because of this, a silicon oxide film having a higher density is desired.

In this experiment, the nine samples, referred to as Examples 5-1 through 5-9, were prepared by depositing silicon oxide films with corresponding film deposition conditions to those for Examples 1-1 through 1-9, and annealed at 850° C. under nitrogen environment. Shrinkage after the annealing was measured for each sample.

Figure 34:
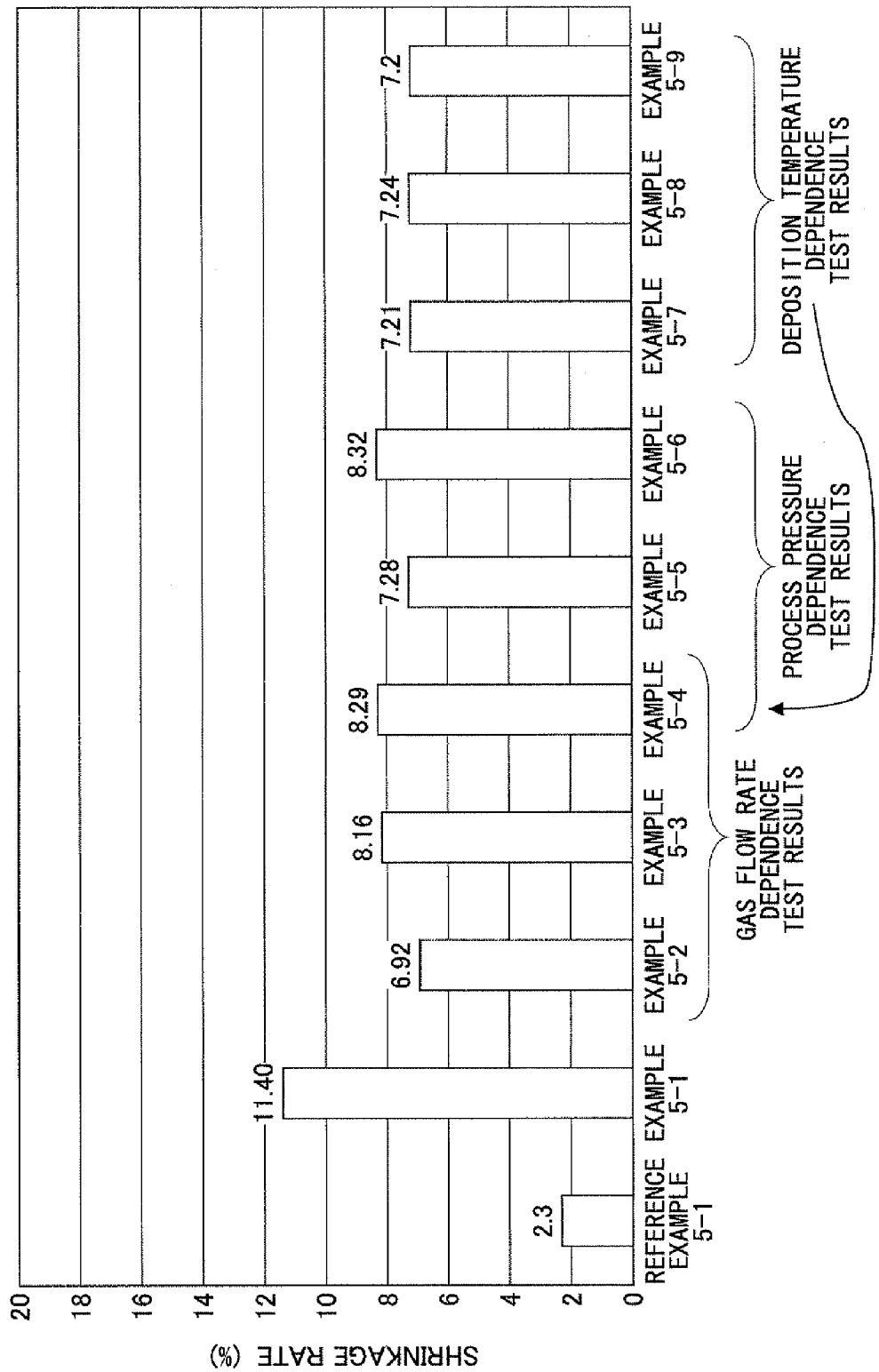
FIG. 34 shows experimental results of Experiment 5 carried out according to a film deposition method of an embodiment of the present invention.

FIG. 34 illustrates the experimental results of Examples 5-1 through 5-9. In FIG. 34, a reference example 5-1 indicates the shrinkage measured for the silicon oxide film prepared in the same CVD method as the reference example 4-2. As shown in FIG. 34, the shrinkage is lower when using the DIPAS gas than when using the BTBAS gas, which indicates the DIPAS yields a high density silicon oxide film than the BTBAS gas.

Experiment 6

Impurities

Next, experimental results of another experiment carried out to study impurities contained in the silicon oxide film are explained. In this experiment, a Secondary Ion Mass Spectroscopy (SIMS) was used in order to measure concentrations of impurities (hydrogen, nitrogen, and carbon) in the films by sputtering the silicon oxide films to a depth of 50 nm. The silicon oxide films were deposited at a process temperature of 1.07 kPa (8 Torr) and the rotational speed of the turntable 2 during the deposition was 240 rpm. The reaction gases (silicon source gases) used and the wafer temperatures were listed in FIG. 35.

Figure 35:
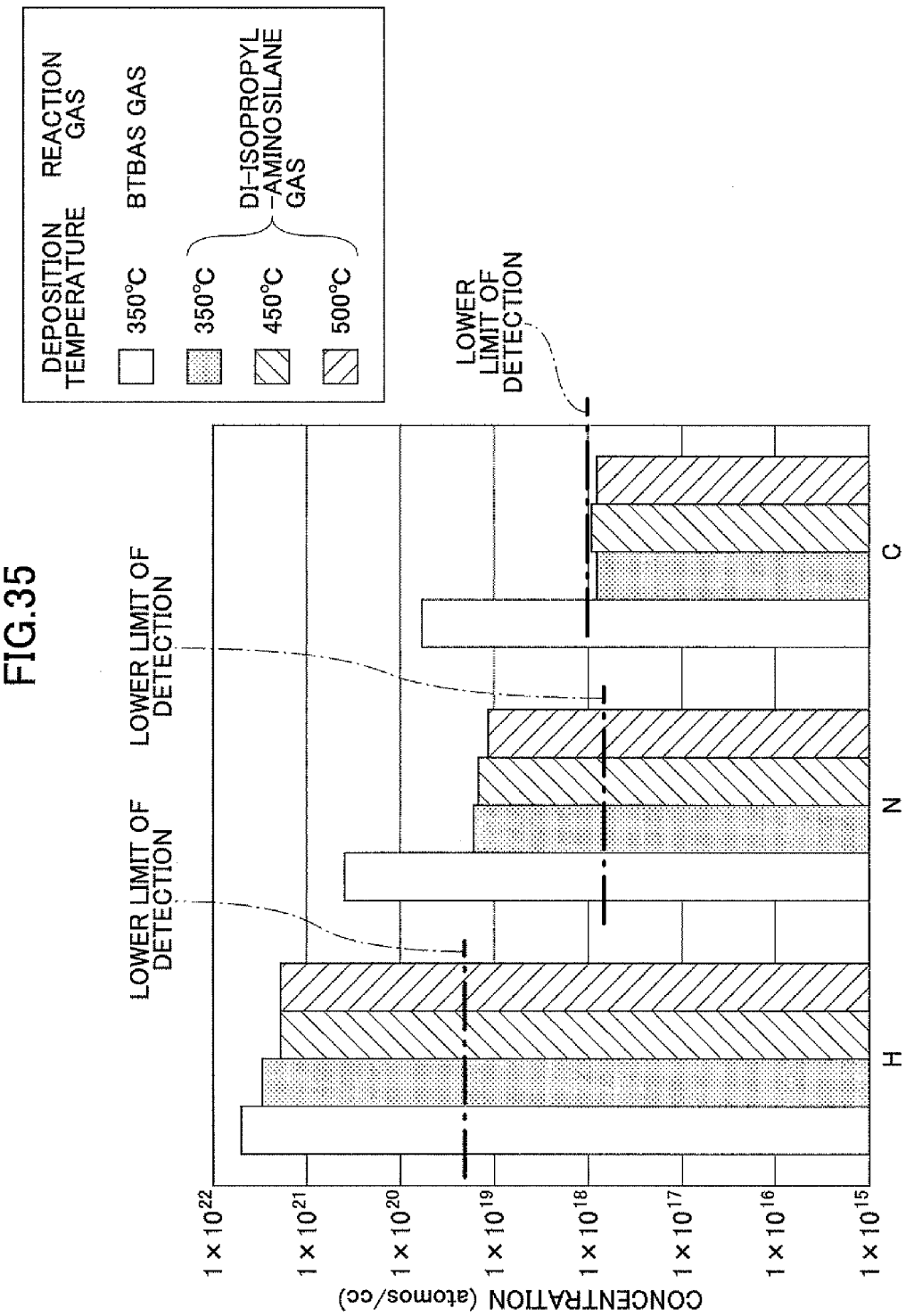
FIG. 35 shows experimental results of Experiment 6 carried out according to a film deposition method of an embodiment of the present invention.

As shown in FIG. 35, lower impurities levels of hydrogen, nitrogen, and carbon are obtained in the DIPAS based silicon oxide films than in the BTABS based silicon oxide films. Specifically, the nitrogen and the carbon levels are greatly lower in the DIPAS based silicon oxide films. In addition, when the DIPAS gas is used, the hydrogen and the nitrogen levels are decreased as the wafer temperature is increased.

While detailed explanation and figures are omitted, yet another experiment has revealed that a cycle rate (a silicon oxide film thickness per one rotation of the turntable 2) and an across-wafer uniformity of the silicon oxide thickness are increased or improved when the DIPAS gas is used. Specifically, it has been found from the experiment using a batch-type deposition apparatus that the cycle rate when using the DIPAS gas becomes 1.34 times as high as that using the BTBAS gas.

What is claimed is:

1. A film deposition apparatus for depositing a thin film on a substrate by carrying out a cycle of alternately supplying at least two kinds of reaction gases that react with each other to the substrate to produce a layer of a reaction product in a vacuum chamber, the film deposition apparatus comprising:
   a turntable rotatably provided in the vacuum chamber;
   a substrate receiving portion that is provided in the turntable in order to place the substrate therein;
   a first reaction gas supplying portion and a second reaction gas supplying portion that are separated from each other along a rotation direction of the turntable, and supply a first reaction gas and a second reaction gas, respectively, to a surface of the turntable, the surface being on the substrate receiving portion side;
   a separation area located along the rotation direction between a first process area in which the first reaction gas is supplied and a second process area in which the second reaction gas is supplied,
   a center area that is located substantially in a center portion of the vacuum chamber in order to separate atmospheres of the first process area and the second process area, and in which an ejection hole is formed that ejects a separation gas to the surface of the turntable, the surface being on the substrate receiving portion side; and
   an evacuation opening provided in the vacuum chamber in order to evacuate the vacuum chamber,
   wherein the separation area includes
   a lower surface that is lower than a ceiling surface of each of the first and the second process areas in relation to the turntable and has a width becoming substantially greater toward a circumference of the vacuum chamber, the width being along the rotation direction, thereby to create in relation to the turntable a thin space, and
   a separation gas supplying portion that is positioned within the lower surface and supplies a separation gas to the thin space thereby to create separation gas flows from the separation area to the process area sides in relation to the rotation direction.

2. The film deposition apparatus of claim 1, wherein the separation gas supplying portion is positioned in the middle of the lower surface.

3. The film deposition apparatus of claim 2, wherein the lower surface is provided by a convex portion that is attached on a ceiling of the vacuum chamber,
   wherein the convex portion is provided with a groove portion that extends along a radius direction of the turntable and substantially bisects the lower surface, and
   wherein the separation gas supplying portion is housed in the groove portion.

4. The film deposition apparatus of claim 1, wherein the lower surface has a planar shape of a sector.

5. The film deposition apparatus of claim 1, wherein the lower surface has a distance of about 50 mm or more along an arc corresponding to a route through which a center of the substrate placed in the substrate receiving portion of the turntable passes when the turntable rotates.

6. The film deposition apparatus of claim 1, wherein the separation gas supplying portion includes a separation gas nozzle that extends in a direction from a circumferential wall of the vacuum chamber to a rotation center of the turntable, so that the separation gas nozzle supplies the separation gas that separates the first process area and the second process area that are located on both sides of the separation area.

7. The film deposition apparatus of claim 1, wherein the separation area includes a separation gas nozzle that extends in a direction from a circumferential wall of the vacuum chamber to a rotation center of the turntable and is away from the lower surface of the separation area, so that the separation gas nozzle supplies the separation gas, wherein the separation area substantially impedes from entering the separation area the first reaction gas and the second reaction gas supplied to the first process area and the second process area, respectively, that are located on both sides of the separation area along the rotation direction.

8. The film deposition apparatus of claim 1, further comprising a member arranged between an outer circumference of the turntable and an inner circumferential surface of the vacuum chamber in the separation area,
   wherein a gap between the member and the outer circumference of the turntable is substantially the same as the height of the lower surface from the turntable.

9. The film deposition apparatus of claim 1, further comprising
   a third reaction gas supplying portion that is provided away from the first and the second reaction gas supplying portions along the rotation direction of the turntable, and configured to supply a third reaction gas to the surface of the turntable, the surface being on the substrate receiving portion side.

10. The film deposition apparatus of claim 9, further comprising
    a fourth reaction gas supplying portion provided away from the first, the second, and the third reaction gas supplying portions along the rotation direction of the turntable and configured to supply a fourth reaction gas to the surface of the turntable, the surface being on the substrate receiving portion side.

11. The film deposition apparatus of claim 10, further comprising
    a controlling portion that controls alternately to carry out the steps of:

supplying the first reaction gas and the second reaction gas from the first reaction gas supplying portion and the second reaction gas supplying portion, respectively, to a surface of the substrate, thereby depositing a first thin film, and supplying the third reaction gas and the fourth reaction gas from the third reaction gas supplying portion and the fourth reaction gas supplying portion, respectively, to the surface of the substrate, thereby depositing a second thin film.

12. The film deposition method of claim 10, wherein the first reaction gas supplying portion is connected to at least two gas supplying sources storing corresponding reaction gases, and the second reaction gas supplying portion is connected to other at least two gas supplying sources storing corresponding reaction gases.

13. The film deposition apparatus of claim 1, wherein the center area is defined by a rotation center portion of the turntable and an upper inner surface of the vacuum chamber, and wherein the center area is purged with a separation gas.

14. A substrate processing apparatus comprising:
a transfer chamber having a substrate transfer mechanism inside of the transfer chamber;
the film deposition apparatus of claim 1 connected hermetically to the transfer chamber; and
a preparation chamber that may be evacuated to a vacuum, the preparation chamber being connected hermetically to the transfer chamber.

* * * * *